(12) United States Patent
Tang et al.

(10) Patent No.: US 8,248,848 B1
(45) Date of Patent: Aug. 21, 2012

(54) SYSTEM AND METHODS FOR MULTI-LEVEL NONVOLATILE MEMORY READ, PROGRAM AND ERASE

(75) Inventors: Qiang Tang, Cupertino, CA (US); Bo Wang, Sunnyvale, CA (US); Chih-Hsin Wang, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 870 days.

(21) Appl. No.: 12/240,123

(22) Filed: Sep. 29, 2008

Related U.S. Application Data

(60) Provisional application No. 60/976,608, filed on Oct. 1, 2007.

(51) Int. Cl.
*G11C 16/04* (2006.01)
*G11C 7/06* (2006.01)

(52) U.S. Cl. .............................. 365/185.03; 365/189.07

(58) Field of Classification Search ............. 365/189.04, 365/185.03, 189.07
See application file for complete search history.

(56) References Cited

U.S. PATENT DOCUMENTS

| | | | | |
|---|---|---|---|---|
| 4,999,525 | A * | 3/1991 | Park et al. ........................ | 326/52 |
| 5,767,716 | A * | 6/1998 | Ko ................................. | 327/203 |
| 5,930,179 | A * | 7/1999 | Cha .......................... | 365/189.07 |
| 6,198,662 | B1 * | 3/2001 | Chen et al. ............... | 365/185.29 |
| 6,207,507 | B1 | 3/2001 | Wang | |
| 6,282,115 | B1 * | 8/2001 | Furukawa et al. ............ | 365/149 |
| 6,614,683 | B1 | 9/2003 | Parker | |
| 6,958,934 | B2 | 10/2005 | Fan et al. | |
| 7,369,441 | B2 | 5/2008 | Huang | |
| 7,372,715 | B2 | 5/2008 | Han | |
| 7,539,063 | B2 * | 5/2009 | Kang et al. ................ | 365/185.22 |
| 7,724,596 | B1 * | 5/2010 | Sutardja et al. ................ | 365/208 |
| 2005/0141387 | A1 * | 6/2005 | Cernea et al. .................. | 369/100 |
| 2007/0245214 | A1 | 10/2007 | Ramamoorthy | |
| 2008/0205141 | A1 * | 8/2008 | Lee et al. .................. | 365/185.03 |
| 2010/0061161 | A1 * | 3/2010 | Jung et al. ................ | 365/189.08 |

OTHER PUBLICATIONS

U.S. Appl. No. 12/209,577, filed Sep. 12, 2008; "Auto-Zero Current Sensing Amplifier"; Pantas Sutardja et al.; 59 pages.

IEEE Standard for Information technology—Telecommunications and information exchange between systems—Local and metropolitan area networks—Specific requirements Part 3: Carrier sense multiple access with collision detection (CSMA/CD) access method and physical layer specifications IEEE Std 802.3-2005; Dec. 9, 2005; 626 pgs.

IEEE Standard for Information technology—Telecommunications and information exchange between systems—Local and metropolitan area networks—Specific requirements Part 3: Carrier sense multiple access with collision detection (CSMA/CD) access method and physical layer specifications, Section Two (incl. Clause 21 through Clause 33 and Annex 22A through Annex 32A) IEEE Std 802.3-2005; Dec. 9, 2005; 810 pgs.

(Continued)

*Primary Examiner* — VanThu Nguyen
*Assistant Examiner* — Khamdan Alrobaie

(57) ABSTRACT

A memory circuit includes a memory array with multi-level cells that are each capable of storing M bits of data, where M is an integer greater than one. A module reads a state of one of the multi-level cells. The module performs at least one of a first erase operation and a first program operation on the one of the multi-level cells for the M bits of data during a first time period.

43 Claims, 32 Drawing Sheets

OTHER PUBLICATIONS

IEEE Standard for Information technology—Telecommunications and information exchange between systems—Local and metropolitan area networks—Specific requirements Part 3: Carrier sense multiple access with collision detection (CSMA/CD) access method and physical layer specifications, Section Three (incl. Clause 34 through Clause 43 and Annex 36A through Annex 43C) IEEE Std 802.3-2005; Dec. 9, 2005; 387 pgs.

IEEE Standard for Information technology—Telecommunications and information exchange between systems—Local and metropolitan area networks—Specific requirements Part 3: Carrier sense multiple access with collision detection (CSMA/CD) access method and physical layer specifications; Section Four (incl. Clause 44 through Clause 54 and Annex 44A through Annex 50A) IEEE Std 802.3-2005; Dec. 9, 2005; 454 pgs.

IEEE Standard for Information technology—Telecommunications and information exchange between systems—Local and metropolitan area networks—Specific requirements Part 3: Carrier sense multiple access with collision detection (CSMA/CD) access method and physical layer specifications; Section Five (Incl. Clause 56 through Clause 67 and Annex 58A through Annex 67A) IEEE Std 802.3-2005; Dec. 9, 2005; 417 pgs.

\* cited by examiner

SYSTEM AND METHODS FOR MULTI-LEVEL NONVOLATILE MEMORY READ, PROGRAM AND ERASE

CROSS-REFERENCE TO RELATED APPLICATIONS

This application claims the benefit of U.S. Provisional Application No. 60/976,608, filed on Oct. 1, 2007. This application is related to application Ser. No. 12/209,577, filed on Sep. 12, 2008. The disclosures of the above applications are incorporated herein by reference in their entirety.

FIELD

The present disclosure relates to integrated circuits, and more particularly systems and methods for multi-level nonvolatile memory access.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Nonvolatile semiconductor memory retains data after power is removed and includes a memory array. Memory arrays that include NAND-type or NOR-type memory cells (e.g., NAND-type or NOR-type flash memory cells) are called NAND-type or NOR-type memory arrays, respectively. Memory arrays typically include memory cells arranged in rows and columns. Data is read from or written to the memory cells using decoder circuits (decoders) that select word lines (WLs) and bit lines (BLs) corresponding to the memory cells. Some memory cells store two or more bits of data. The multiple bits may be represented in the cell via multiple charged state levels.

A sense amplifier circuit for a nonvolatile memory array performs various functions. One function senses data that is stored in multi-level cells of the nonvolatile memory array. Another function temporarily stores the sensed data before outputting the sensed data to an input/output (I/O) circuit.

Another function temporarily stores input data, for example, from the I/O circuit until the input data can be stored in the nonvolatile memory array. Another function handles program, erase, and verify operations. The program operation writes data in a memory cell. The program operation may change the state of a memory cell to alter one or more bits stored in the memory cell. The erase operation removes data from a memory cell. The erase operation may reset the memory cell to a default state. The verify operation ensures that a memory cell is in a proper state after the program or erase operation.

The sense amplifier circuit may include current and/or voltage sensing circuits. For example only, during a read operation, the sense amplifier circuit detects data stored in a cell of the nonvolatile memory array. A wordline of the nonvolatile memory array is biased while data in the cell is sensed via one or more bit lines. Once the data is sensed, the data is passed to the I/O circuit. Bits of information that are stored in the cell are accessed one bit at a time for each corresponding processing cycle.

SUMMARY

In one embodiment, a memory circuit is provided that includes a memory array with multi-level cells that are each capable of storing M bits of data, where M is an integer greater than one. A module reads a state of one of the multi-level cells. The module performs at least one of a first erase operation and a first program operation on the one of the multi-level cells for the M bits of data during a first time period.

In other features, the module performs at least one of the first erase operation and the first program operation on the one of the multi-level cells for the M bits of data at the same time. In other features, the module includes at least one of an analog-to-digital converter and a sense amplifier module that generates amplifier data based on the state. A control and storage module performs the at least one of the first erase operation and the first program operation based on the amplifier data. In other features, the control and storage module stores the M bits of data.

In still other features, the module performs the at least one of the first erase operation and the first program operation based on an XNOR of one of the M bits of data and a control signal input. In other features, the control and storage module includes a first input and output (I/O) module that stores a first one of the M bits of data. The control and storage module also includes a comparing module that performs the at least one of the first erase operation and the first program operation based on an XNOR of one of the M bits of data and a control signal input.

In yet other features, the control and storage module further includes a second I/O module that stores a second one of the M bits of data. In other features, the first I/O module includes a first tri-state inverter. A second tri-state inverter communicates with an input and an output of the first tri-state inverter. The second I/O module includes a third tri-state inverter. A fourth tri-state inverter communicates with an input and an output of the fourth tri-state inverter.

In other features, the control and storage module further includes a first output module that receives the M bits of data from the first I/O module. In other features, the control and storage module further includes a second output module that includes at least one of a set device and a reset device that receives the M bits of data from the first output module.

In other features, the control and storage module further includes an access control module that selectively transfers sensing amplifier data from a sense amplifier module to the first I/O module. In other features, the control and storage module iteratively generates processing pulses. The control and storage module further includes a handling module that stores indication data during a time period associated with a first processing pulse. The indication data indicates performance of at least one of a full-strength erase and a full-strength program during a second processing pulse that is generated after the first processing pulse.

In still other features, the control and storage module iteratively generates processing pulses. The control and storage module further includes a handling module that stores indication data during a time period associated with a first processing pulse. The indication data indicates performance of at least one of a partial-strength erase and a partial-strength program during a second processing pulse that is generated after the first processing pulse.

In yet other features, the control and storage module further includes a first handling module that stores at least one of full-strength erase and full-strength program data and that includes a first tri-state inverter. A second tri-state inverter communicates with an input and an output of the first tri-state inverter. A second handling module that stores at least one of partial-strength erase and partial-strength program data and that includes a third tri-state inverter. A fourth tri-state inverter that communicates with an input and an output of the fourth tri-state inverter.

In other features, the control and storage module further includes a first handling module that includes a first transistor that stores at least one of full-strength erase and full-strength program data. A second handling module includes a second transistor that stores at least one of partial-strength erase and partial-strength program data. In other features, the module reads the M bits of data from the multi-bit memory cell during a second time period.

In other features, the module verifies the first erase operation by selectively performing one of a full-strength erase and a partial-strength erase based on whether a voltage corresponding to the state is equal to a first soft-erase-verify level. The module includes a verification module that verifies the first erase operation. A sense amplifier that performs one of the full-strength erase and the partial-strength erase based on the verification.

In yet other features, the module verifies the first program operation by selectively performing one of a full-strength program and a partial-strength program based on whether a voltage corresponding to the state matches a first soft-program-verify level. The module includes a verification module that verifies the first program operation. A sense amplifier performs one of the full-strength program and the partial-strength program based on the verification.

In other features, a solid-state drive (SSD) is provided and includes the memory circuit. In other features, a data storage system is provided and includes a storage area network (SAN) control module that controls storage units that each includes multiples of the SSD. In other features, the data storage system further includes a switching unit that selects one of the SSD based on a control signal from the SAN control module.

In still other features, a method of operating a memory circuit is provided and includes providing a memory array. The memory array includes multi-level cells that are each capable of storing M bits of data, where M is an integer greater than one. A state of one of the multi-level cells is read. At least one of a first erase operation and a first program operation is performed on the one of the multi-level cells for the M bits of data during a first time period.

In other features, amplifier data is generated based on the state. At least one of the first erase operation and the first program operation is performed based on the amplifier data. In other features, at least one of a full erase and a partial erase is performed on the one of the multi-level cells during the first erase operation.

In yet other features, at least one of a full program and a partial program is performed on the one of the multi-level cells during the first program operation. In other features, amplifier data is generated based on the state. The M bits of data are transferred from at least one of an analog-to-digital converter and a sense amplifier module to at least one input and output module during a second time period and during a read operation. In other features, at least one of a first erase operation and a first program operation is performed based on an XNOR function.

In other features, a first read level operation is performed to read a first one of the M bits of data. At least one of a second read level operation and a third read level operation is performed to read a second one of the M bits of data. In other features, an output of a first read level operation is compared with output of a second read level operation to correct a least significant bit of the M bits of data. In other features, the least significant bit is inverted based on the comparison.

In still other features, the method further includes storing user data into an input and output module, determining whether the user data has a predetermined voltage distribution level, and performing the first erase operation based on the determination. In other features, the first erase operation is verified by selectively performing one of a full-strength erase and a partial-strength erase based on whether a voltage corresponding to the state is equal to a first soft-erase-verify level.

In yet other features, the method further includes verifying that states of the multi-level cells match target levels corresponding to respective erase operations performed on the multi-level cells. In other features, the method further includes verifying the first program operation by selectively performing one of a full-strength program and a partial-strength program. The verification is performed based on whether a voltage corresponding to the state matches a first soft-program-verify level.

In other features, the method further includes verifying the first program operation. One of the full-strength program and the partial-strength program is performed based on the verification. In other features, the method further includes verifying that states of the multi-level cells match target levels corresponding to respective program operations performed on the multi-level cells.

In other features, the method further includes performing a first read operation to read a first one of the M bits of data and performing a second read operation to read a second one of the M bits of data. A third read operation is performed after the second read operation to read the first one of the M bits of data.

In other features, the first read operation includes reading the state and transferring sensed amplifier data corresponding to a first one of the M bits of data to a first data storage module. The second read operation includes reading the state and transferring sensed amplifier data corresponding to a second one of the M bits of data to a second data storage module. The third read operation includes reading the state and transferring sensed amplifier data corresponding to the first one of the M bits of data to an input and output data storage module.

In other features, the method further includes enabling a first XNOR output based on a first one of the M bits of data. A second XNOR output is enabled based on a second one of the M bits of data. The at least one of a first erase operation and a first program operation is performed based on the first XNOR output and the second XNOR output.

In still other features, the method further includes generating a full-strength instruction that is one of an erase instruction and a program instruction before enabling the first XNOR output. The full-strength instruction is reset after the second XNOR output is enabled. In other features, the method further includes determining whether at least one of a second erase operation and a second program operation is to be performed. States of the multi-level cells for at least one of the first erase operation and the first program operation are verified based on the determination.

In other features, a memory circuit includes storing means that includes multi-level cells each for storing M bits of data, where M is an integer greater than one. Sensing means reads a state of one of the multi-level cells and performs at least one of a first erase operation and a first program operation on the one of the multi-level cells for the M bits of data during a first time period. In other features, the sensing means performs at least one of the first erase operation and the first program operation on the one of the multi-level cells for the M bits of data at the same time.

In yet other features, the sensing means includes at least one of converting means and amplifying means for generating amplifier data based on the state. Control and storage means performs the at least one of the first erase operation and the first program operation based on the amplifier data. In other features, the control and storage means performs at least one of a full erase and a partial erase on the one of the multi-level cells during the first erase operation. In other features, the control and storage means performs at least one of a full program and a partial program on the one of the multi-level cells during the first program operation. In other features, the control and storage means stores the M bits of data.

In other features, the sensing means includes a control and storage means for performing the at least one of the first erase operation and the first program operation based on an XNOR of one of the M bits of data and a control signal input. In other features, the sensing means includes first input and output (I/O) means for storing a first one of the M bits of data. Comparing means performs the at least one of the first erase operation and the first program operation based on an XNOR of one of the M bits of data and a control signal input. In other features, the control means further includes second I/O means for storing a second one of the M bits of data.

In still other features, the first I/O means includes a first tri-state inverter and a second tri-state inverter that communicates with an input and an output of the first tri-state inverter. The second I/O means includes a third tri-state inverter and a fourth tri-state inverter that communicates with an input and an output of the fourth tri-state inverter.

In other features, the sensing means further includes first output means for receiving the M bits of data from the first I/O means. In other features, the sensing means further includes second output means that includes at least one of a set device and a reset device. The second output means receives the M bits of data from the first output means. In other features, the sensing means further includes access control means for selectively transferring sensing amplifier data from a sense amplifier module to the first I/O means.

In yet other features, the sensing means iteratively generates processing pulses and includes handling means for storing indication data during a time period associated with a first processing pulse. The indication data indicates performance of at least one of a full-strength erase and a full-strength program during a second processing pulse that is generated after the first processing pulse.

In other features, the sensing means iteratively generates processing pulses and includes handling means for storing indication data during a time period associated with a first processing pulse. The indication data indicates performance of at least one of a partial-strength erase and a partial-strength program during a second processing pulse that is generated after the first processing pulse.

In other features, the sensing means further includes first handling means for storing at least one of full-strength erase and full-strength program data. The first handling means includes a first tri-state inverter and a second tri-state inverter that communicates with an input and an output of the first tri-state inverter. Second handling means is included for storing at least one of partial-strength erase and partial-strength program data. The second handling means includes a third tri-state inverter and a fourth tri-state inverter that communicates with an input and an output of the fourth tri-state inverter.

In other features, the sensing means further includes first handling means that includes a first transistor. The first handling means stores at least one of full-strength erase and full-strength program data. Second handling means includes a second transistor and stores at least one of partial-strength erase and partial-strength program data. In other features, the sensing means reads the M bits of data from the multi-bit memory cell during a second time period.

In yet other features, the sensing means verifies the first erase operation by selectively performing one of a full-strength erase and a partial-strength erase based on whether a voltage corresponding to the state is equal to a first soft-erase-verify level. The sensing means includes verification means for verifying the first erase operation. Amplifying means performs one of the full-strength erase and the partial-strength erase based on the verification.

In still other features, the sensing means verifies the first program operation by selectively performing one of a full-strength program and a partial-strength program based on whether a voltage corresponding to the state matches a first soft-program-verify level. The sensing means includes verification means for verifying the first program operation. Amplifying means performs one of the full-strength program and the partial-strength program based on the verification.

In other features, the sensing means includes at least one of converting means and amplifying means for generating amplifier data based on the state. Control means transfers the M bits of data from the at least one of the converting means and the amplifying means to at least one input and output module during a second time period and during a read operation.

In other features, the sensing means performs the at least one of a first erase operation and a first program operation based on an XNOR function. In other features, the sensing means performs a first read level operation to read a first one of the M bits of data. The sensing means performs at least one of a second read level operation and a third read level operation to read a second one of the M bits of data.

In other features, the sensing means compares an output of a first read level operation with output of a second read level operation to correct a least significant bit of the M bits of data. In other features, the sensing means inverts the least significant bit based on the comparison. In other features, the sensing means stores user data into an input and output module, determines whether the user data has a predetermined voltage distribution level, and performs the first erase operation based on the determination.

In yet other features, the sensing means verifies the first erase operation by selectively performing one of a full-strength erase and a partial-strength erase based on whether a voltage corresponding to the state is equal to a first soft-erase-verify level. In other features, the sensing means verifies the first erase operation by selectively performing a partial-strength erase based on the voltage corresponding to the state matching a first target-erase-verify level.

In other features, the sensing means verifies the first erase operation by selectively performing one of a full-strength erase and a partial-strength erase based on the voltage corresponding to the state matching a second soft-erase-verify level. In other features, the sensing means verifies the first erase operation by selectively performing a partial-strength erase based on the voltage corresponding to the state matching a second target-erase-verify level.

In other features, the sensing means verifies that states of the multi-level cells match target levels corresponding to respective erase operations performed on the multi-level cells. In other features, the sensing means verifies the first program operation by selectively performing one of a full-strength program and a partial-strength program based on whether a voltage corresponding to the state matches a first soft-program-verify level.

In still other features, the sensing means includes verification means for verifying the first program operation. Amplifying means performs one of the full-strength program and the partial-strength program based on the verification. In other features, the sensing means verifies the first program operation by selectively performing a partial-strength program based on the voltage corresponding to the state matching a first target-program-verify level.

In other features, the sensing means verifies the first program operation by selectively performing one of a full-strength program and a partial-strength program based on the voltage corresponding to the state matching a second soft-program-verify level. In other features, the sensing means verifies the first program operation by selectively performing a partial-strength program based on the voltage corresponding to the state matching a second target-program-verify level.

In yet other features, the sensing means verifies that states of the multi-level cells match target levels corresponding to respective program operations performed on the multi-level cells. In other features, the sensing means performs a first read operation to read a first one of the M bits of data and a second read operation to read a second one of the M bits of data. The sensing means performs a third read operation after the second read operation to read the first one of the M bits of data.

In other features, the first read operation includes reading the state and transferring sensed amplifier data corresponding to a first one of the M bits of data to a first data storage module. The second read operation includes reading the state and transferring sensed amplifier data corresponding to a second one of the M bits of data to a second data storage module. The third read operation includes reading the state and transferring sensed amplifier data corresponding to the first one of the M bits of data to an input and output data storage module.

In other features, the sensing means enables a first XNOR output based on a first one of the M bits of data and enables a second XNOR output based on a second one of the M bits of data. The sensing means performs the at least one of a first erase operation and a first program operation based on the first XNOR output and the second XNOR output.

In other features, the sensing means generates a full-strength instruction that is one of an erase instruction and a program instruction before enabling the first XNOR output. The sensing means resets the full-strength instruction after enabling the second XNOR output.

In yet other features, the sensing means determines whether at least one of a second erase operation and a second program operation is to be performed. The sensing means verifies states of the multi-level cells for at least one of the first erase operation and the first program operation based on the determination.

In other features, a SSD is provided and includes the memory circuit. In other features, a data storage system is provided and includes SAN control means for controlling storage units that each include multiple of the SSD. In other features, the data storage system includes switching means for selecting one of the SSD based on a control signal from the SAN control means.

Further areas of applicability of the present disclosure will become apparent from the detailed description, the claims and the drawings. It should be understood that the detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein.

DESCRIPTION

Figure 1:
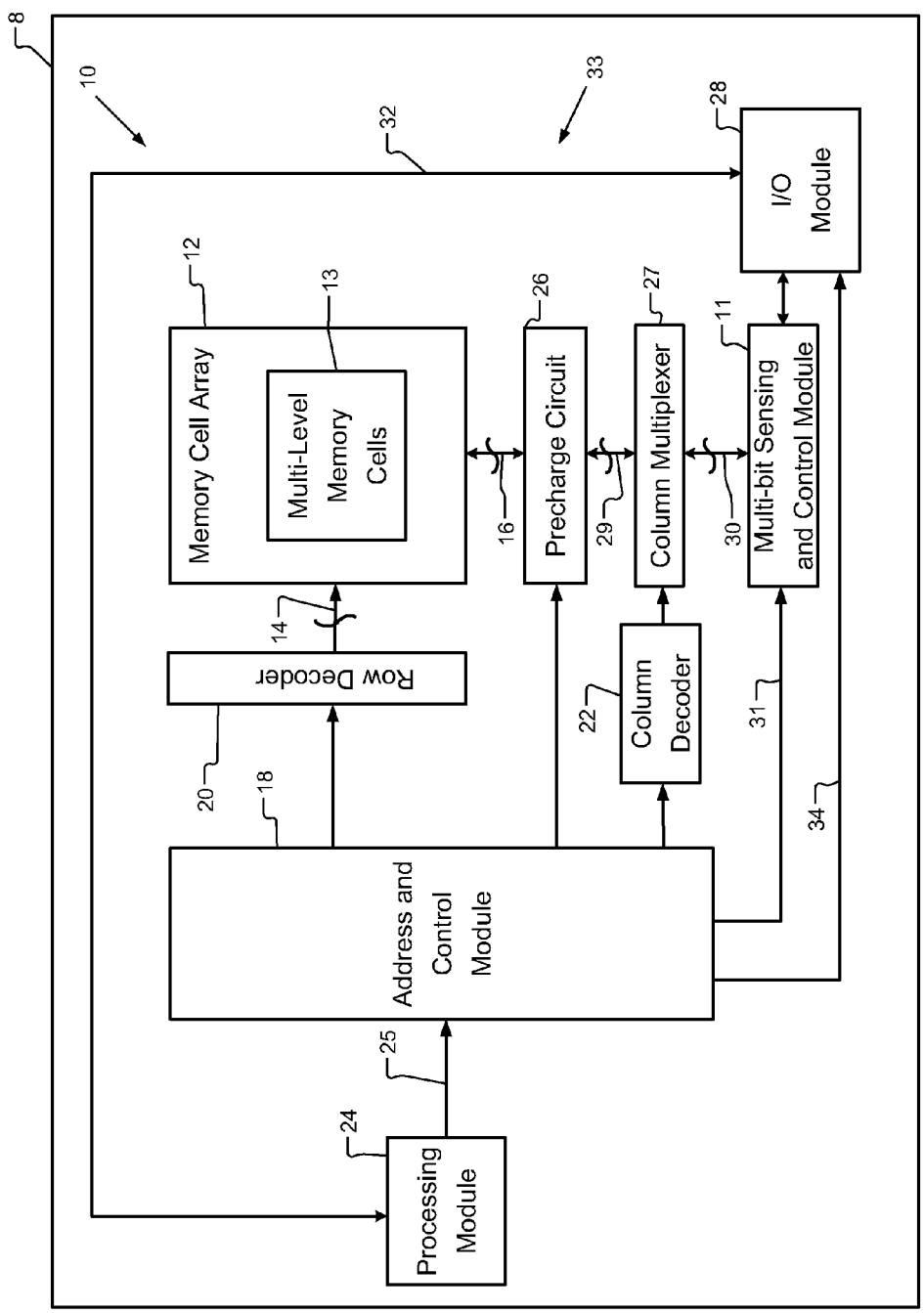
FIG. 1 is a functional block diagram of a memory integrated circuit that includes a memory system according to an embodiment of the present disclosure.

The following description is merely exemplary in nature and is in no way intended to limit the disclosure, its application, or uses. In the following description arrows are shown, the arrows may represent one or more signals and/or signal lines. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

Sense amplifiers may operate on one bit at a time to verify that a value has been read from memory, erased from memory, or programmed into memory. A memory cell may have a corresponding threshold voltage (cell Vt level), which may be provided to a sense amplifier. The sense amplifier may then compare the Vt level to threshold levels to identify the bit values stored in the memory cell. The embodiments disclosed herein verify multiple bits of data at a time or during the same time period for efficient verification. This efficiency is provided by relatively few circuit elements and thus requires relatively small circuit area.

Referring now to FIG. 1, a functional block diagram of a memory integrated circuit (IC) 8 that includes an exemplary memory system 10 is shown. The memory system 10 is provided as an example environment for at least one of the embodiments of the present disclosure. At least one of the embodiments of the present disclosure is directed to a multi-bit sensing and control module 11 of the memory system 10. Example multi-bit sensing and control modules are shown and described at least with respect to the embodiments of FIGS. 2-4 and 14-15.

The memory system 10 includes a nonvolatile memory cell array 12 (memory cell array 12), which includes rows and columns of multi-level memory cells 13. The memory cells 13 are accessed through row and column selection and may be NAND type memory cells, NOR type memory cells, etc. A row is selected by asserting a word line and a column is selected by asserting or precharging a bit line or pair of bit lines. Word lines 14 communicate with row decoder 20. Bit lines 16 communicate with a column decoder 22. An address and control module 18 receives address information, which is used by the row decoder 20 and the column decoder 22 to select the rows and columns of the memory cell array 12. The address and control module 18, as well as other elements of the memory system 10, such as the row and column decoders 20, 22, may be considered part of a multi-mode control module.

The address and control module 18 receives control signals from a processing module 24 and asserts the word lines 14. The control signals may be received over a bus 25. The control signals may be provided to enable various operating modes, such as read and write (program) modes.

The memory system 10 may further include the multi-bit sensing and control module 11, a bit line precharge circuit 26, a column multiplexer 27, and an input and output (I/O) module 28. The bit line precharge circuit 26 may be used to precharge the bit lines of the memory cell array 12. The bit line precharge circuit 26 may include drivers, buffers, transistors and/or other bit line asserting elements. The bit line precharge circuit 26 may be coupled between the memory cell array 12 and the column multiplexer 27 or may be located on an opposite side of the memory cell array 12 as the column multiplexer 27.

During a read mode, the column multiplexer 27 selects the columns of the memory cell array 12 for latch purposes via column selection signals 29. After precharging the bit lines, the column decoder 22 selects certain columns via the column multiplexer 27. Stored bits, associated with the selected columns, are provided to one or more sense amplifiers of the multi-bit sensing and control module 11 for amplification prior to reception by the I/O module 28. The stored bits are received as bit information signals 30.

The multi-bit sensing and control module 11 may receive control signals 31 from the address and control module 18. The multi-bit sensing and control module 11 may be used to read data from the memory cell array 12 based on the control signals 31. The multi-bit sensing and control module 11 may also be used to send data to the memory cell array 12 based on the control signals 31. The control signals 31 may include read and program information, precharge information, cell activation information, etc. Data received from the memory cell array 12 may be amplified and latched by the I/O module 28 and provided in the form of an output signal 32, which has a corresponding data path 33. The data may be latched based on a latch signal 34 from the address and control module 18.

During the program mode, cells in the memory cell array 12 are similarly asserted via the decoders 20, 22. Received data is provided to the bit lines via write drivers in the multi-bit sensing and control module 11. The data may be provided to the multi-bit sensing and control module from the processing module 24 via the address and control module 18 or the I/O module 28.

Figure 2:
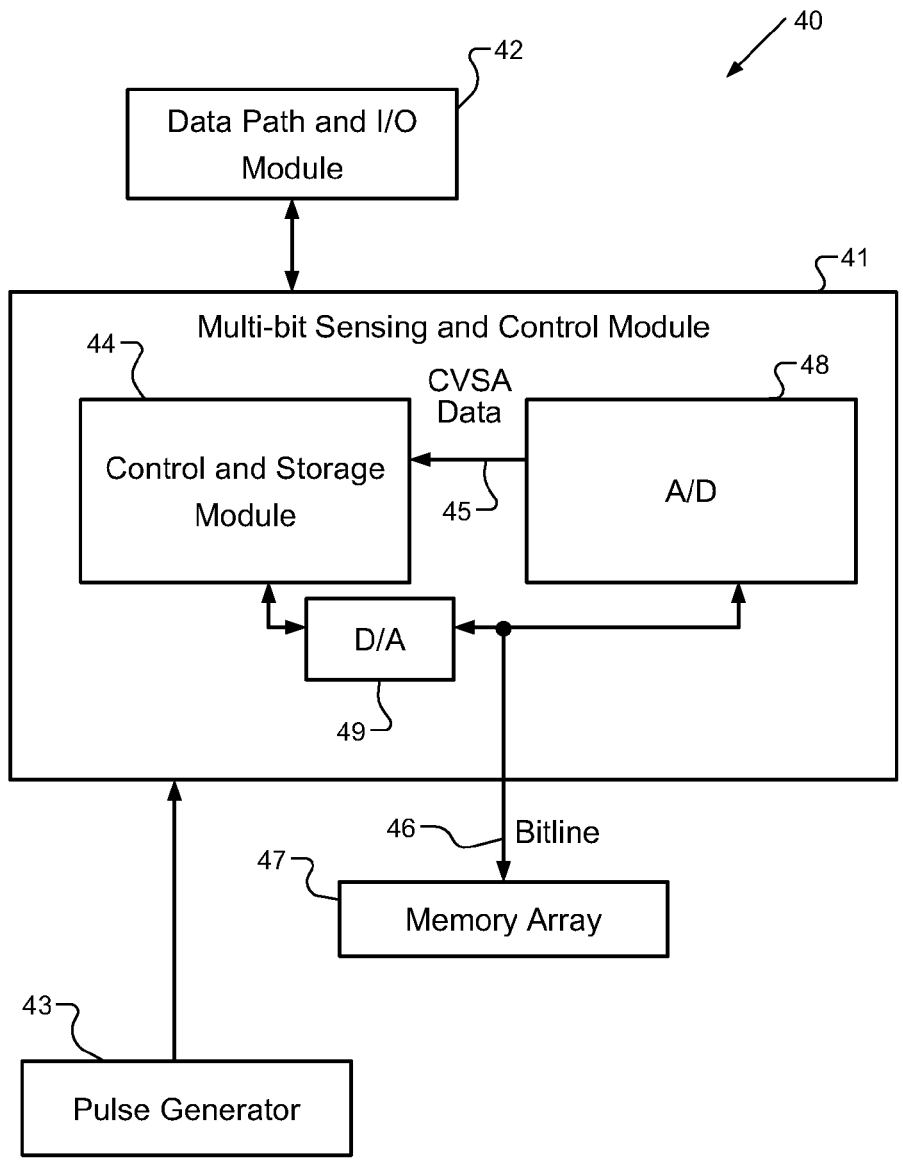
FIG. 2 is a functional block diagram of a multi-level non-volatile memory circuit according to an embodiment of the present disclosure.

Referring now to FIG. 2, a functional block diagram of multi-level nonvolatile memory circuit 40 is shown. The multi-level nonvolatile memory circuit 40 has a sense amplifier circuit architecture that includes a multi-bit sensing and control module 41 that is connected to a data path and I/O module 42. The multi-bit sensing and control module 41 performs various operations including sensing, temporarily storing, programming, erasing, and/or verifying multiple bits of data at a time. These operations may be performed at the same time or during the same time period and may correspond to one or more processing pulses, such as one or more read pulses, erase pulses, and program pulses. The processing pulses may be generated by a pulse generator 43. Multiple control and/or processing steps may be performed in association with a single read, erase and/or program pulse. The processing pulses may be generated repeatedly for iterative read, erase and program operations.

The operations may be divided into three (3) functions: 1) sensing data stored in the cells of a memory array, 2) temporarily storing sensed data before outputting to an I/O module, such as the I/O module 28 of FIG. 1, and/or temporarily storing input data until correctly written into the memory array, and/or 3) handling the program/erase/verify operations.

The multi-bit sensing and control module 41 includes one or more control and storage module(s) 44 and one or more analog-to-digital (A/D) converter(s) 48. As shown, the A/D converter 48 generates CVSA data based on signals received from a memory array 47 via one or more lines, such as the bit line 46. The CVSA data is provided as CVSA signals 45 to the control and storage module 44.

The control and storage module 44 provides control and storing functions to store and direct data from the A/D converter 48. Control signals may be provided to the bit line 46 via a digital-to-analog (D/A) converter 49. The control and storage module 44 includes control circuits and/or modules that interface with other circuits and/or modules during read, program, and erase operations.

During a read operation, the control and storage module 44 directs data to the data path and the I/O module 42. During a program or an erase operation, the control and storage module 44 receives data from the data path and the I/O module 54. The control and storage module 44 verifies the data and then controls program and/or erase operations based on the data and corresponding verification results.

The control and storage module 44 may be implemented over a small integrated circuit area and provides reliable operations and simple control. The control and storage module 44 may use an exclusive NOR ('XNOR') function, bootstrap method, and capacitor storage to improve operation.

Although the control and storage module 44 is shown with respect to one sense amplifier circuit and one sense amplifier module, the control and storage module 44 may be connected to and shared with multiple sense amplifier circuits and multiple sense amplifier modules. Multiple implementations of the control and storage module 44 are described herein. Example implementations are shown in FIGS. 4, 5, 13 and 14.

Figure 3:
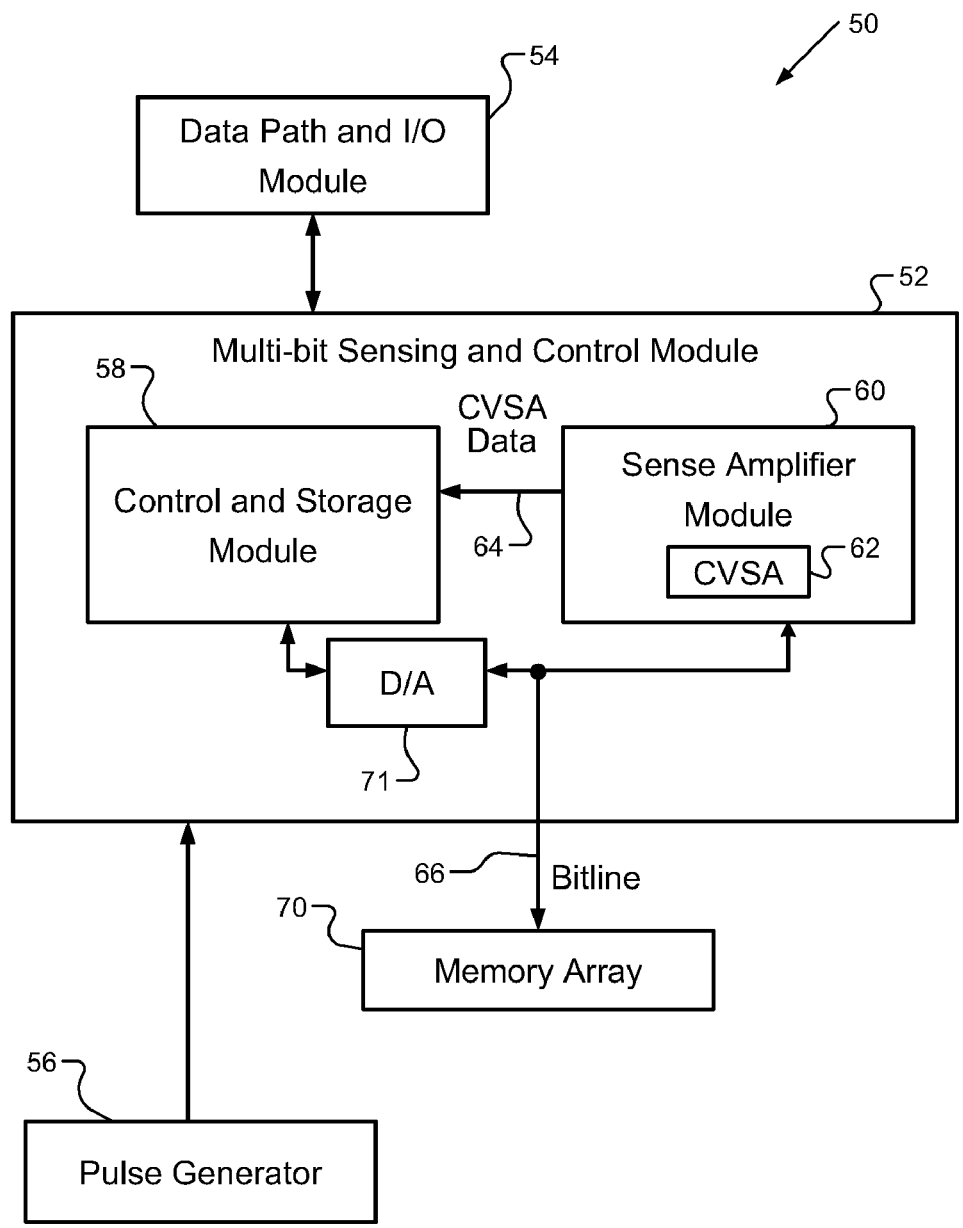
FIG. 3 is a functional block diagram of a multi-level non-volatile memory circuit according to an embodiment of the present disclosure.

Referring now to FIG. 3, a functional block diagram of another multi-level nonvolatile memory circuit 50 is shown. The multi-level nonvolatile memory circuit 50 has a sense amplifier circuit architecture that includes a multi-bit sensing and control module 52 that is connected to a data path and I/O module 54. The multi-bit sensing and control module 52 performs various operations including sensing, temporarily storing, programming, erasing, and verifying multiple bits of data at a time. These operations may be performed at the same time or during the same time period and may correspond to one or more processing pulses, such as one or more read pulses, erase pulses, and program pulses. The processing pulses may be generated by a pulse generator 56. Multiple control and/or processing steps may be performed in association with a single read, erase and/or program pulse. The processing pulses may be generated repeatedly for iterative read, erase and program operations.

The operations may be divided into three (3) functions: 1) sensing data stored in the cells of a memory array, 2) temporarily storing sensed data before outputting to an I/O module, such as the I/O module 36 of FIG. 1, or temporarily storing input data until correctly written into the memory array, and 3) handling the program/erase/verify operations.

The multi-bit sensing and control module 52 includes one or more control and storage module(s) 58 and one or more sense amplifier module(s) 60. As shown, the sense amplifier module 60 may include a current/voltage sensing amplifier (CVSA) 62. Example sensing amplifier modules are disclosed in related case application Ser. No. 12/209,577, entitled "Auto-Zero Current Sensing Amplifier", which is incorporated herein by reference in its entirety. The CVSA 62 detects states of the multi-level memory cells 13 and generates CVSA data that is provided as CVSA signals 64 to the control and storage module 58. The CVSA 62 provides a sensing function that senses data stored in memory through one or more lines, such as the bit line 66 of a memory array 70.

The control and storage module 58 provides control and storing functions to store and direct data sensed by the CVSA 62. Control signals may be provided to the bit line 66 via a D/A converter 71. The control and storage module 58 includes control circuits and/or modules that interface with other circuits and/or modules during read, program, and erase operations. Word lines of the memory array 70 are biased and controlled while the CVSA 62 performs the sensing function. Once data is sensed, the sensed data is then passed to the control and storage module 58.

During a read operation, the control and storage module 58 directs data to the data path and the I/O module 54. During a program or an erase operation, the control and storage module 58 receives data from the data path and the I/O module 54. The control and storage module 58 verifies the data and then controls program and/or erase operations based on the data and corresponding verification results.

The control and storage module 58 may be implemented over a small integrated circuit area and provides reliable operations and simple control. The control and storage module 58 may use an exclusive NOR ('XNOR') function, bootstrap method, and capacitor storage to improve operation.

Although the control and storage module 58 is shown with respect to one sense amplifier circuit and one sense amplifier module, the control and storage module 58 may be connected to and shared with multiple sense amplifier circuits and multiple sense amplifier modules. Multiple implementations of the control and storage module 58 are described herein. Example implementations are shown in FIGS. 4, 5, 13 and 14.

Figure 4:
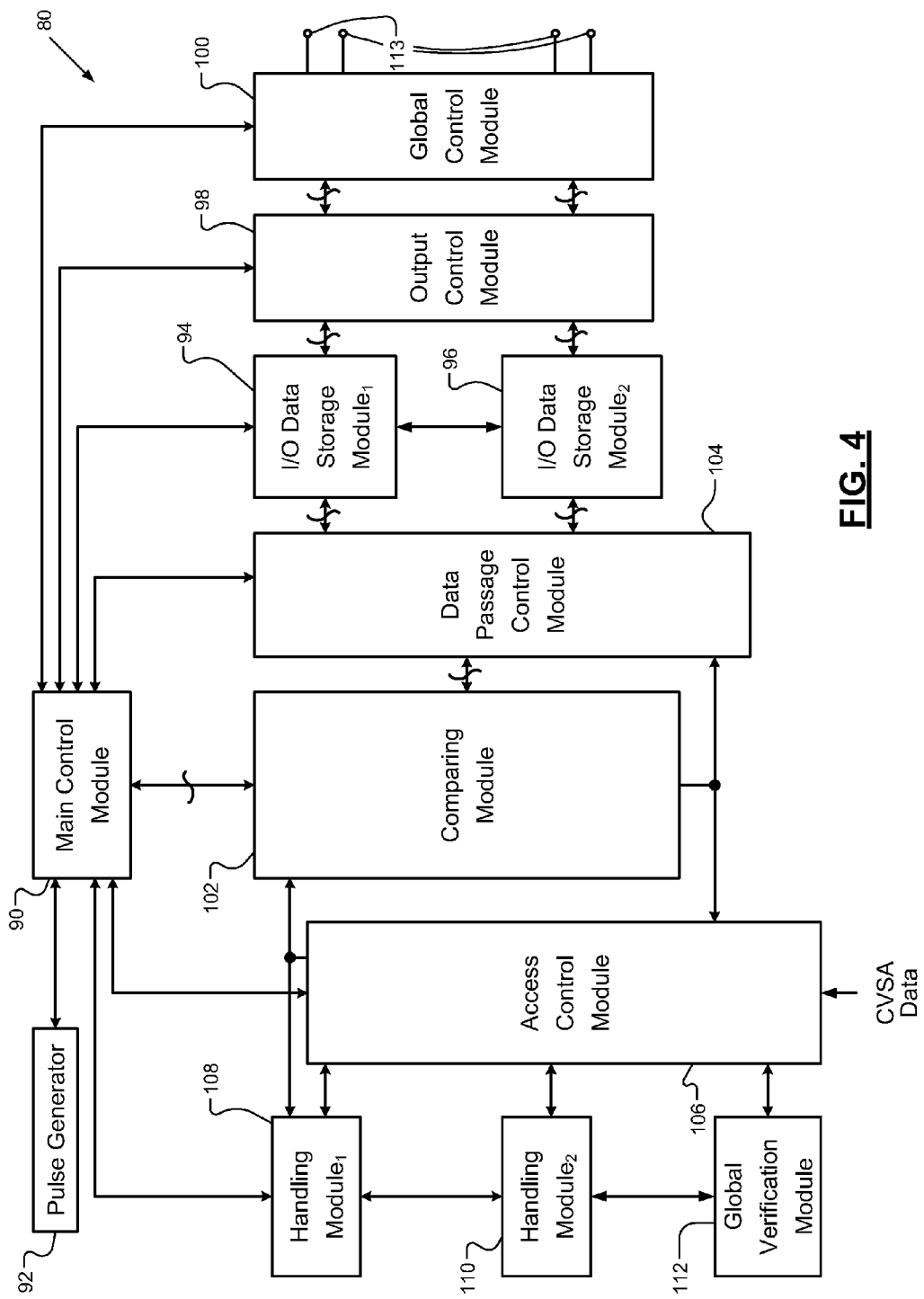
FIG. 4 is a functional block diagram of a control and storage module according to an embodiment of the present disclosure.

Referring now to FIG. 4, a functional block diagram of a control and storage module 80 is shown. The architecture of the control and storage module 80 is shown for a two (2) bit multi-level-cell (MLC) memory. The MLC memory stores 2 bits of data per cell. The control and storage module 80 may be applied to cells storing more than 2 bits. Example circuit modifications for cells storing more than 2 bits of data per cell are described below.

The control and storage module 80 performs program, erase and read operations on multiple bits (the 2 bits for the example embodiment shown) simultaneously, during the same time period and/or during the same processing cycle. This is different than sense amplifier circuits of NAND flash memory, which operate on only one (1) bit at a time for each operation.

The control and storage module 80 includes various circuit blocks that may receive control signals from a main control module 90. The main control module 90 receives a processing pulse signal from a pulse generator 92. The pulse generator 92 may be part of the sense amplifier module 60 of FIG. 3. The main control module 90 may be part of the control and storage module 80, the address and control module 18, or the processing module 24 of FIG. 1 (or may be a stand alone or separate module). The blocks include: a first I/O data storage module 94, a second I/O data storage module 96, an output control module 98, a global control module 100, a compare module 102, a data passage control module 104, an access control module 106, a first handling module 108, a second handling module 110, and a global verification module 112.

The I/O data storage modules 94, 96 are latch modules for I/O and storage of a first bit (bit 0) and a second bit (bit 1). The output control module 98 includes I/O devices for bit 0 and bit 1 received by the I/O data storage modules 94, 96. The global control module 100 includes global set and reset devices, which are shared between different sense amplifiers. The global control module 100 performs as an output module and provides bit 0 and bit 1 to a data path and I/O module, such as the data path and I/O module 54, via output terminals 113. The compare module 102 performs a XNOR function on selected ones of control signal inputs W0, W0', W1 and W1', bit 0, and bit 1.

The data passage control module 104 selectively passes CVSA data from a CVSA, such as the CVSA 62 of FIG. 3, to the I/O data storage modules 94, 96. The access control module 106 controls access of the handling modules 108, 110. The first handling module 108 performs as a latch for the storage of program/erase information for a next or subsequent processing pulse. Put another way, the first handling module 108 indicates whether a full-strength program/erase for the subsequent processing pulse is to be executed. A full-strength program may refer to increasing the Vt of the target cells by a predefined large amount, for example 100 mV. A full-strength erase may refer to decreasing the Vt of the target cells by a predefined large amount, for example 100 mV. A partial-strength program or soft-program may refer to increasing the Vt of the target cells by a predefined small amount, for example 25 mV. A partial-strength erase or soft-erase may refer to decreasing the Vt of the target cells by a predefined small amount, for example 25 mV.

The second handling module 110 performs as a latch for the storage of soft-program/soft-erase information for a subsequent processing pulse. In other words, the second handling module 110 indicates whether a reduced-strength program/erase for the subsequent processing pulse is to be executed. The global verification module 100 is used to perform a global verification, which may be shared by one or more sense amplifier circuits.

Figure 5A:
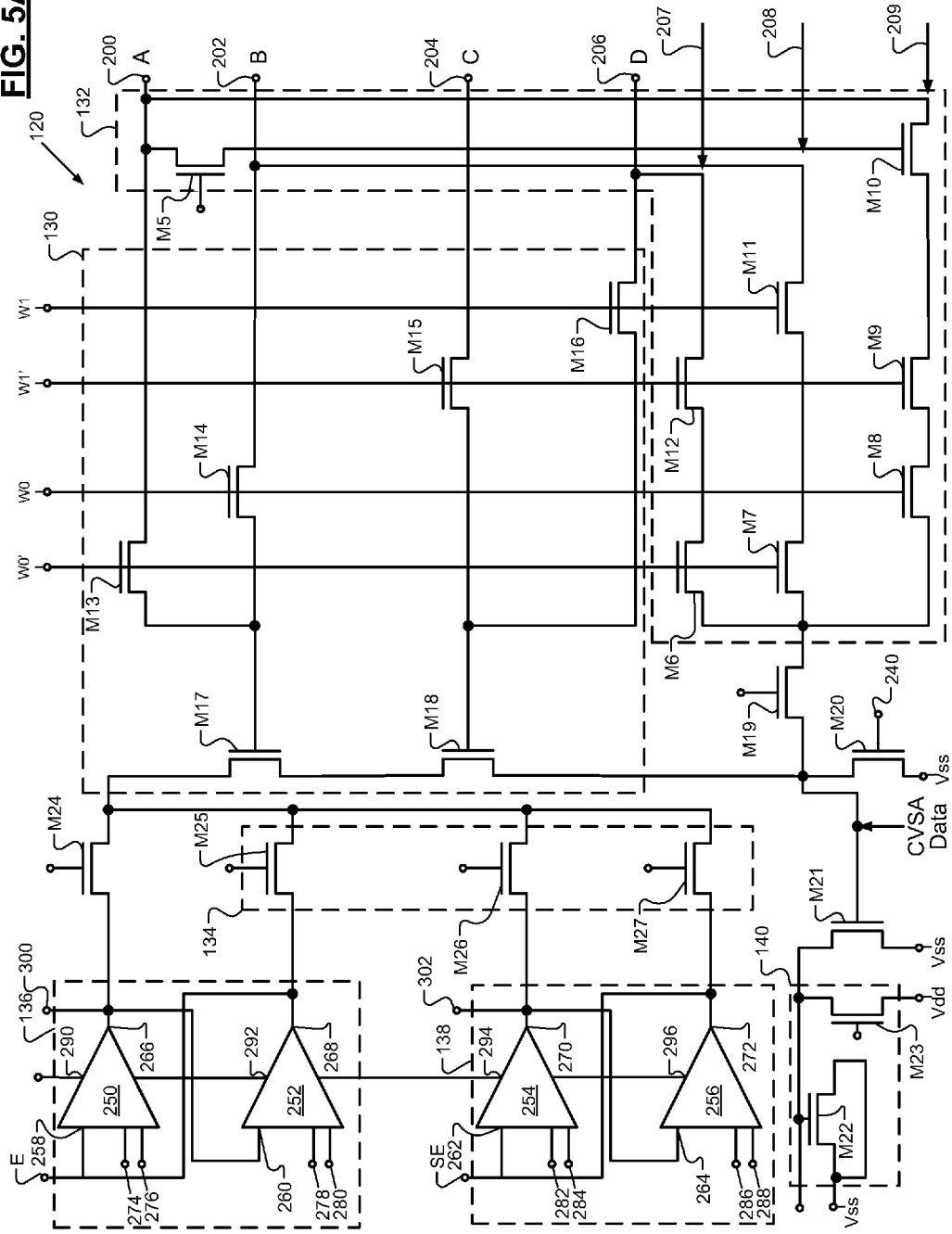
FIG. 5A is a schematic of a first portion of another control and storage module according to an embodiment of the present disclosure.
Figure 5B:
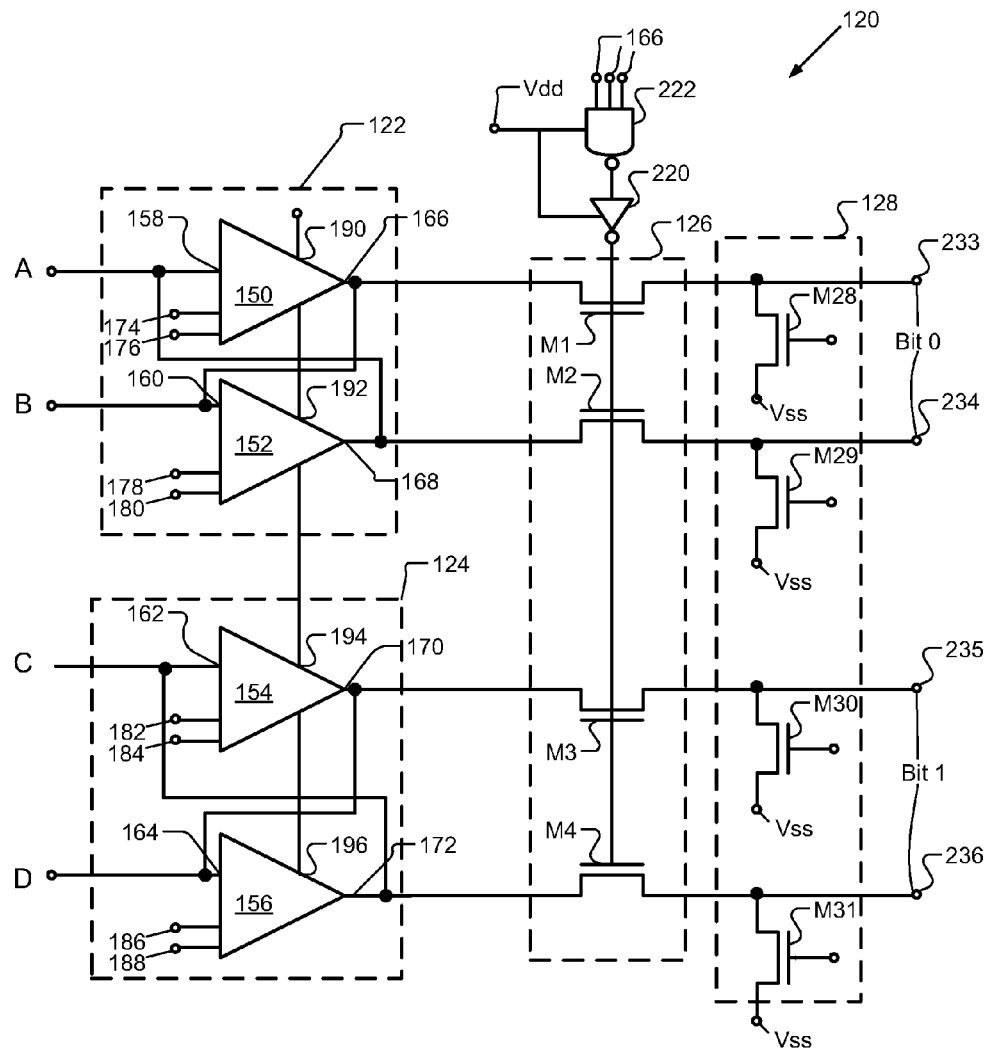
FIG. 5B is a schematic of a second portion of the control and storage module of FIG. 5A.

Referring now to FIGS. 5A and 5B, schematic views of first and second portions of another control and storage module 120 are shown. The control and storage module 120 is provided as an example implementation of the control and storage module 80. The control and storage module 120 includes exemplary circuits for: a first I/O data storage module 122, a second I/O data storage module 124, an output control module 126, a global control module 128, a compare module 130, a data passage control module 132, an access control module 134, a first handling module 136, a second handling module 138, and a global verification module 140.

The modules 122-140 and other modules disclosed herein include various transistors that each may include a source, a gate and a drain and corresponding terminals. The transistors may, for example, be n-channel or p-channel MOSFETs. Although some transistors are described as p-channel transistors (or n-channel transistors), the p-channel transistors (or n-channel transistors) may be replaced with n-channel transistors (or p-channel transistors) or other suitable transistors. The modules 122-140 also include various control inputs that receive control signals, which may be from a main control module, such as the main control module 90.

In the description below, disclosed transistors may remain OFF and signals may remain at a zero (0) reference level unless otherwise stated. The transistors may be turned ON or activated and/or the signals may be asserted during one of the below described operations and are deactivated and returned to 0 after completing the operation.

The first and second I/O data storage modules 122, 124 each include a first tri-state inverter 150, 154 and a second tri-state inverter 152, 156, respectively. The tri-state inverters 150-156 have respective data inputs 158-164 and data outputs 166-172, control inputs 174-188 and voltage supply inputs 190-196 that receive a supply voltage Vdd. The data inputs 158-164 are connected to respective data outputs 200-206 of the data passage control module 132. The data inputs 158, 162 of the first tri-state inverters 150, 154 are connected to the data outputs 168, 172 of the second tri-state inverters 152, 156. The data outputs 166, 170 of the first tri-state inverters 150, 154 are connected to the data inputs 160, 164 of the second tri-state inverters 152, 156.

The output control module 126 includes transistors M1-M4 that are each serially connected to the respective data outputs 166-172. The gates of the transistors M1-M4 are connected to each other and may receive a control signal from an inverter 220. The inverter 220 may be controlled via a NAND gate 222 that has inputs 224. The NAND gate 222 and the inverter 220 receive the supply voltage Vdd. The sources of the transistors M1-M4 are connected to respective ones of the data outputs 166-172. The drains of the transistors M1-M4 provide data output signals, which may be provided to a data path and I/O module, such as the data path and I/O module 54 of FIG. 3.

The global control module 128 includes transistors M28-M31. The gates of the transistors M28-M31 may receive control signals from a main control module, such as the main control module 90 of FIG. 4. The sources of the transistors M28-M31 are connected to respective ones of the drains of the transistors M1-M4 and to outputs 233-236. The sources of the transistors M28-M31 are respectively associated with a bit 0 and a bit 1. The drains of the transistors M28-M31 are connected to a voltage reference, such as Vss.

The compare module 130 includes transistors M13-M18. The transistors M13-M16 are serially connected to the outputs 200-206. The compare module 130 has an input 230 that is coupled to the source of the transistor M17, which is serially connected to the transistor M18. The compare module 130 has a CVSA data input 231 that is connected to the drain of the transistor M18. The gate of the transistor M17 is connected to the sources of the transistors M13, M14. The gate of the transistor M18 is connected to the sources of the transistors M15, M16. The gates of the transistors M13-M16 receive respective ones of the control signal inputs W0, W0', W1 and W1'. The drains of the transistors M13-M14 are connected to the outputs 200-206. The drain of the transistor M18 is connected to the source of a transistor M20 and to an input node CVSA. The input node CVSA may be connected to the output of a sense amplifier module, such as the output of the sense amplifier module 60 of FIG. 3. The gate of the transistor M20 receives a control input 240. The drain of the transistor M20 is connected to voltage reference Vss.

The data passage control module 132 includes transistors M5-M12. The source of the transistor M5 is connected to the output 200. The gate of the transistor M5 receives a control input signal. The drain of the transistor M5 is connected to the gate of the transistor M10. The transistors M6 and M12 are serially connected with each other and with the output 206. The transistors M7 and M11 are serially connected with each other and with the output 202. The transistors M8, M9 and M10 are serially connected with each other and with the output 200.

The sources of the transistors M6, M7 and M8 are connected to the drain of a transistor M19. The gate of the transistor M19 receives a control input 242. The drain of the transistor M19 receives CVSA data, for example from a sense amplifier module, such as the sense amplifier module 60 of FIG. 3. The gates of the transistors M6, M7, M8, M9, M11 and M12 receive respective ones of the control signal inputs W0, W0', W1 and W1'.

The transistors M6 and M12 may be associated with a read00 operation and used to transfer CVSA data for bit 1, as denoted by arrow 207. The transistors M7 and M11 may be associated with a read10 operation and used to transfer CVSA data for bit 0, as denoted by arrow 208. The transistors M8, M9 and M10 may be associated with a read01 operation and used to transfer CVSA data for bit 0 when bit 0 is a logic 0, as denoted by arrow 209.

The access control module 134 includes transistors M25-M27. The sources of the transistors M25-M27 are connected to respective outputs of the tri-state inverters 136 and 138. The gates of the transistors M25-M27 receive control inputs. The drains of the transistors M25-M27 are connected to each other and to the data input 230.

The handling modules 136, 138 each include a first tri-state inverter 250, 254 and a second tri-state inverter 252, 256, respectively. The tri-state inverters 250-256 have respective signal inputs 258-264, outputs 266-272, control inputs 274-288 and voltage supply inputs 290-296. The signal inputs 258, 262 receive a full-strength erase signal or full-strength program signal corresponding to output terminal E and a soft-erase signal or soft-program signal corresponding to output terminal SE. Terminals E and SE may be connected to an input of a D/A converter, such as the D/A converter 71 of FIG. 3. The data inputs 258, 262 are connected to the data outputs 268, 272. The data outputs 266, 270 of the first tri-state inverters 250, 254 are connected to the data inputs 260, 264. The outputs 266 and 270 are connected to output terminals 300, 302, which may also be connected to an input of a D/A converter, such as D/A converter 71 of FIG. 3. The outputs 266-272 are connected to respective source terminals of the transistors M24-M27. The gate of the transistor M24 receives a control input. The drain of the transistor M24 is connected to a MATCH node and to the input 230.

The global verification module 140 includes transistors M22 and M23. The gate of the transistor M22 is connected to the sources of the transistors M23 and M21 and receives a control input. The source and drain of the transistor M22 are connected to the reference voltage Vss. The gate and drain of the transistor M23 respectively receive a control input and the supply voltage Vdd.

Figure 6:
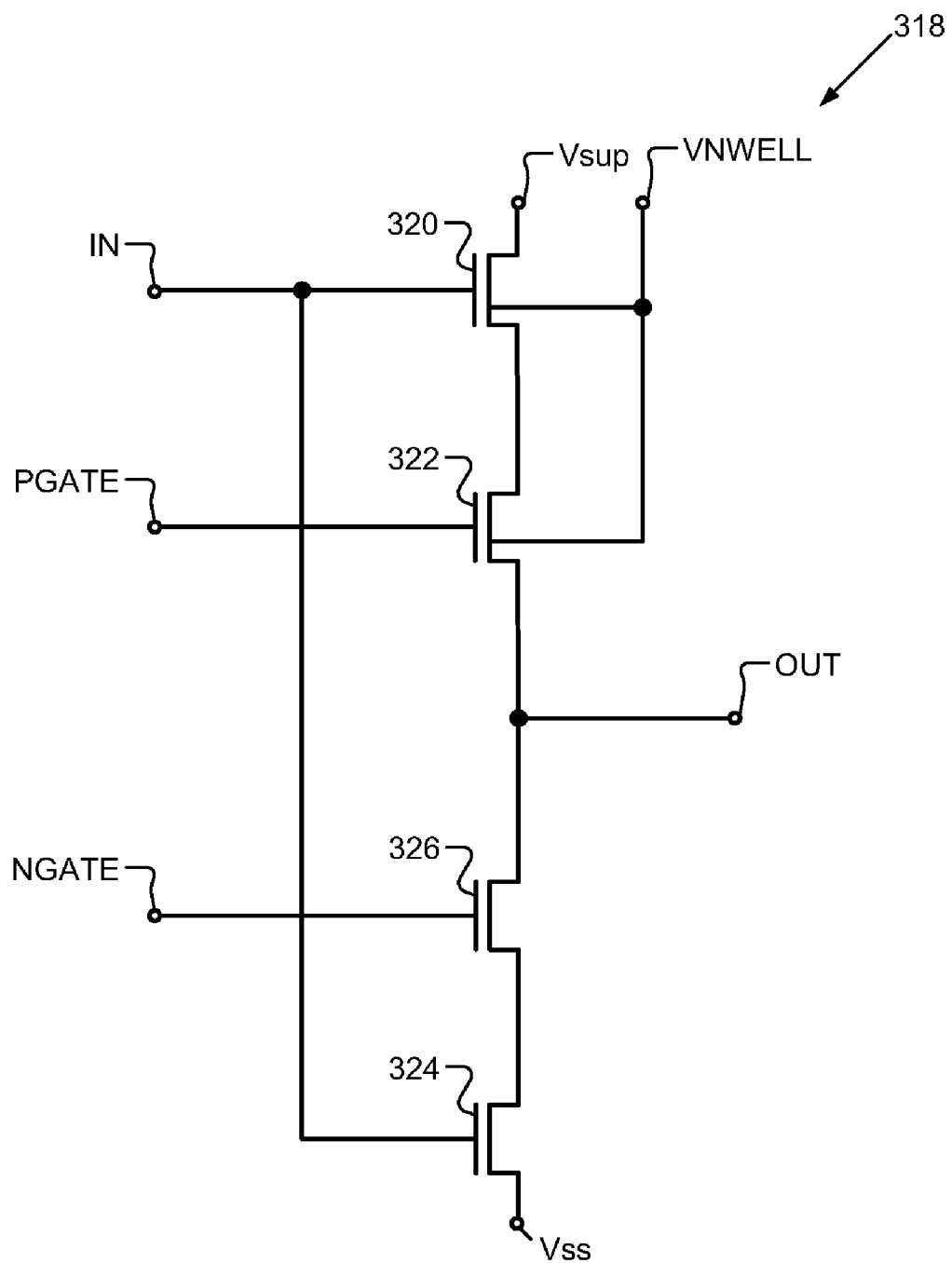
FIG. 6 is a schematic of a tri-state inverter according to an embodiment of the present disclosure.

An example of a tri-state inverter 318 for use in each of the I/O data storage modules and the handling modules is shown in FIG. 6.

Referring now to FIG. 6, the tri-state inverter 318 may include a pair of p-channel MOS transistors (pMOSs) 320 and 322 that are serially connected to each other. The source of the pMOS 320 is connected to a voltage supply terminal that has a supply voltage Vsup. The bodies of the pMOSs 320 and 322 are connected to a well terminal that has a well potential VNWELL. The pMOSs are serially connected to a pair of serially connected n-channel MOS transistors (nMOSs) 324 and 326. The nMOS 326 is adjacent to and serially connected to pMOS 322. The nMOS 326 has a control node NGATE and the pMOS 322 has a control node PGATE connected to their respective gate terminals. An input node IN is connected to the gate terminals of the pMOS 320 and the nMOS 324. An output node OUT is connected to the drain terminals of the pMOS 322 and the nMOS 326.

The output of the tri-state inverter 318 at the output node OUT can be either at a logic 0 ('0'), a logic 1 (1'), or a high-z state. A logic 0 may refer to an output state at a ground voltage reference level, such as Vss. A logic 1 may refer to an output state at a positive supply voltage level, such as Vsup or Vdd. A high-z state may refer to a high impedance state. The tri-state inverter 318 may be turned OFF to provide a high impedance by applying a 1 or high voltage level to the PGATE and a 0 or low voltage level to the NGATE. The tri-state inverter 318 may be turned ON to output a logic 0 or 1 by applying a 0 to the PGATE and a 1 to the NGATE.

Figure 7:
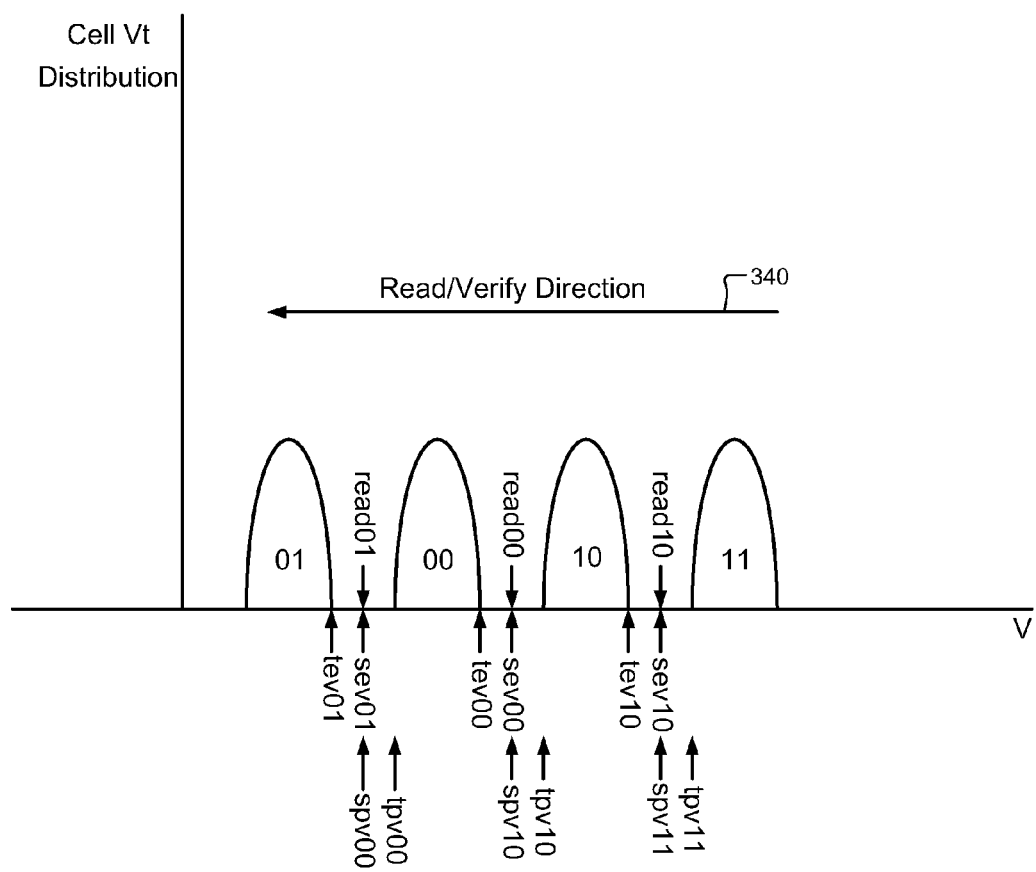
FIG. 7 is a memory cell voltage distribution diagram according to an embodiment of the present disclosure.

To provide a better understanding of the operations of the control and storage module 58 of FIG. 5, a memory cell voltage distribution is described. Referring now also to FIG. 7, an exemplary memory cell voltage distribution diagram is shown that has a cell Vt distribution with read/verify voltages. The cell Vt distribution is shown for a 2-bit multi-level memory cell, but may be modified for additional bits. The 2-bit data corresponds to four Vt sub-distributions. The lowest sub-distribution corresponds to data 01, where the 0 of the data 01 is the most-significant-bit (MSB), also called bit 1. The 1 of the data 01 is the least-significant-bit (LSB), also called bit 0.

The other Vt sub-distributions are for data 00, data 10, and data 11, shown in sequential order from lowest Vt state to highest Vt state. Such data assignment of the cell Vt sub-distributions is shown by way of example, and other data assignments of the Vt sub-distributions may be used. A voltage that is one NMOS Vt level below (less than) or corresponds with one Vt sub-distribution below the supply voltage Vsup is recognized as a logic 1 by a tri-state inverter.

In FIG. 7 various read, target-erase-verify (TEV), soft-erase-verify (SEV), target-program-verify (TPV) and soft-program-verify (SPV) states are shown. The read states include a read 01 state, a read 00 state and a read 10 state. The various states have corresponding read, erase, and program levels or voltage levels. The read states are described below with respect to the embodiment of FIG. 8. The TEV, SEV, TPV and SPV states refer to voltage references which are compared with read and/or cell voltages during verification operations. Example verification operations are described with respect to the embodiments of FIGS. 10-12. The term soft may refer to partial erase or program as defined above. The term target may refer to a predetermined value, a predetermined end result, etc. The term target may be associated with an end result for each of multiple bits of a memory cell. The term target may be associated with full-strength program or erase as defined above.

A control and storage module may control transitioning between the Vt sub-distributions based on full-strength and partial-strength erase and program operations. A full-strength operation may result in larger cell Vt shifts. A partial-strength operation may result in smaller cell Vt shifts.

Figure 8:
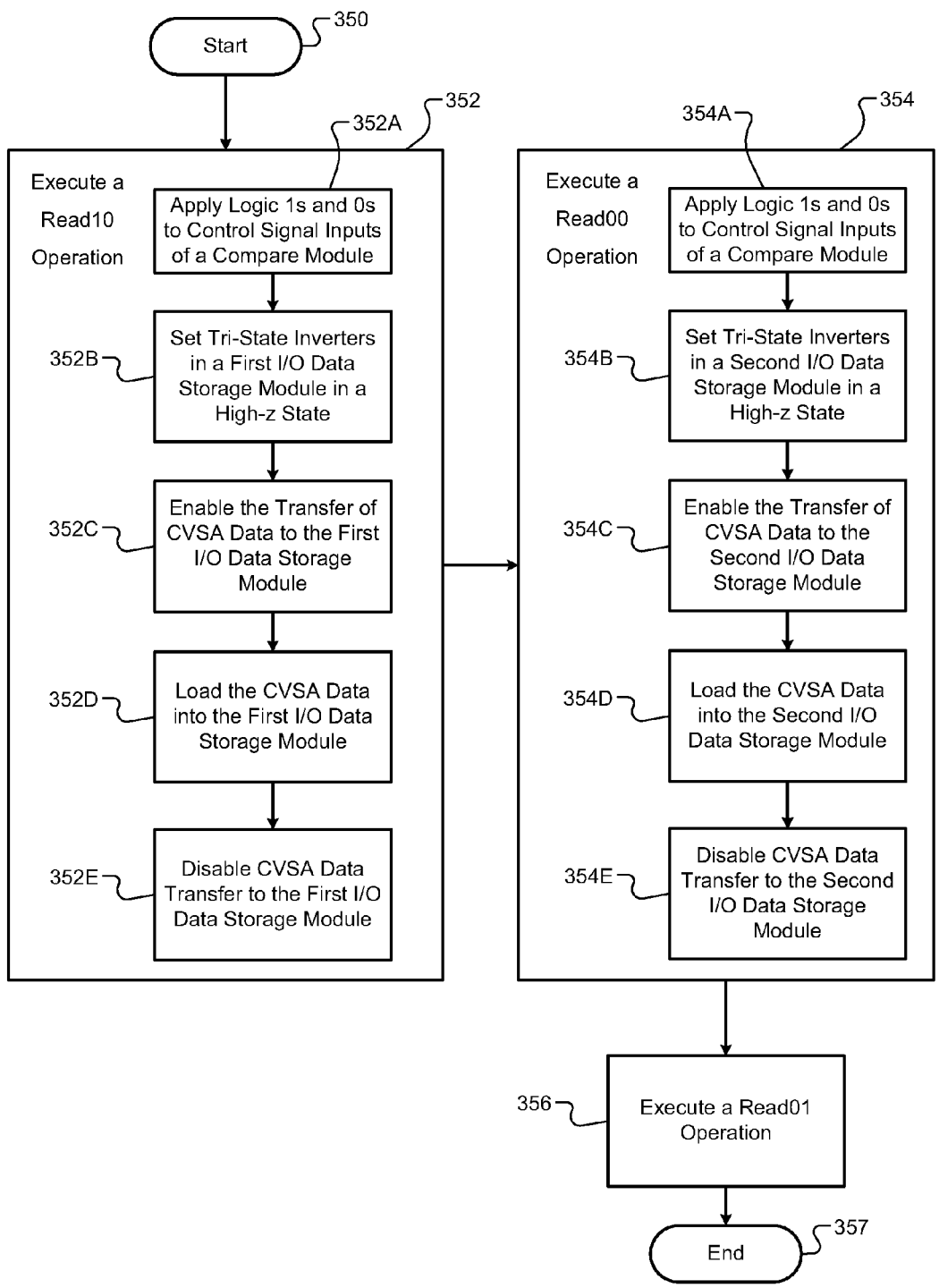
FIG. 8 illustrates a read method incorporating read verification for a multi-level memory cell according to an embodiment of the present disclosure.

Referring now also to FIG. 8, a read method incorporating read verification for a multi-level memory cell is shown. The method is described according to the Vt distribution of FIG. 7. The method is also described with respect to performing a read from a high Vt sub-distribution state to a low Vt sub-distribution state along a read/verify direction, shown by arrow 340. The method is described with respect to the multi-bit sensing and control module 52 of FIG. 3 and with respect to the control and storage modules 58 and 120 of FIGS. 3 and 5. The method may be modified for other operations and control and storage modules described herein. The method may begin at step 350.

In step 352, a read10 operation is executed, where the CVSA 62 outputs a "1" (logic 1) when the corresponding memory cell Vt level is above the read 10 level. The CVSA 62 outputs a "0" (logic 0) when the cell Vt level is below the read 10 level.

In step 352A, a "1" is applied to the control signal input W1 and a "0" is applied to the control signal input W0. A "0" is applied to the control signal input W1' and a "1" is applied to the control signal input W0'. In step 352B, the tri-state inverters 150, 152 in the first I/O data storage module 122 are set in a high-z state. In step 352C, the transistor M19 is turned ON. Steps 352A and C allow the CVSA data to be transferred to the first I/O data storage module 122 through the transistors M19, M7, and M11.

In step 352D, the CVSA data is loaded into the first I/O data storage module 122. After the transistors M19, M7, and M11 are turned ON, the second tri-state inverter 152 is turned ON first, and this is followed by turning ON the first tri-state inverter 150. Each of the tri-state inverters 150-156 and 250-256 of the modules 122, 124, 136, 138 are set to the high-z state when data is loaded into the I/O data storage modules 122, 124 and into the handling modules 136, 138. The storage modules 122, 124 and the handling modules 136, 138 perform as latches.

In each of the modules 122, 124, 136, 138, the tri-state inverter with an input that is driven is turned ON first. Input signals drive one of the respective inputs 158-164 and 258-264 of each of the tri-state inverters 150-156 and 250-256. The other tri-state inverter of each of the modules 122, 124, 136, 138 is turned ON second. This way, the data can be loaded and latched reliably. For example, the first handling module 300 includes the tri-state inverters 250, 252. The input 260 of the second tri-state inverter 252 may be driven by a data signal received from the transistor M24 or a HIGH potential. The input 258 of the first tri-state inverter 250 receives output of the second tri-state inverter 252 and may not be driven by another signal. As such, the second tri-state inverter 252 is turned ON before the first tri-state inverter 250. In step 352E, after the data is latched, M19 is turned OFF.

In step 354, a read00 operation is executed. The CVSA 62 outputs "1" if the cell Vt level is above the read00 level and outputs "0" if the cell Vt level is below the read00 level. The CVSA output during this step is the MSB. The CVSA output is transferred to the second I/O data storage module 124.

In step 354A, a logic zero is provided to both of the control signal inputs W1 and W0, and the transistor M19 is turned ON. This allows CVSA data to be passed through the transistors M19, M6, and M12. In step 354B, the tri-state inverters 154, 156 are set at the high-z state.

In step 354C, the transistor M19 is turned ON. Steps 354A and 354C allow the CVSA data to be transferred to the second I/O data storage module 124 through the transistors M19, M6, and M12.

In step 354D, data is loaded into the second I/O data storage module 124. After the transistors M19, M6, and M12 are turned ON, the tri-state inverter 156 is turned ON before the tri-state inverter 154. This allows the CVSA data to be securely latched into the second I/O data storage module 124. In step 354E, after the data is latched, M19 is turned OFF.

In step 356, a read01 operation is executed similar to the read10 and read00 operations except a logic 0 is applied to the control signal input W1 and a 1 is applied to the control signal input W0. The CVSA 62 outputs a 1 when the cell Vt level is above the read01 level, and a 0 when the cell Vt level is below the read01 level. The method may end at 357.

In the description above, the read sequence starts at read10 and then performs read00 followed by read01. Such sequence and its description are given by way of example, the read operations may be performed in a different order and other reading sequences may be performed.

Figure 9:
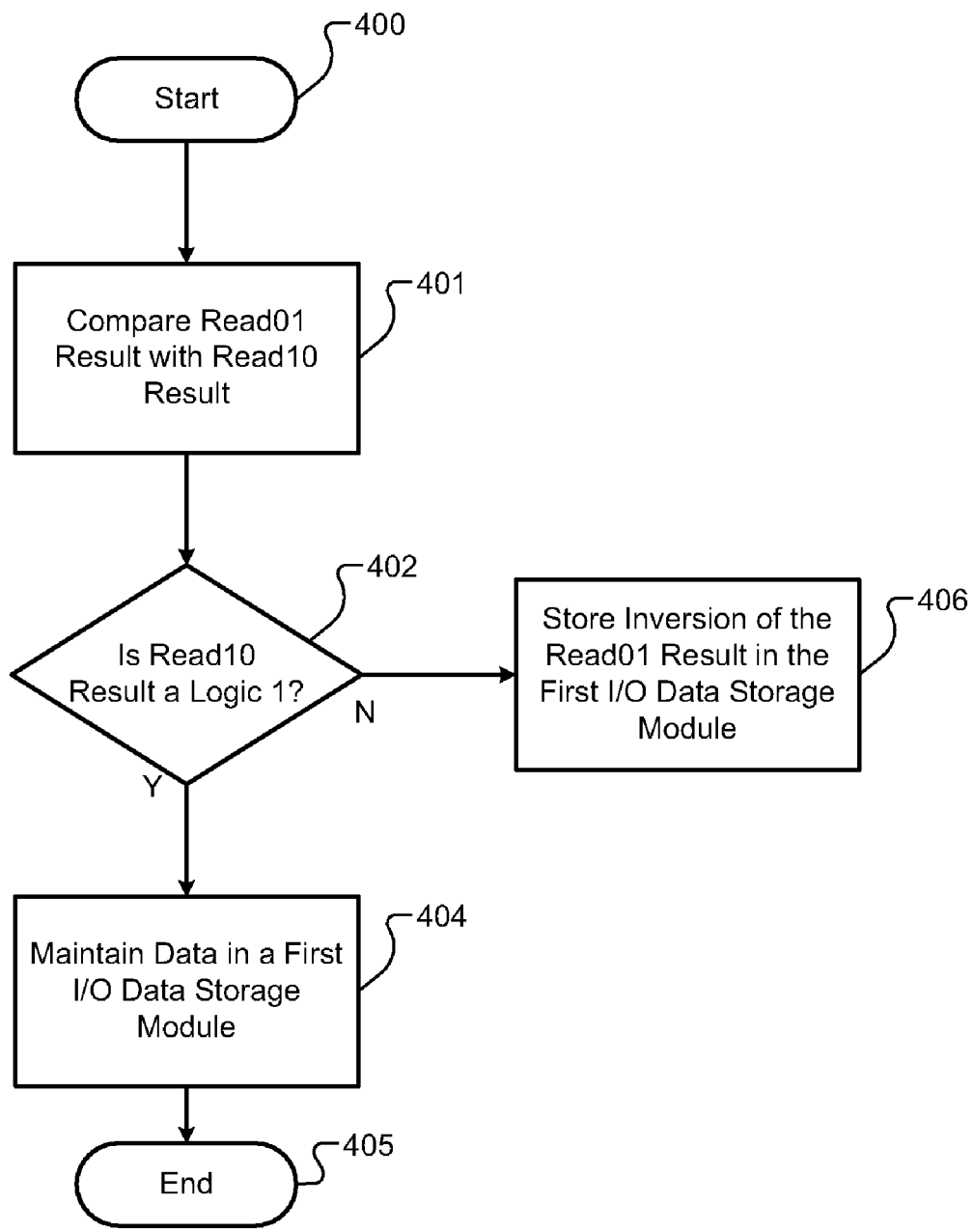
FIG. 9 illustrates a least significant bit recovery method according to an embodiment of the present disclosure.

Referring now to FIG. 9, a LSB recovery method is shown. For the four example Vt sub-distributions of FIG. 7 from low to high, the read01 operation may output 0111, although the correct LSB data is 1001. A LSB recovery method to recover the correct LSB data from the output of the read01 operation is described below. The LSB is recovered by maintaining the right most bit of the 0111 output at 1 while inversing the respective logic state of the other three bits. The method may begin at step 400.

In step 401, the output result of the read01 operation of step 356 is compared with the output result of the read10 operation of step 352. In step 402, when the output result of the read10 operation is 1 then the data stored or maintained as a result of the read10 operation, which is stored in the first I/O data storage module 122, is maintained.

In step 406, when the output result of the read10 operation is not 1 the inversion of the data stored or maintained as a result of the read01 operation may be transferred to and stored in the first I/O data storage module 122. Thus, for the four Vt sub-distributions from low to high, the LSB recovery method yields the data in the first I/O data storage module 122 to the correct values (in this example 1001). The method may end at 405.

The LSB recovery method may include sample-and-hold and compare functions. For example, the transistor M5 may be turned ON, a logic 0 may be applied to W1, and a logic 1 may be applied to W0 to turn ON transistors M8 and M9. Transistors M19 and M20 are turned ON to ground the source of the transistor M10. This way, the inverse of bit 0, which is stored in the first I/O data storage module 122 is passed to and sampled by the gate of the transistor M10.

The transistor M5 is then turned OFF to hold the stored information on the transistor M10 gate. When the stored bit 0 from the read10 operation is 1, which means the inverse of bit 0 is 0, then the transistor M10 is OFF and CVSA data is not transferred to the first I/O data storage module 122. When the stored bit 0 is not 1, then the transistor M10 remains ON and the CVSA data is transferred to the first I/O data storage module 122. This means the inversion of the result of the read01 operation is stored in the first I/O data storage module 122.

During this transfer, boot-strapping on the gate of the transistor M10 minimizes and/or eliminates any voltage loss that may occur between the source and the drain of the transistor M10. A capacitance (capacitor) may be incorporated between the source and a supply rail voltage and/or the drain of the transistor M10. After the above operation, the correct data is stored in the storage modules 122, 124, and is ready to be accessed via the data path and I/O module 54.

Figure 10:
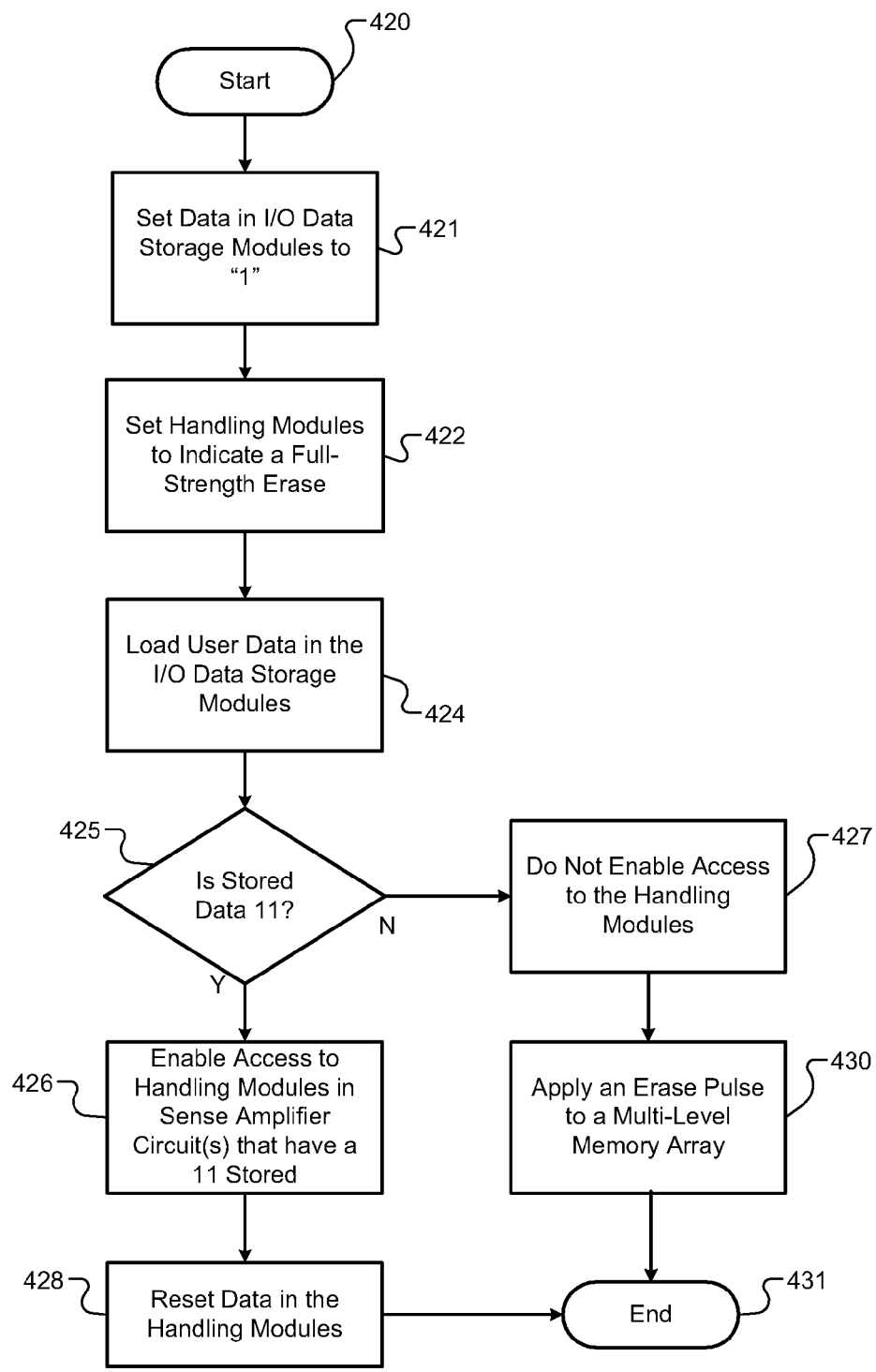
FIG. 10 illustrates an erase method according to an embodiment of the present disclosure.

Referring now to FIG. 10, a method of performing an erase operation is shown. In this provided example method, it may be assumed that initially each memory cell in a multi-level memory array is programmed to the 11 distribution of FIG. 7. In other words, it is assumed that each memory cell is initially at a default voltage state corresponding to the Vt sub-distribution 11. The method may begin at step 420.

In step 421, data in both of the first and second I/O data storage modules 122, 124 is set to 1, i.e., the bit 0 and bit 1 target data is set to 11, using the output control module 126 and the global control module 128.

In step 422, the handling modules 136, 138 are set to indicate that one or more sense amplifier module(s), such as the sense amplifier module 60, are to execute a full-strength erase for a next erase pulse or processing pulse. Indication bits of data may be stored in the handling modules 136, 138 and indicate that a full-strength operation or a partial-strength operation is to be performed. A logic 1 is applied to the control signal inputs W0 and W1. The transistors M17 and M18 are turned ON. When multiple cells are erased and/or when multiple cells associated with different bit lines are erased, the transistors M17 and M18 of multiple sense amplifier circuit(s) may be turned ON. At the same time or during the same time period, the transistors M20, M24, and M26 are turned ON to set the data in the handling modules 136, 138. Setting the data in the handling modules indicates that the sense amplifier circuit(s) are to execute a full-strength erase for a next erase pulse or processing pulse.

In step 424, user data received from the data path and I/O module 54 is loaded into each tri-state inverter of the I/O data storage modules 122, 124. This is performed using the transistors M1-M4 of the corresponding sense amplifier circuit(s). The user data may be represented by one of the four Vt sub-distributions 11, 10, 00, and 01.

Subsequent to step 424 a sequence of steps to identify and verify the sense amplifier circuit(s) that are to execute the erase operation are performed. In step 425, control determines whether the data stored in the sense amplifier circuit(s) is 11, which has a predetermined voltage distribution level.

In step 426, a logic 1 is applied to the control signal inputs W0 and W1, which selectively turn ON the transistors M17 and M18. The transistors M17 and M18 are selectively turned ON in the sense amplifier circuit(s) that have data 11 in the I/O data storage modules 122, 124 because of the XNOR function of the compare module 130. This enables access to the handling modules 136, 138. In step 427, the transistors M17 and M18 in the sense amplifier circuit(s) that have other data types and are maintained in an OFF state.

In step 428, the transistors M20, M25, and M27 are turned ON to reset data in the handling modules 136, 138 for the sense amplifier circuit(s) with data 11. This indicates that the sense amplifier module(s), such as the sense amplifier module 60, are not to execute an erase for the next erase pulse or processing pulse. This is performed because the cells with target data 11 have Vt levels that are at the Vt sub-distribution level 11. For this reason, the voltage levels of the cells are not further altered. Put another way, since the cells are at the correct Vt sub-distribution level, an erase function or an additional erase function is not performed. This erase information may be provided to the main control module, such as via the outputs 300 and 302.

In step 430, an erase pulse or processing pulse that has a proper voltage is applied to the multi-level memory array via the sense amplifier module(s) that are to execute an erase, such as the sense amplifier module 60. The processing pulse has a corresponding voltage, which depends on whether a full-strength or partial strength erase is performed. The processing pulse may be initiated via the main control module 90. This may be performed using non-volatile memory or flash memory erase operations, which may include Fowler-Nordheim (FN) tunneling. The method may end at 431.

Figure 11A:
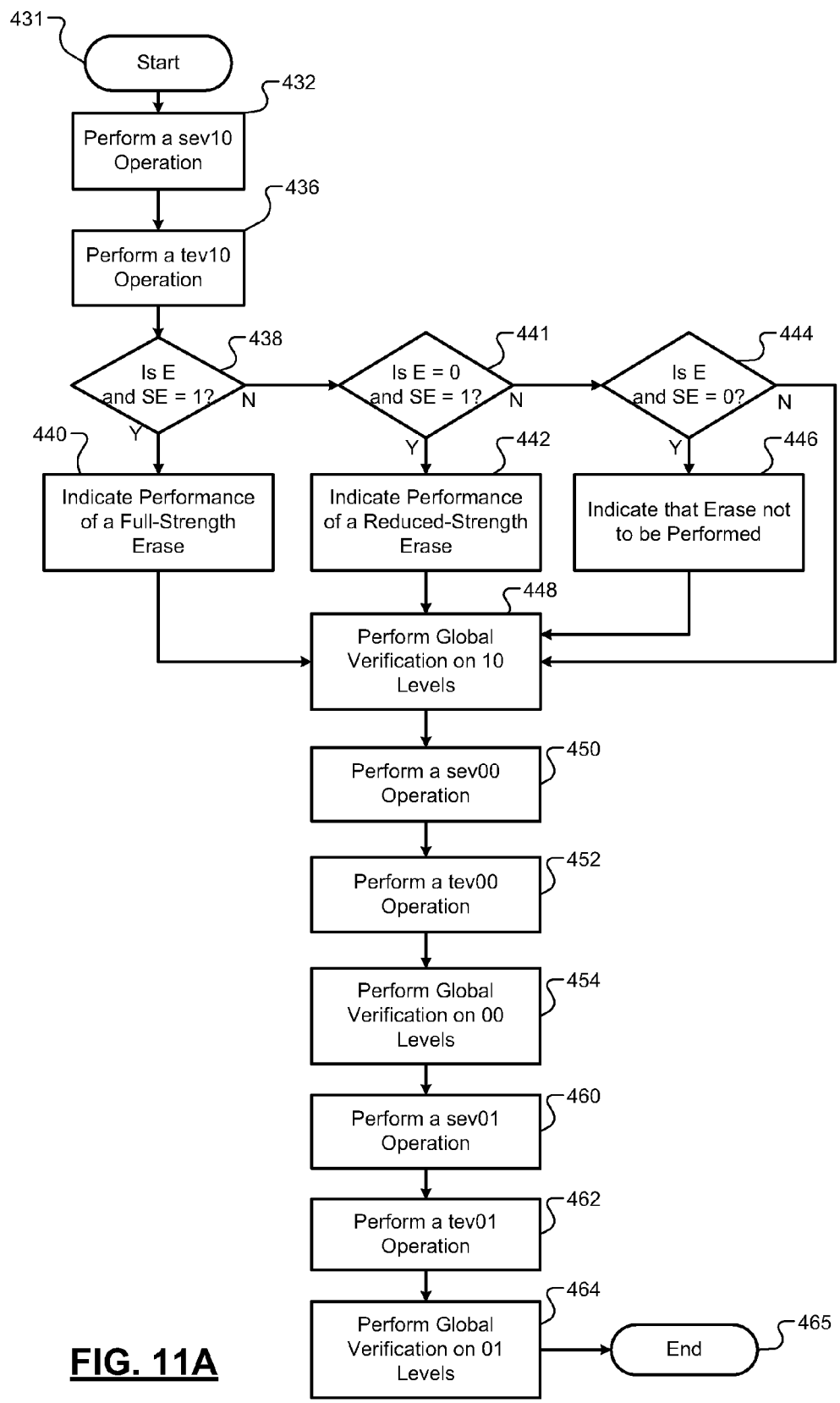
FIG. 11A illustrates a method of performing erase verification according to an embodiment of the present disclosure.
Figure 11B:
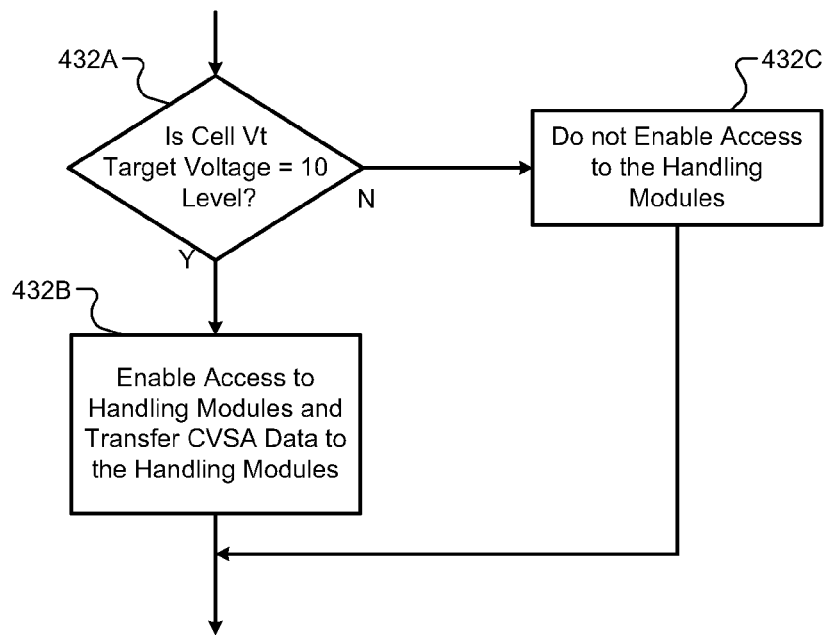
FIG. 11B illustrates a soft-erase-verify operation for the method of FIG. 11A.
Figure 11C:
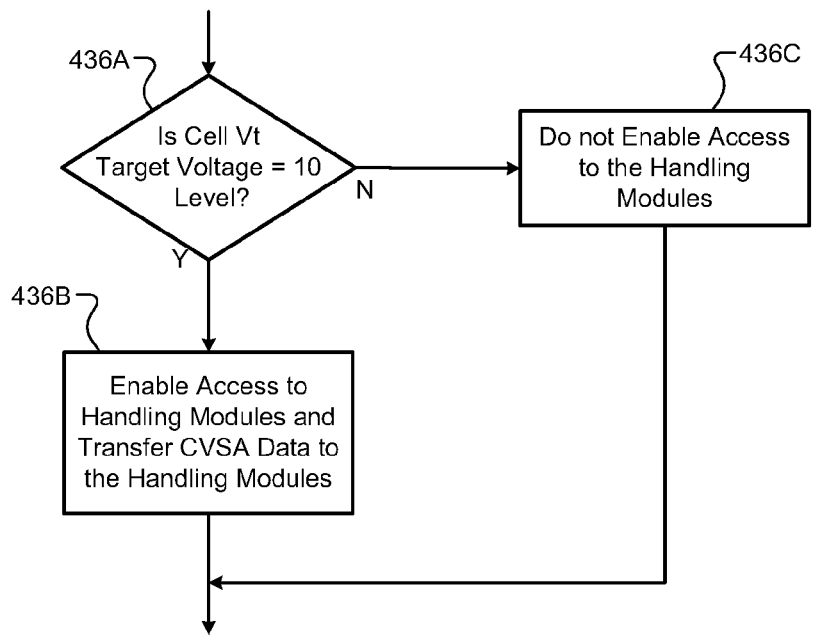
FIG. 11C illustrates a target-erase-verify operation for the method of FIG. 11A.

Referring now to FIGS. 11A-C, a method of performing erase-verify operation is shown. The method is described according to the Vt distribution of FIG. 7. The method may begin at step 431.

In step 432, the erase-verify operation may be started from a soft-erase-verify operation sev10. The voltage level of the soft-erase-verify operation sev10 (sev10 level) may be set at a level between cell Vt sub-distribution 11 and cell Vt sub-distribution 10. In step 432A, the sense amplifier module 60 compares the cell Vt level to the sev10 level. For the sev10 operation, the CVSA 62 outputs a logic 1 when the cell Vt level is greater than the sev10 level. The CVSA 62 outputs a logic 0 when the cell Vt level is less than the sev10 level.

In step 432B, a logic 1 is applied to the control signal input W1 and a logic 0 is applied to the control signal input W0 to turn ON the transistors M17 and M18 for the sense amplifier circuit(s) having data 10. This enables access to the handling modules 136, 138. At the same time or during the same time period, the transistors M25 and M27 are turned ON to transfer a CVSA output to the handling modules 136, 138. A logic 1 output of the CVSA 62 corresponds to a full-strength erase for the next processing pulse. A logic 0 output of the CVSA 62 corresponds to either a reduced-strength erase operation for the next processing pulse or to an indication that an erase operation is not to be performed. In step 432C, the transistors M17 and M18 are maintained in an OFF state. This disables access to the handling modules 136, 138.

In step 436, the soft-erase-verify operation sev10 may be followed by a target-erase-verify operation tev10 (tev10 level) to determine whether a reduced-strength erase or no-erase operation should be performed to obtain a target cell state. The voltage level associated with the target-erase-verify operation tev10 is set at approximately the highest Vt level of the Vt sub-distribution 10.

In step 436A, for the target-erase-verify operation tev10, control compares the cell Vt level to the tev10 level. The CVSA 62 outputs a logic 1 when the cell Vt level is greater than the tev10 level. The CVSA 62 outputs a logic 0 when the cell Vt level is less than the target-erase-verify operation tev10 level. In step 436B, a logic 1 is applied to W1 and a logic 0 is applied to W0 for the target-erase-verify tev10 operation. At the same time or during the same time period, the transistor M27 is turned ON to transfer the output of the CVSA 62 from the target-erase-verify operation tev10 to second handling module 138. In step 436C, access to the handling modules 136, 138 is not enabled. In step 438, control determines whether a full-strength erase is to be performed.

In step 440, when the results of steps 432 and 436 are a logic 1 at both terminals E and SE, then the control and storage module 120 indicates a full-strength erase for the next erase pulse or processing pulse.

In step 441, control determines whether a reduced-strength erase is to be performed. In step 442, when the result of step 444 is a logic 0 at terminal E and a logic 1 at terminal SE, then a reduced-strength erase is set to be performed for the next erase pulse or processing pulse.

In step 444, control determines whether an erase is not to be performed. In step 446, when the results of steps 432 and 436 is a logic 0 at both terminals E and SE, then an erase is not performed, otherwise control may proceed to step 448.

When a logic 1 is applied to the control signal input W1 and a logic 0 is applied to the control signal input W0, the above operations on the handling modules 136, 138 affects the sense amplifier circuit(s) with data 10. The operations do not affect the sense amplifier circuit(s) with other data values. After steps 440, 442 and 446, a global verification may be performed on the 10 levels in step 448. An example of a global verification on 10 levels is described with respect to the embodiment of FIG. 12. At the end of steps 436-446 and/or after the global verification, the state of all the memory cells that are targeting at 10 is fully determined.

In step 450, a soft-erase-verify operation sev00 may be executed based on the results of step 448. The soft-erase-verify operation sev00 is performed similar to the soft-eraseverify operation sev10, except that a logic 0 is applied to both of the control signal inputs W1 and W0. Step 432 may be repeated to perform the soft-erase-verify operation sev00 with the logic 0 applied to the control signal inputs W1 and W0. This ensures that the handling modules that are targeting data 00 are affected and that the handling modules that are not targeting data 00 are not affected by the soft-erase-verify operation sev00.

In step 452, a target-erase-verify operation tev00 is executed, which is similar to the target-erase-verify operation tev10 described above. Steps 436-446 may be repeated except that a logic 0 is applied to both of the control signal inputs W1 and W0 instead of a logic 1 in step 436.

In step 454, a global verification on 00 levels may be executed. This is similar to step 448 above except that a logic 0 is applied to both of the control signal inputs W1 and W0 during step 500 of FIG. 12.

In step 460, a soft-erase-verify operation sev01 may be executed based on the results of step 454. The soft-erase-verify operation sev01 is performed similar to the soft-erase-verify operation sev10, except that a logic 0 is applied to the control signal input W1 and a logic 1 is applied to the control signal input W0. Step 432 may be repeated to perform the soft-erase-verify operation sev01 with the logic 0 applied to the control signal input W1 and the logic 1 applied to the control signal input W0. This ensures that the handling modules that are targeting data 01 are affected and that the handling modules that are not targeting data 01 are not affected by the soft-erase-verify operation sev01.

In step 462, a target-erase-verify operation tev01 is executed, which is similar to the target-erase-verify operation tev10 described above. Steps 436-446 may be repeated except that a logic 0 is applied to the control signal input W1 and a logic 1 is applied to the control signal input W0 in step 436.

In step 464, a global verification on 01 levels may be executed. This is similar to step 448 above except that a logic 0 is applied to the control signal input W1 and a logic 1 is applied to the control signal input W0 during step 500 of FIG. 12. The method may end at 465.

The above soft-erase-verify and target-erase-verify operations sev10, tev10, sev00, tev00, sev01, and tev01 may be followed by one erase pulse or processing pulse. After the processing pulse the respective operations (i.e. operations sev10, tev10, sev00, tev00, sev01, tev01) for verifying the corresponding result may be performed. Such processing pulse and verification continues in iteration until passing their respective global verification.

When a memory cell is uniform and an over-erase can be controlled, then the operations sev00, tev00, sev01, and tev01 may not be executed after several initial pulses. The operations sev00 and tev00 may be executed after the 10 level global verification passes and may not be executed before the 10 level global verification passes. The operations sev01 and tev01 may be executed after the 00 level global verification passes and may not before the 00 level global verification passes.

For defected sense amplifier circuit(s) or bit lines that are replaced by redundancy, a 11 is loaded into the corresponding sense amplifier circuit(s) when the user data is loaded. As a result, during the operations spv10, tpv10, spv00, tpv00, spv01, and tpv01, the access to the handling modules 136 and 138 is disabled due to the XNOR function. This prevents the defected sense amplifier circuit(s) from participating in erase and erase verification operations.

Figure 12:
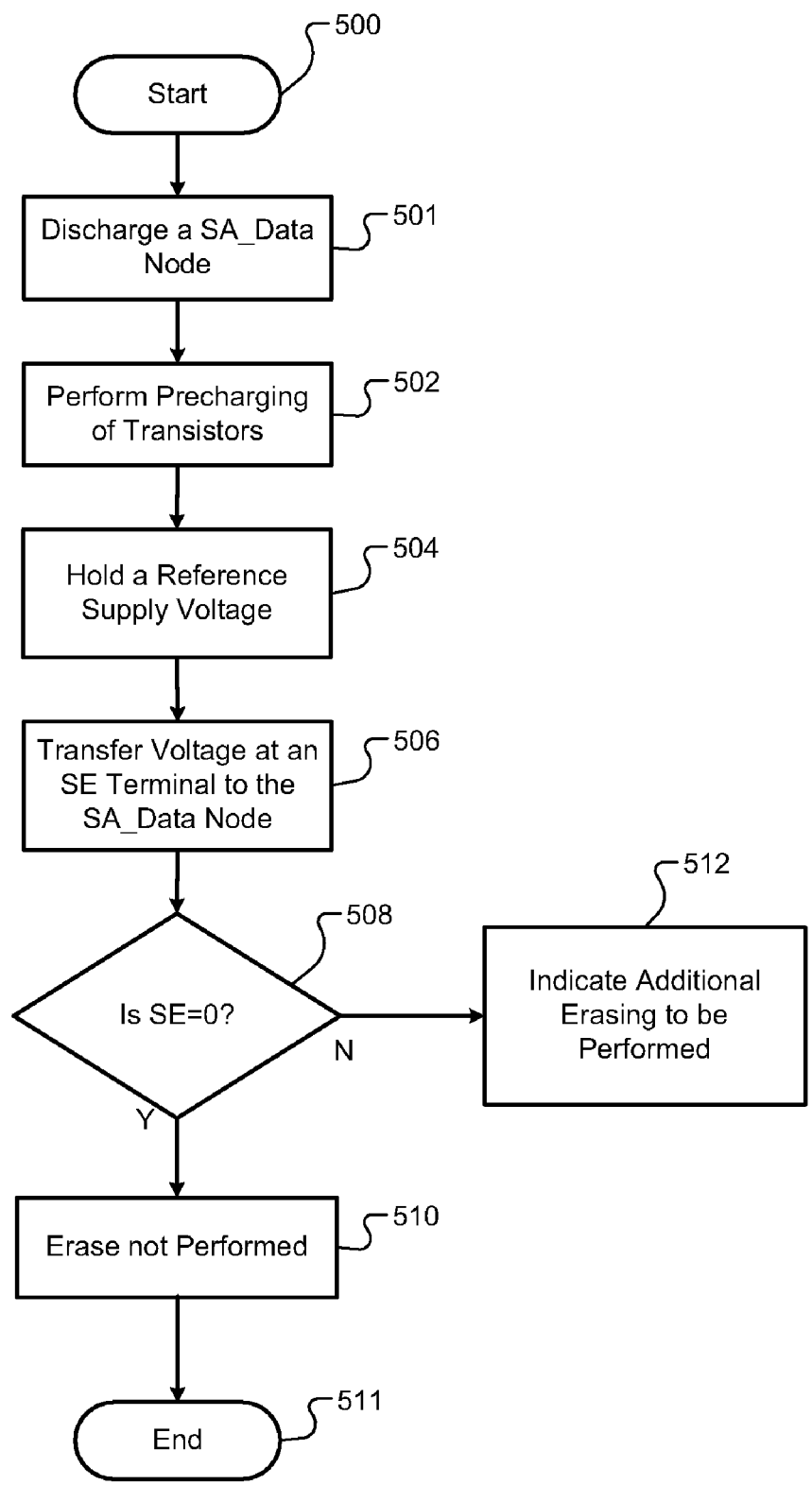
FIG. 12 illustrates a method of performing erase global verification according to an embodiment of the present disclosure.

Referring now to FIG. 12, a method of performing erase global verification is shown. The method is described according to the Vt distribution of FIG. 7. The global verification is used to check whether an additional erase should be performed or in other words whether erasing is complete and no more erasing is to be performed.

When the global verification yields a true (i.e. erasing is done), then from the next erase pulse or processing pulse, the soft-erase-verify operation sev10 and/or the target-erase-verify operation tev10 are not performed. When the global verification yields a false, the soft-erase-verify operation sev10 and/or the target-erase-verify operation tev10 may be performed to ensure that the cell Vt levels are within a targeted distribution.

The method may begin at step 500. In step 501, the output of the CVSA 62 is set to a high-z state and the transistor M20 is turned ON. A logic 1 is applied to the control signal input W1 and a logic 0 is applied to the control signal input W0 at the same time or during the same time period. This discharges the gate of the transistor M21, which may be referred to as a SA_data node, to a reference voltage or ground.

In step 502, the gate of the transistor M22 and the drain of the transistor M21 are precharged to the reference supply voltage Vdd through the transistor M23. In step 504, the transistor M23 is turned OFF to hold the reference supply voltage Vdd in the transistors M22 and M21.

In step 506, the transistor M27 is turned ON to transfer voltage at the terminal SE to the SA_data node. In step 508, control determines whether the SE terminals of the sense amplifier circuit(s) targeting 10 are at a logic 0 level.

In step 510, when the SE terminals of the sense amplifier circuit(s) targeting 10 is at a logic 0 level, then the transistor M21 remains OFF and the gate of transistor M22 remains in a HIGH state or at a logic 1. An additional erase is not performed on the cells targeting at 10 and an erase verify at the 10 level is passed. In step 512, the gate of the transistor M22 is discharged to ground, which indicates that more erasing is to be performed for the cells targeting at 10. The method may end at 511.

Program verification can be done in a similar way as described for the erase verification. An example program verification is described with respect to the embodiment of FIG. 13. The program-verification for the Vt distribution of various levels is shown in FIG. 7 for soft-program-verify and target-program-verify operations spv00, tpv00, spv10, tpv10, spv11, and tpv11. Also before a program operation is performed, the memory cells are programmed to or have a voltage that corresponds to the Vt sub-distribution 01 for an initial state. The memory cell voltages are programmed using the user data as the target. For the targets 00, 10, and 11, corresponding control signals are applied to the control signal inputs W1 and W0 during verification operations of each target state.

Figure 13A:
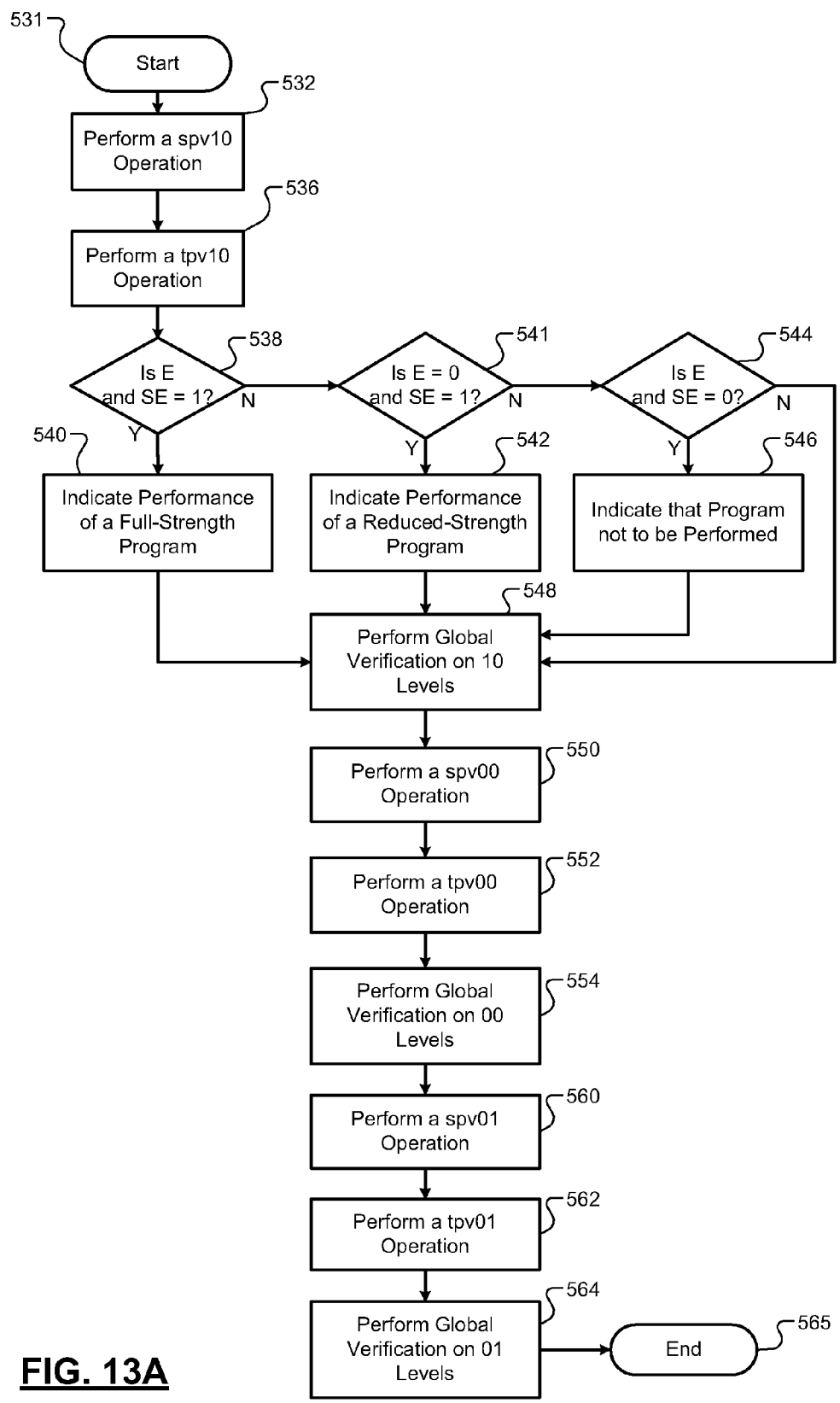
FIG. 13A illustrates a method for programming incorporating program verification according to an embodiment of the present disclosure.
Figure 13B:
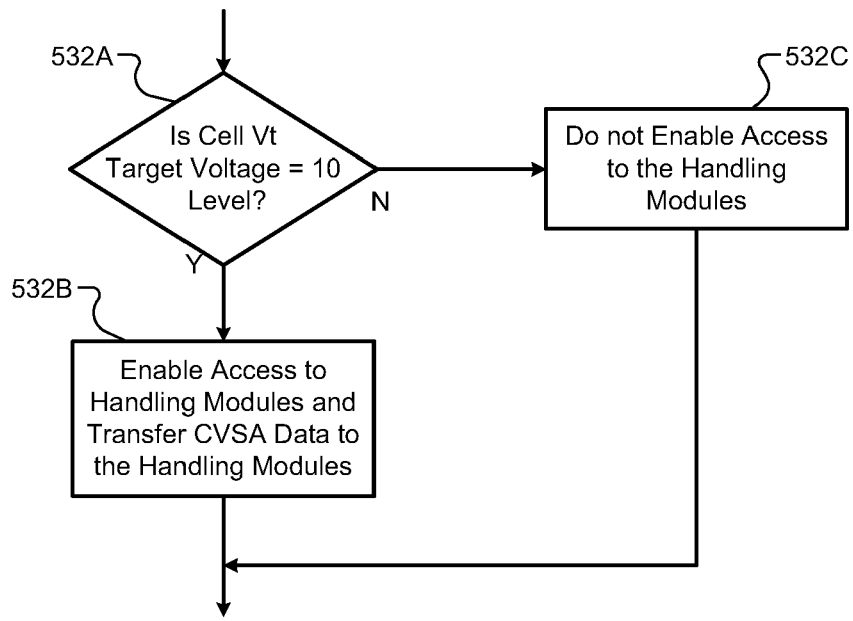
FIG. 13B illustrates a soft-program-verify operation for the method of FIG. 13A.
Figure 13C:
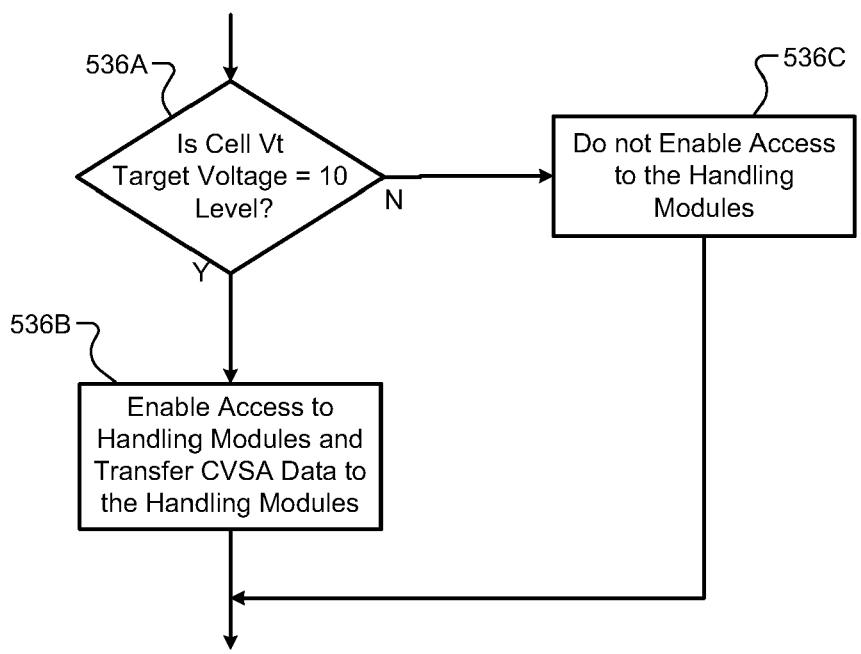
FIG. 13C illustrates a target-program-verify operation for the method of FIG. 12A.

Referring now to FIGS. 13A-C, a method for programming incorporating program verification is shown. The method is described according to the Vt distribution of FIG. 7. The method may begin at step 530. In the following steps 10 operations are performed followed by 00 operations and then yet followed by 01 operations. The sequence of these operations may be performed in the opposite direction (01, 00, 10) or in some other order.

In step 532, a program-verify operation may be started from a soft-program-verify operation spv10. The voltage level of the soft-program-verify operation spv10 (spv10 level) may be set at a level between Vt sub-distribution 11 and Vt sub-distribution 10. In step 532A, the sense amplifier module 60 compares the cell Vt level to the spv10 level. For the soft-program-verify spv10 operation, the CVSA 62 outputs a logic 1 when the cell Vt level is greater than the spv10 level. The CVSA 62 outputs a logic 0 when the cell Vt level is less than the spv10 level.

In step 532B, a logic 1 is applied to the control signal input W1 and a logic 0 is applied to the control signal input W0 to turn ON the transistors M17 and M18 for the sense amplifier circuit(s) that have data 10. At the same time or during the same time period, the transistors M25 and M27 are turned ON to transfer a CVSA output to the handling modules 136, 138. A logic 1 output of the CVSA 62 corresponds to a full-strength program for the next processing pulse. A logic 0 output of the CVSA 62 corresponds to either a reduced-strength program for the next processing pulse or to an indication that a program operation is not to be performed. In step 532C, the transistors M17 and M18 are maintained in an OFF state. This enables access to the handling modules 136, 138.

In step 536, the soft-program-verify operation spv10 may be followed by a target-program-verify operation tpv10 (tpv10 level) to determine whether a reduced-strength program operation is to be performed or whether a program operation is not to be performed. The voltage level associated with the target-program-verify operation tpv10 is set at approximately the highest Vt level of the Vt 10 distribution.

In step 536A, for the target-program-verify operation tpv10, control compares the cell Vt level to the tpv10 level. The CVSA 62 outputs a logic 1 when the cell Vt level is greater than the tpv10 level. The CVSA 62 outputs a logic 0 when the cell Vt level is less than the tpv10 level.

In step 536B, a logic 1 is applied to W1 and a logic 0 is applied to W0 for the target-program-verify tpv10 operation. At the same time or during the same time period, the transistor M27 is turned ON to transfer the output of the CVSA 62 from the target-program-verify operation tpv10 to the second handling module 138. In step 536C, access to the handling modules 136, 138 is not enabled.

In step 538, control determines whether a full-strength program is to be executed. In step 540, when the results of steps 532 and 536 are a logic 1 at both terminals E and SE, then the control and storage module 120 indicates a full-strength program for the next program pulse or processing pulse. During the next processing pulse a voltage is applied to the multi-level memory array via the sense amplifier module(s) that are to execute a program. The voltage applied depends on whether a full-strength or partial-strength program is performed.

In step 541, control determines whether a reduced-strength erase is to be performed. In step 542, when the result of steps 532 and 536 is a logic 0 at terminal E and a logic 1 at terminal SE, then a reduced-strength program is set to be performed during the next program pulse or processing pulse.

In step 544, control determines whether programming is not to be performed. In step 546, when the results of steps 532 and 536 is a logic 0 at both terminals E and SE, then a program is not performed, otherwise control may proceed to step 548.

When a logic 1 is applied to the control signal input W1 and a logic 0 is applied to the control signal input W0, the above operations on the handling modules 136, 138 affects the sense amplifier circuit(s) with data 10. The operations do not affect the sense amplifier circuit(s) with other data values. After steps 540, 542 and 546 a global verification may be performed on the 10 levels in step 548. An example of a global verification on 10 levels is described with respect to the embodiment of FIG. 12. At the end of steps 536-546 and/or after the global verification, the state of all the memory cells that are targeting at 10 is fully determined.

In step 550, a soft-program-verify operation spv00 may be executed based on the results of step 448. The soft-program-verify operation spv00 is performed similar to the soft-program-verify operation spv10, except that a logic 0 is applied to both of the control signal inputs W1 and W0. Step 532 may be repeated to perform the soft-program-verify operation spv00 with the logic 0 applied to the control signal inputs W1 and W0 in step 532. This ensures that the handling modules that are targeting data 00 are affected and that the handling modules that are not targeting data 00 are not affected by the soft-program-verify operation spv00.

In step 552, a target-program-verify operation tpv00 is executed, which is similar to the target-program-verify operation tpv10 described above. Steps 536-546 may be repeated except that a logic 0 is applied to both of the control signal inputs W1 and W0 instead of a logic 1 in step 536.

In step 554, a global verification on 00 levels may be executed. This is similar to step 548 above except that a logic 0 is applied to both of the control signal inputs W1 and W0 during step 600 of FIG. 12.

In step 560, a soft-program-verify operation spv01 may be executed based on the results of step 454. The soft-program-verify operation spv01 is performed similar to the soft-program-verify operation spv10, except that a logic 0 is applied to the control signal input W1 and a logic 1 is applied to the control signal input W0. Step 532 may be repeated to perform the soft-program-verify operation spv01 with the logic 0 applied to the control signal input W1 and the logic 1 applied to the control signal input W0. This ensures that the handling modules that are targeting data 01 are affected and that the handling modules that are not targeting data 01 are not affected by the soft-program-verify operation spv01.

In step 562, a target-program-verify operation tpv01 is executed, which is similar to the target-erase-verify operation tpv10 described above. Steps 536-546 may be repeated except that a logic 0 is applied to the control signal input W1 and a logic 1 is applied to the control signal input W0 in step 536.

In step 564, a global verification on 01 levels may be executed. This is similar to step 548 above except that a logic 0 is applied to the control signal input W1 and a logic 1 is applied to the control signal input W0 during step 600 of FIG. 12. The method may end at 565.

The above soft-program-verify and target-program-verify operations spv10, tpv10, spv00, tpv00, spv01, and tpv01 may be followed by one program pulse or processing pulse. After the processing pulse the respective operations (i.e. operations spv10, tpv10, spv00, tpv00, spv01, tpv01) for verifying the corresponding result may be performed. Such processing pulse and verification continues in iteration until passing their respective global verification.

When a memory cell is uniform and an over-program can be controlled, then the operations spv00, tpv00, spv01, and tpv01 may not be executed after several initial pulses. The operations spv00 and tpv00 may be executed after the 10 level global verification passes and may not before the 10 level global verification passes. The operations spv01 and tpv01 may be executed after the 00 level global verification passes and may not before the 00 level global verification passes.

For defected sense amplifier circuit(s) or bit lines that are replaced by redundancy, a 11 is loaded into the corresponding sense amplifier circuit(s) when the user data is loaded. As a result, during the operations spv10, tpv10, spv00, tpv00, spv01, and tpv01, the access to the handling modules 136 and 138 is disable due to the XNOR function. This prevents the defected sense amplifier circuit(s) from participating in program and program verification operations.

Figure 14:
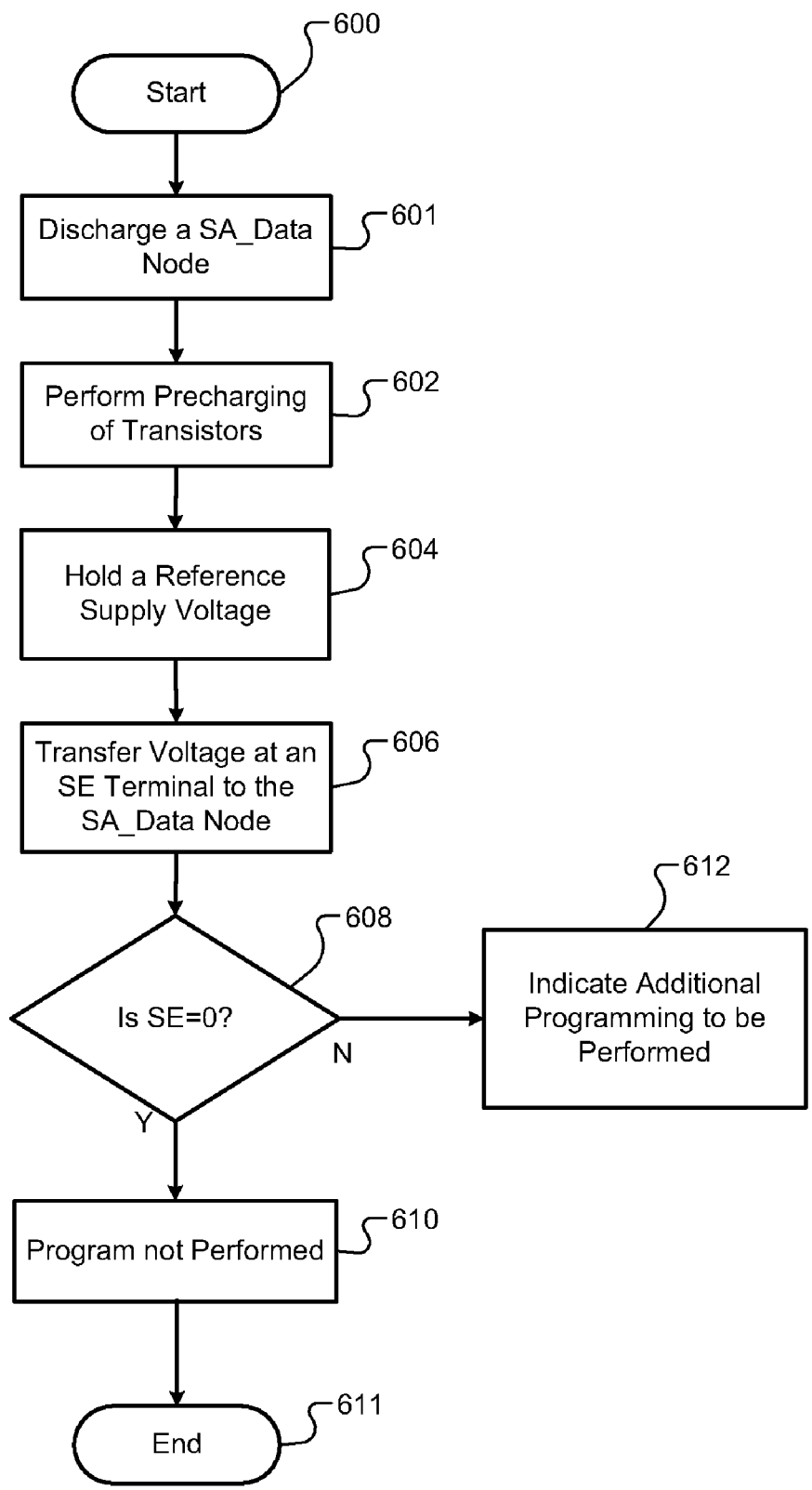
FIG. 14 illustrates a method of performing program global verification according to an embodiment of the present disclosure.

Referring now to FIG. 14, a method of performing program global verification is shown. The method is described according to the Vt distributions of FIG. 7. The program global verification is used to check whether an additional program should be performed or in other words whether programming is complete and no more programming is to be performed.

When the global verification yields a true (i.e. programming is done), then from the next program pulse or processing pulse, the soft-program-verify operation spv10 and/or the target-program-verify operation tpv10 are not performed. When the global verification yields a false, the soft-program-verify operation spv10 and/or the target-program-verify operation tpv10 may be performed to ensure that the cell Vt levels are within a targeted distribution.

The method may begin at step 600. In step 601, the output of the CVSA 62 is set to a high-z state and the transistor M20 is turned ON. A logic 1 is applied to the control signal input W1 and a logic 0 is applied to the control signal input W0 at the same time or during the same time period. This discharges the gate of the transistor M21, to a reference voltage or ground.

In step 602, the gate of the transistor M22 and the drain of the transistor M21 are precharged to the reference supply voltage Vdd through the transistor M23. In step 604, the transistor M23 is turned OFF to hold the reference supply voltage Vdd in the transistors M22 and M21. In step 606, the transistor M27 is turned ON to transfer voltage at the terminal SE to the SA_data node. In step 608, control determines whether the SE terminals of the sense amplifier circuit(s) targeting 10 are at a logic 0 level.

In step 610, when the SE terminals of the sense amplifier circuit(s) targeting 10 are at a logic 0 level, then the transistor M21 remains OFF and the gate of transistor M22 remains in a HIGH state or at a logic 1. Additional programming is not performed on the cells targeting at 10 and a program verify at the 10 level is passed. In step 612, the gate of the transistor M22 is discharged to ground, which indicates that more programming is to be performed for the cells targeting 10. The method may end at 611.

For a silicon process with low leakage, a gate capacitor may be used to store information for a short time, resulting in less device count and smaller layout area. This leads to another implementation of program/erase/verify control and temporary data storage for a non-volatile memory sense amplifier circuit. An example of this implementation is described with respect to the embodiments of FIGS. 15 and 16. Unlike the implementations of FIGS. 4 and 5, the implementations of FIGS. 15 and 16 are used to output one bit of data at a time instead of multiple bits of data at a time.

Figure 15:
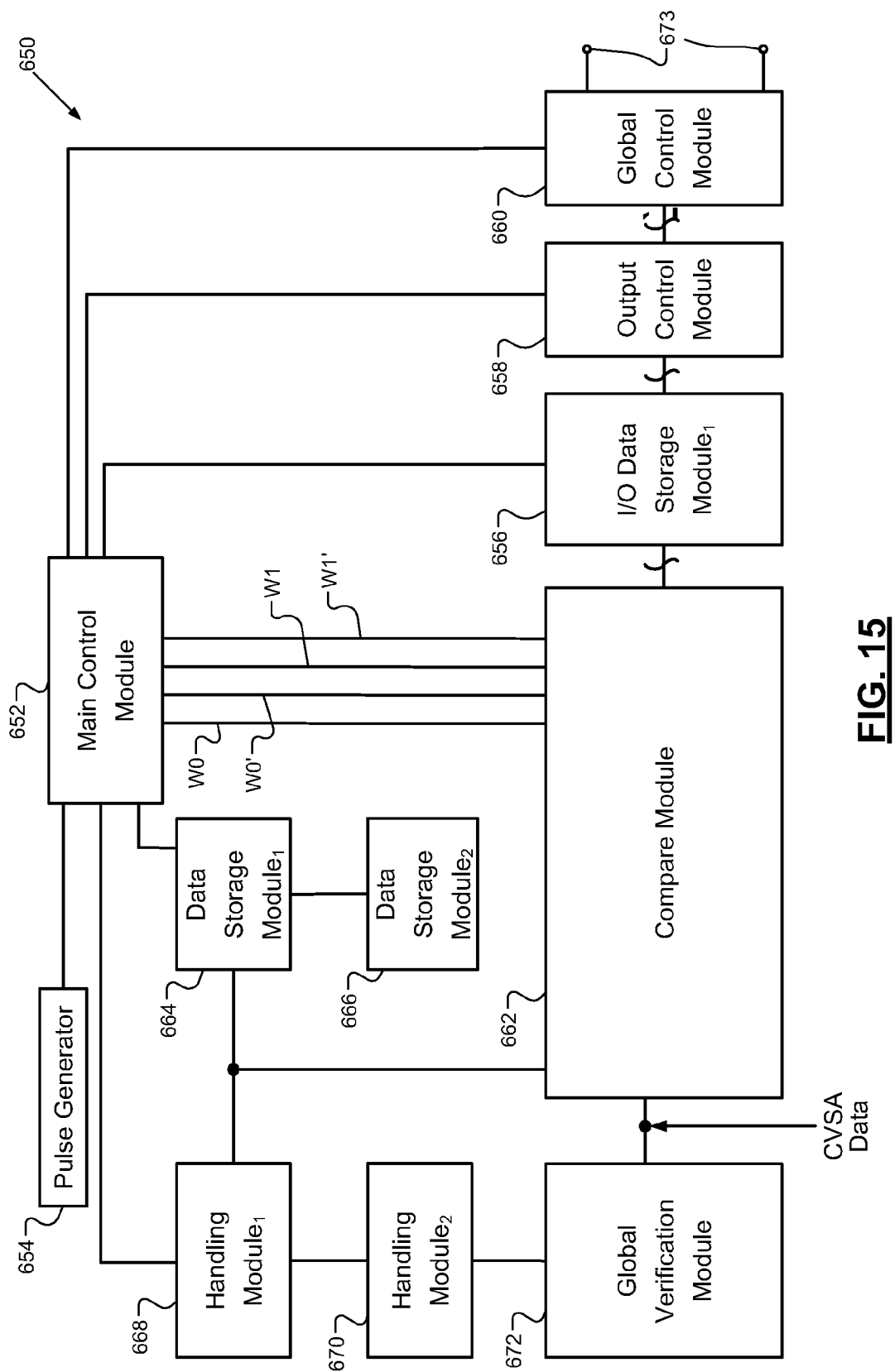
FIG. 15 is a functional block diagram of another control and storage module according to an embodiment of the present disclosure.

Referring now to FIG. 15, a functional block diagram of a control and storage module 650 is shown. The architecture of the control and storage module 650 is shown for a two (2) bit MLC memory. The control and storage module 650 may be applied to other memory with more than 2 bits stored per memory cell. Modifications for memory with more than 2 bits stored per cell are described below. The control and storage module 650 performs program, erase and read operations on multiple bits simultaneously, during the same time period and/or during the same processing cycle.

The control and storage module 650 includes 10 circuit blocks, which may each receive control signals from a main control module 652, which receives a processing pulse signal from a pulse generator 654. The pulse generator 654 may be part of the sense amplifier module 60 of FIG. 3. The main control module 652 may be part of the control and storage module 650, part of the address and control module 18 or the processing module 24 of FIG. 1 or may be a stand alone or separate module. The circuit blocks include: an I/O data storage module 656, an output control module 658, a global control module 660, a compare module 662, a first data storage module 664, a second data storage module 666, a first handling module 668, a second handling module 670, and a global verification module 672.

The I/O data storage module 656 is a latch module for I/O and storage of a bit, such as a first bit (bit 0) and a second bit (bit 1). The output control module 658 includes I/O devices for the bit received by the I/O data storage module 656. The global control module 660 includes global set and reset devices, which may be shared between different sense amplifiers. The global control module 660 provides a bit received by the output control module 658 to a data path and I/O module, such as the data path and I/O module 54 of FIG. 3, via outputs 673. The compare module 662 performs a XNOR function between selected ones of control signal inputs W0, W0', W1 and W1' and the data stored in the I/O data storage module 656.

The data storage modules 664, 666 store bit 0 and bit 1 respectively. The first handling module 668 performs as a latch for the storage of program/erase information for a next or subsequent processing pulse. Put another way, the first handling module 668 indicates whether a full-strength program/erase for the subsequent processing pulse is to be executed. A full-strength program may refer to the programming of both bit 0 and bit 1. A full-strength erase may refer to an erase of both bit 0 and bit 1. A partial-strength program or soft-program may refer to the programming of either bit 0 or bit 1. A partial-strength erase or soft-erase may refer to the erasing of either bit 0 or bit 1.

The second handling module 670 performs as a latch for the storage of soft-program/soft-erase information for a subsequent processing pulse. In other words, the second handling module 670 indicates whether a reduced-strength program/erase for the subsequent processing pulse is to be executed. The global verification module 672 performs a global verification, which may be shared by one or more sense amplifier circuits. Example circuit implementations of the modules 656-672 is shown in FIG. 16.

Figure 16A:
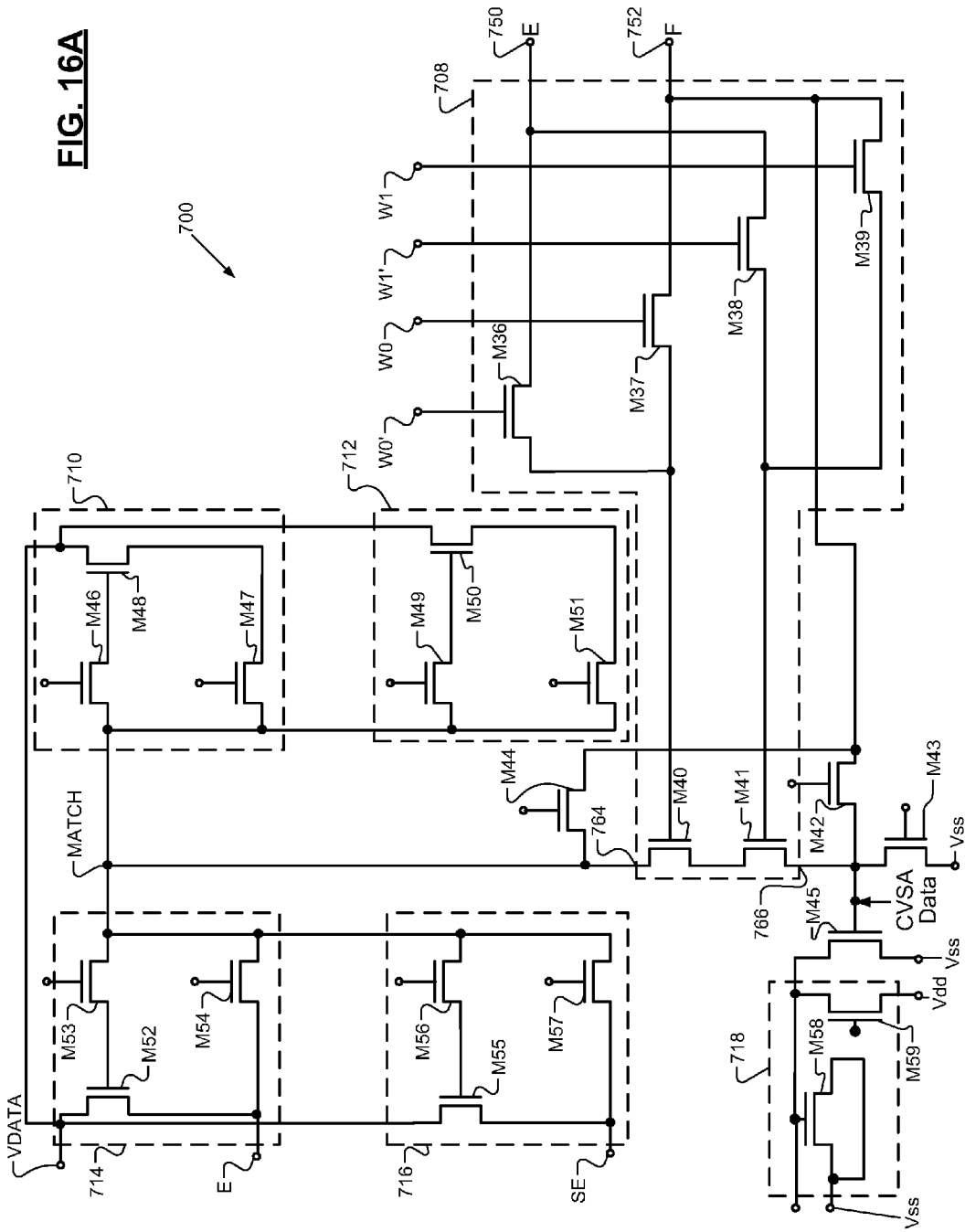
FIG. 16A is a schematic of a first portion of another control and storage module according to an embodiment of the present disclosure.
Figure 16B:
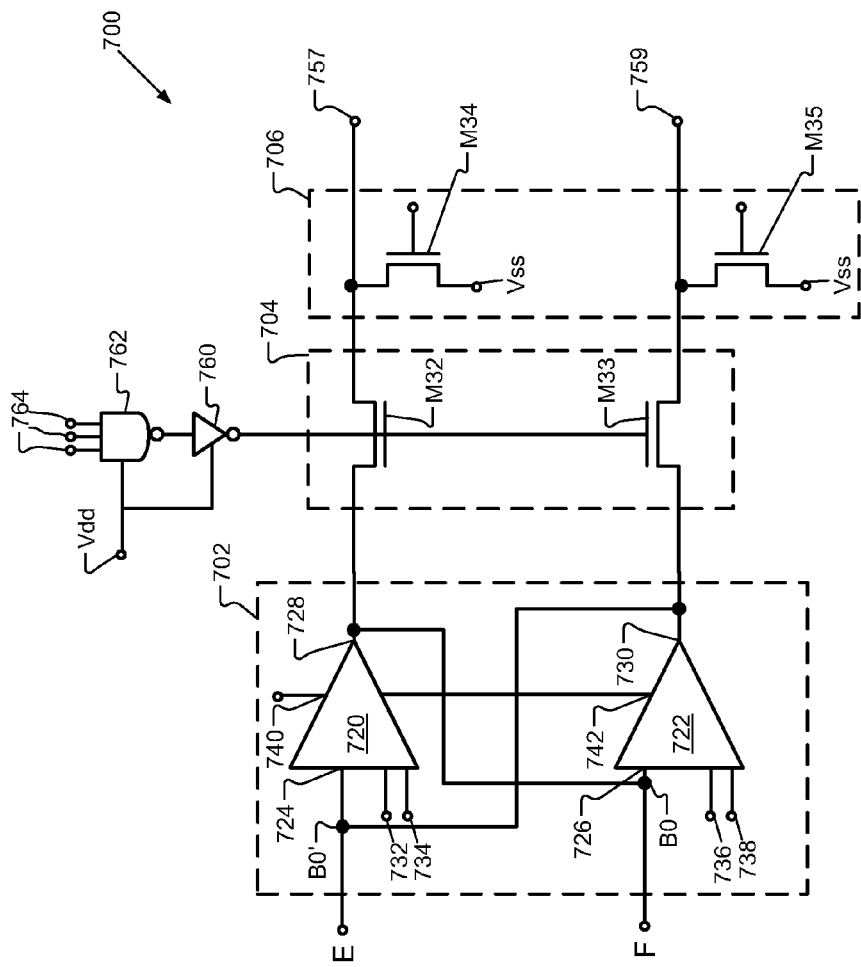
FIG. 16B is a schematic of a second portion of the control and storage module of FIG. 16A.

Referring now to FIGS. 16A and 16B, schematic views of first and second portions of another control and storage module 700 are shown. The control and storage module 700 is provided as an example implementation of the control and storage module 80. The control and storage module 700 includes exemplary circuits for: an I/O data storage module 702, an output control module 704, a global control module 706, a compare module 708, a first data storage module 710, a second data storage module 712, a first handling module 714, a second handling module 716, and a global verification module 718. The modules 702-718 include various transistors that each include respective source, gate and drain terminals. The modules 702-718 also include various control inputs that receive control signals, which may be from a main control module, such as the main control module 652.

In the description below, disclosed transistors remain OFF and signals remain at a zero (0) reference level unless otherwise stated. The transistors are turned ON or activated and/or the signals may be asserted during one of the under-mentioned operations and are deactivated or returned to 0 after completing the operation.

The I/O data storage module 702 includes a first tri-state inverter 720 and a second tri-state inverter 722. The tri-state inverters 720, 722 have respective data inputs 724, 726 and data outputs 728, 730, control inputs 732-738 and voltage supply inputs 740, 742 that receive a supply voltage Vdd. The data inputs 724, 726 are connected to respective data outputs 750, 752 of the compare module 708 and to respective B0 and B0' nodes. The data inputs 724, 726 of the first tri-state inverter 720 are connected to the data outputs 730 of the second tri-state inverters 722. The data output 728 of the first tri-state inverter 720 is connected to the data input 726 of the second tri-state inverter 722.

The output control module 704 includes transistors M32-M33 that are each serially connected to the respective data outputs 728, 730. The gates of the transistors M32-M33 are connected to each other and may receive a control signal from an inverter 760. The inverter 760 may be controlled via a NAND gate 762 that has inputs 764. The NAND gate 762 and the inverter 760 receive the supply voltage Vdd. The sources of the transistors M32-M33 are connected to respective ones of the data outputs 728, 730. The drains of the transistors M32-M33 provide data output signals, which may be provided to a data path and I/O module.

The global control module 706 includes transistors M34-M35. The gates of the transistors M34-M35 may receive control signals from a main control module, such as the main control module 652. The sources of the transistors M34-M35 are connected to respective ones of the drains of the transistors M32-M33 and to respective global control module outputs 757, 759. The drains of the transistors M34-M35 are connected to a voltage reference, such as Vss.

The compare module 708 includes transistors M36-M41. The transistors M36-M39 are serially connected to respective ones of the outputs 750, 752. The compare module 708 has an erase and data storage input 764 that is connected to the source of the transistor M40, which is serially connected to the transistor M41. The compare module 708 has a CVSA data input 766 that is connected to the drain of the transistor M41. The gate of the transistor M40 is connected to the sources of the transistors M36, M37. The gate of the transistor M41 is connected to the sources of the transistors M38, M39. The gates of the transistors M36-M39 receive respective ones of the control signal inputs W0, W0', W1 and W1'. The drains of the transistors M36-M39 are connected to the outputs 750, 752. The drain of the transistor M41 is connected to the source of a transistor M42, to a gate of a transistor M45, and to a CVSA input node. The CVSA input node may be connected to the output of a sense amplifier module, such as the output of the sense amplifier module 60 of FIG. 3. The gate of the transistor M42 receives a control input 770. The drain of the transistor M45 is connected to a voltage reference Vss.

The drain of the transistor M42 is connected to the output 752 and to the drain of the transistor M44. The source of the transistor M43 is connected to the drain of the transistor M41. The gate of the transistor M43 is connected to a control input. The drain of the transistor M43 is connected to a voltage reference Vss. The source of the transistor M44 is connected to the source of the transistor M40. The gate of the transistor M44 receives a control input.

The data storage modules 710, 712 include transistors M46-M51. The sources of the transistor M46, M47, M49, M51 are connected to the source of the transistor M44 and to a MATCH node. The gates of the transistors M46, M47, M49, M51 receive control inputs. The drains of the transistors M46, M49 are connected to respective ones of the gates of the transistors M48, M50. The drains of the transistors M47, M51 are connected to the drains of the transistors M48, M50. The sources of the transistors M48, M50 are connected to each other and to an I/O data node VDATA that may be connected to the main control module 652.

The handling modules 714, 716 include transistors M52-M57. The drains of the transistors M53, M54, M56, M57 are connected to the sources of the transistors M40, M44, M46, M47, M49, M51. The gates of the transistors M46, M47, M49, M51 receive control inputs. The sources of the transistors M53, M56 are connected to the gates of the transistors M52, M55. The sources of the transistors M54, M57 are connected to the drains of the transistors M52, M55. The sources of the transistors M52, M55 are connected to the data node VDATA. The drain of the transistor M52 is connected to a terminal E. The drain of the transistor M55 is connected to a terminal SE. The terminals E, SE provide respectively a full-strength erase signal or a full-strength program signal and a soft-erase signal or a soft-program signal. The terminals E and SE may be connected to an input of a D/A converter, such as the D/A converter 71 of FIG. 3. The capacitances of the gates of the transistors M52, M55, M48, M50 are used to store information similar to the information stored by the tri-state inverters 150-156 of FIG. 5.

The global verification module 718 includes transistors M57 and M59. The gate of the transistor M58 is connected to the sources of the transistors M45 and M58 and receives a control input. The source and drain of the transistor M58 are connected to the reference voltage Vss. The gate of the transistor M59 receives a control input. The drain of the transistor M59 receives the supply voltage Vdd.

Figure 17:
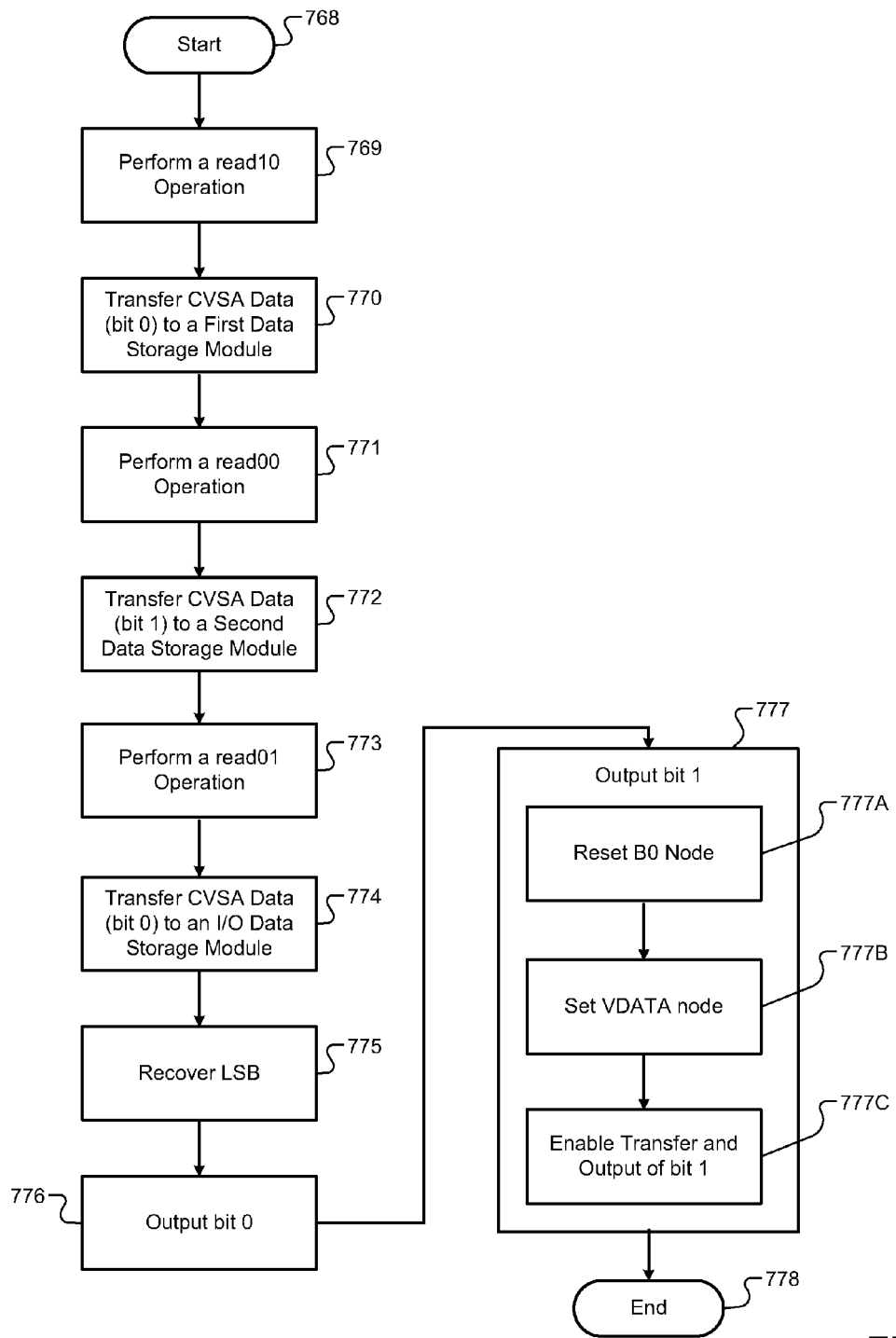
FIG. 17 illustrates a method of performing a read operation according to an embodiment of the present disclosure.

Referring now to FIG. 17, illustrates a method of performing a read operation is shown. Although the read operation is performed according to the embodiments of FIGS. 3 and 16, the read operation may be modified for other embodiments of the present disclosure. The control and storage module 700 may be used in replacement of the control and storage module 58. The read operation may be performed in a direction from a high Vt to a low Vt of Vt sub-distributions, such as the Vt sub-distributions shown in FIG. 7. A read operation may be performed along other directions. For example, a read operation may be performed in an opposite direction from a low VT to a high Vt. The method may begin at step 768.

In step 769, a read10 operation is executed, where the CVSA 62 outputs a logic 1 when a memory cell Vt level is above read10 voltage levels and a logic 0 when the memory cell Vt level is below the read10 voltage levels. In step 770, the transistors M42, M44, and M46 are turned ON and the VDATA node is grounded or set at a reference voltage level to transfer CVSA data or read data (bit 0) to the first data storage module 710 and to the gate of the transistor M48.

In step 771, a read00 operation is executed. In step 772, the CVSA data or read data (bit 1) from the CVSA 62 is transferred to the second data storage module 712 and to the gate of the transistor M50 by turning ON the transistors M42, M44, and M49. This is performed while the node VDATA is grounded or set at a reference voltage level. During the transfer of the CVSA data, the tri-state inverters 720, 722 are put into a high-z state.

In step 773, after the read00 operation, a read01 operation is executed to obtain the CVSA data. In step 774, the CVSA data of the read01 operation is transferred to the I/O data storage module 702 by turning ON M42. Bit 0, which is stored in the first data storage module 710, is transferred to the I/O data storage module 702. During this transfer, the turn ON sequence of the tri-state inverters 720, 722 is monitored and controlled to ensure that data is reliably entered and latched into the I/O data storage module 702. The turn ON sequence begins with turning ON the tri-state inverter that is driven by the data first, as is similarly described with respect to the embodiments of FIGS. 5 and 8. An incorrect LSB may be recovered according to the method of FIGS. 9 and 18 and from the read01 operation. The method may correct the LSB from the read10 operation. When the read01 operation generates CVSA output data of 1, then the CVSA output from the read01 operation is overwritten.

Figure 18:
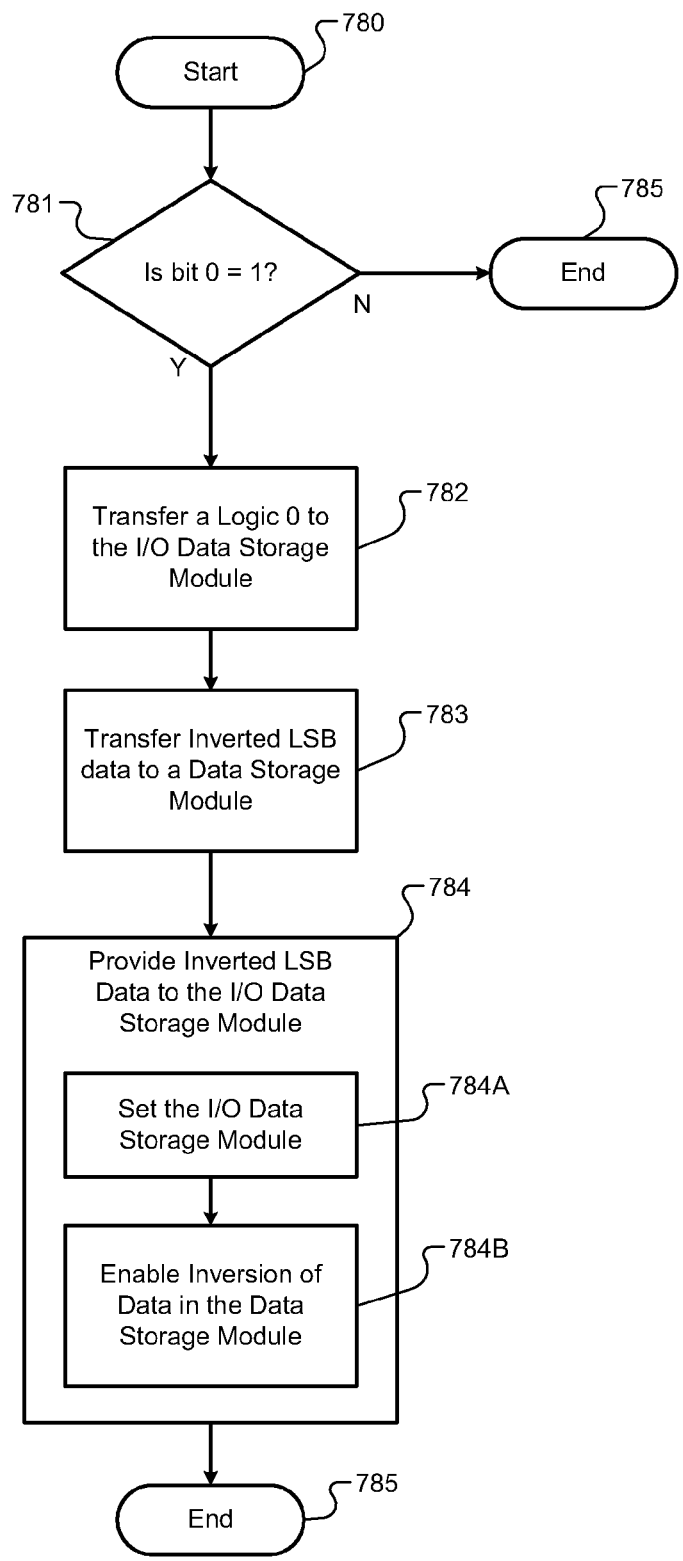
FIG. 18 illustrates a least significant bit recovery method according to another embodiment of the present disclosure.

In step 775, the method of FIG. 18 may be performed to recover the LSB. In step 776, the transistors M32, M33 are turned ON to output bit 0 data.

In step 777, bit 1 data that is in stored in the second data storage module 712 is transferred to the I/O data storage module 702 to output bit 1. In step 777A, the B0 node is reset to low through the output control module 704 and the global control module 706 with the transistors M44 and M42 be optionally turned ON to add capacitive load to the B0 node.

In step 777B, the VDATA node is set HIGH and the transistors M51 and M44 are turned ON to set the B0 node HIGH when the gate of transistor M50 is HIGH. In step 777C, the transistors M32 and M33 are turned ON to transfer the bit 1 data to the I/O data storage module 702 to permit the bit 1 data to be outputted to the data path and I/O module 54. The method may end at 778.

Referring now to FIG. 18, a LSB recovery method is shown. The method may be performed according to the embodiment of FIGS. 3, 16 and 17. The method may begin at step 780.

In step 781, control determines if the data stored in the first data storage module 710 is a logic 1 or a logic 0. In step 782, the VDATA node is grounded or set to a reference voltage and the transistors M47 and M44 are turned ON. This transfers a logic 0 to the I/O data storage module 702. This transfer is performed when the stored data in the first data storage module 710 from a read10 operation is a logic 1. When the data is not a logic 1, control may end at step 785. After step 782, the data in the I/O data storage module 702 is the inversion of the correct LSB data.

In step 783, the inverted LSB data is transferred to the first data storage module 710 by turning ON the transistors M44 and M46 and grounding the VDATA node.

In step 784, the correct LSB data is provided to the I/O data storage module 702. In step 784A, the I/O data storage module 702 is set via the output control module 704 and the global control module 706 to set the B0 node HIGH. At the same time or during the same time period, the transistors M44 and M42 may be turned ON to increase the capacitive load on the B0 node. Large capacitive load on the B0 node prevents a false data transfer. False data can be induced by leakage current in a block or module.

In step 784B, the VDATA node is grounded and the transistors M47 and M44 are turned ON. This sets the B0 node LOW when the gate of the transistor M48 is HIGH or sets the B0 node HIGH when the gate of the transistor M48 is LOW. This provides the opposite state of the data in the first data storage module 710 to the I/O data storage module 702. At the end of step 786 the correct LSB data is stored in the I/O data storage module 702. Bit 0 data and bit 1 data are respectively stored in the I/O data storage module 702 and in the second data storage module 712. Bit 0 and bit 1 data are ready for output to the data path and I/O module 54 at outputs of the global control module 660. The method may end at 785.

Figure 19:
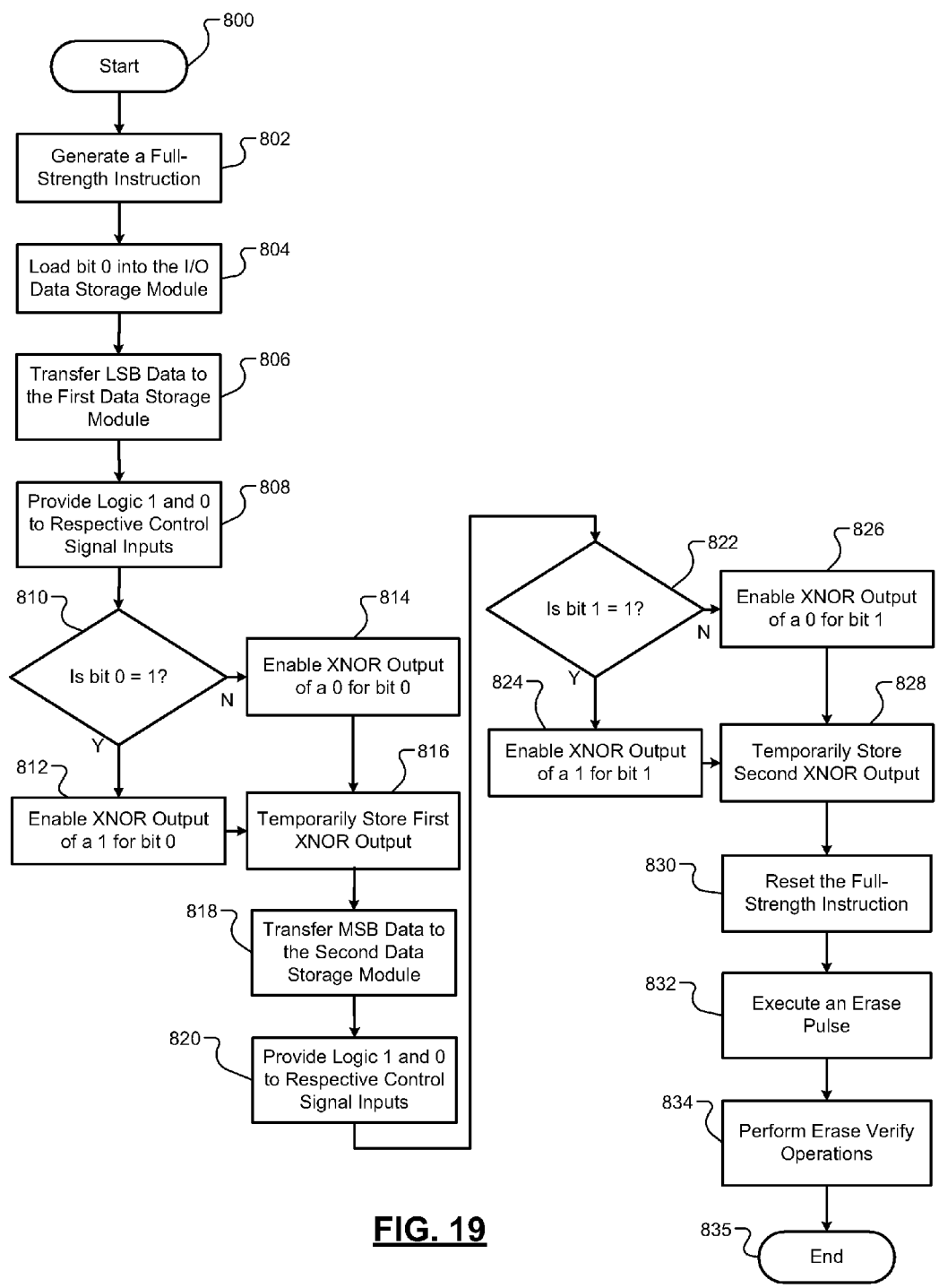
FIG. 19 illustrates a method of erasing incorporating erase verification according to an embodiment of the present disclosure.

Referring now to FIG. 19, a method of erasing incorporating erase verification is shown. The method is described with respect to the embodiment of FIG. 16. The method may be modified for other embodiments of the present disclosure. The erase verification method may be performed similar to the erase verification method of FIG. 11. The method may begin at step 800.

In step 801, the I/O data storage module 702 and the B0 node are set HIGH. In step 802, the transistor M44 is turned ON to transfer the HIGH state (logic 1) of the B0 node to the gates of the transistors M52 and M55 to generate a full-strength instruction. The full-strength instruction indicates that the memory cells and/or all of the memory cells are to, by default, experience a full-strength erase for a next erase pulse or processing pulse.

In step 804, the user data or the LSB (bit 0) is loaded into the I/O data storage module 702 through the output control module 704 and the global control module 706.

In step 806, the I/O data storage module 702 latches in the LSB data, the LSB data is transferred to the first data storage module 710. In step 808, with the LSB data in the I/O data storage module 702, a logic 1 is provided to the control signal input W0, and a logic 0 is provided to the control signal inputs W0', W1, and W1'.

In step 810, control determines if the LSB data is a logic 1 or a logic 0. In step 812, when the LSB data is a logic 1, then the transistor M40 is turned ON. This enables an XNOR output of a logic 1 for bit 0. In step 814, when the LSB data is not a logic 1, the transistor M40 is turned OFF. This enables an XNOR output of a logic 0 for bit 0.

In step 816, a logic 0 is provided to the control signal inputs W0 and W0' to hold the voltage on the gate of the transistor M40 to temporarily store the XNOR output from step 812 or step 814.

In a similar procedure and sequence as described above with respect to the LSB data, the MSB (bit 1) in the user data is loaded and transferred to the second data storage module 712. In step 818, the MSB data is loaded into the I/O data storage module 702. In step 820, a logic 1 is provided to the control signal input W1 and a logic 0 is provided to the control signal inputs W1', W0, and W0'.

In step 822, control determines if the MSB data is a logic 1 or a logic 0. In step 824, when the MSB data is a logic 1, then the transistor M41 is turned ON. This enables an XNOR output of a logic 1 for bit 1. In step 826, when the MSB data is not a logic 1, the transistor M41 is turned OFF. This enables an XNOR output of a logic 0 for bit 1.

In step 828, a logic 0 is provided to the control signal inputs W1 and W1' to hold the voltage on the gate of the transistor M41 to temporarily store the XNOR output from step 824 or step 826. At the end of step 828, the XNOR functions respectively between the control signal inputs W0, W1 and the LSB and MSB of the compare module 708 for target data 11 are completed.

In step 830, the transistor M43 is turned ON to transfer a LOW or logic 0 to the transistor M52 and the gate of the transistor M55 to reset the instruction to indicate that an erase is not to be performed on the memory cells targeting data 11. This step resets the instructions for those sense amplifier circuit(s) that have data 11 in the data storage modules 710, 712. This step does not reset the instructions for those sense amplifier circuit(s) that have data other than 11.

In step 832, a first erase pulse or processing pulse is executed based on the XNOR outputs of steps 816 and 828. In step 834, verify operations sev10, tev10, sev00, tev00, sev01, and tev01 are performed. After each verify operation, the resulting CVSA data is selectively transferred to the handling modules 714, 716 using the XNOR function of the compare module 708. The method may end at 835.

To achieve the XNOR function of the compare module after the sev10 operation, a XNOR between the control signal input W1 and the MSB is first performed since the MSB data is in the I/O data storage module 702. After the XNOR of the control signal input W1 and the MSB, the LSB data is transferred to the I/O data storage module 702. This is performed for a XNOR between the control signal input W0 and the LSB. For the tev10 operation, the MSB data is transferred to the I/O data storage module 702.

A global erase verification may be performed for each of the 10, 00, and 01 levels. An example global erase verification is described with respect to the embodiment of FIG. 20. The global erase verification on the 10 level may be performed after the tev10 procedure with the transistors M40 and M41 maintained at a proper bias level. This is similar to that described with respect to the circuit of FIG. 5 and corresponding global erase verification methods.

Similar erase verification and global erase verification procedures as described for data 10 may be applied for verifying other data types, such as 00 and 01, along with their respective operations (e.g. sev00, tev00, sev01, and tev01). The erase pulse or processing pulse and the verify procedures may be performed until the global erase verifications (10, 00, 01) pass.

Figure 20:
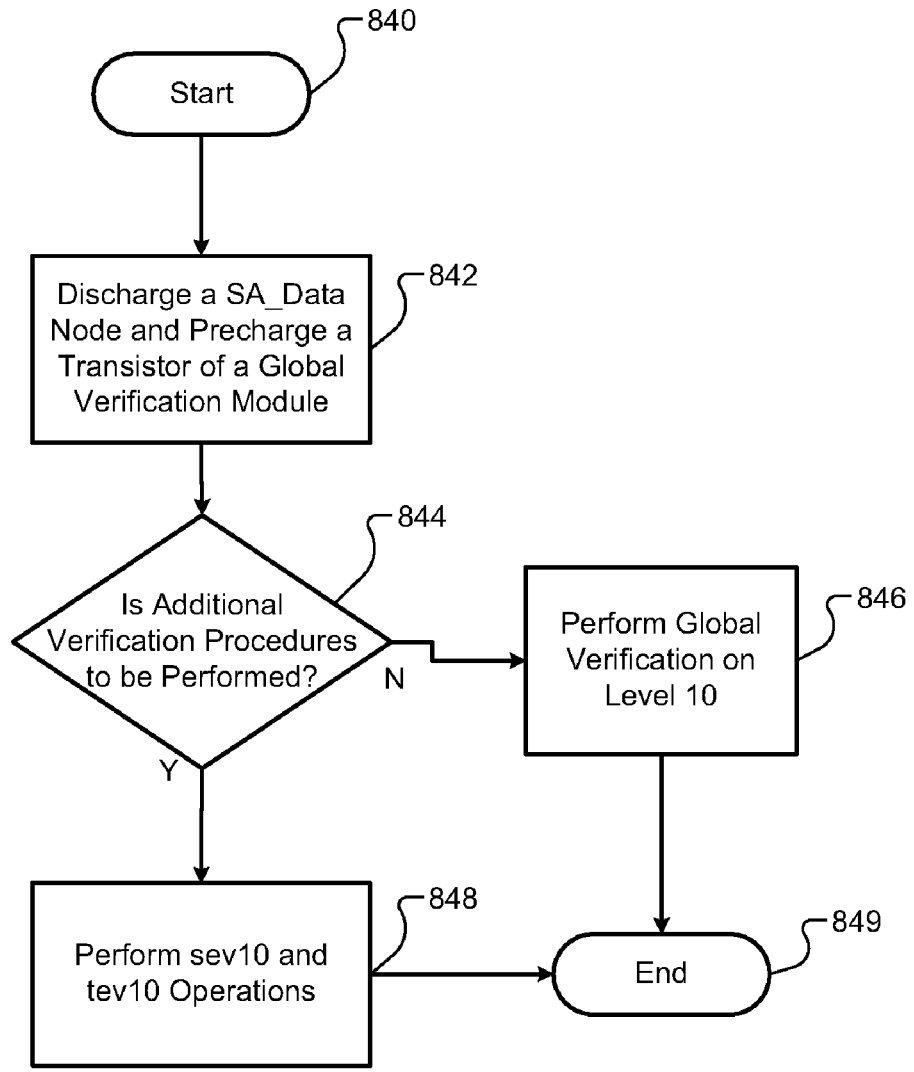
FIG. 20 illustrates a method of performing global erase verification according to an embodiment of the present disclosure.

Referring now to FIG. 20, a method of performing global erase verification method is shown. The global verification is described with respect to the 10 level, but may be applied to and/or modified for other levels, such as the 00 and 01 levels. The method may begin at step 840.

In step 841, the CVSA output 62 is set to a high-z state and the transistor M43 is turned ON to discharge the SA_data node or gate of the transistor M45. At the same time or during the same time period, the gate of the transistor M58 is precharged to a HIGH state.

In step 842, the VDATA node is set HIGH and the transistor M57 is turned ON to pull the SA_data node HIGH when the gate of the transistor M55 is HIGH.

In step 844, control determines whether additional verification operations are to be performed. In step 846, when the gate of the transistor M58 is HIGH, then global verification on level 10 is verified, or the erase operation on level 10 is completed, and sev10 and tev10 operations are not performed after the next erase pulses or processing pulses. In step 848, when the gate of the transistor M58 is not HIGH, further sev10 and tev10 operations may be performed. The method may end at 849.

Figure 21:
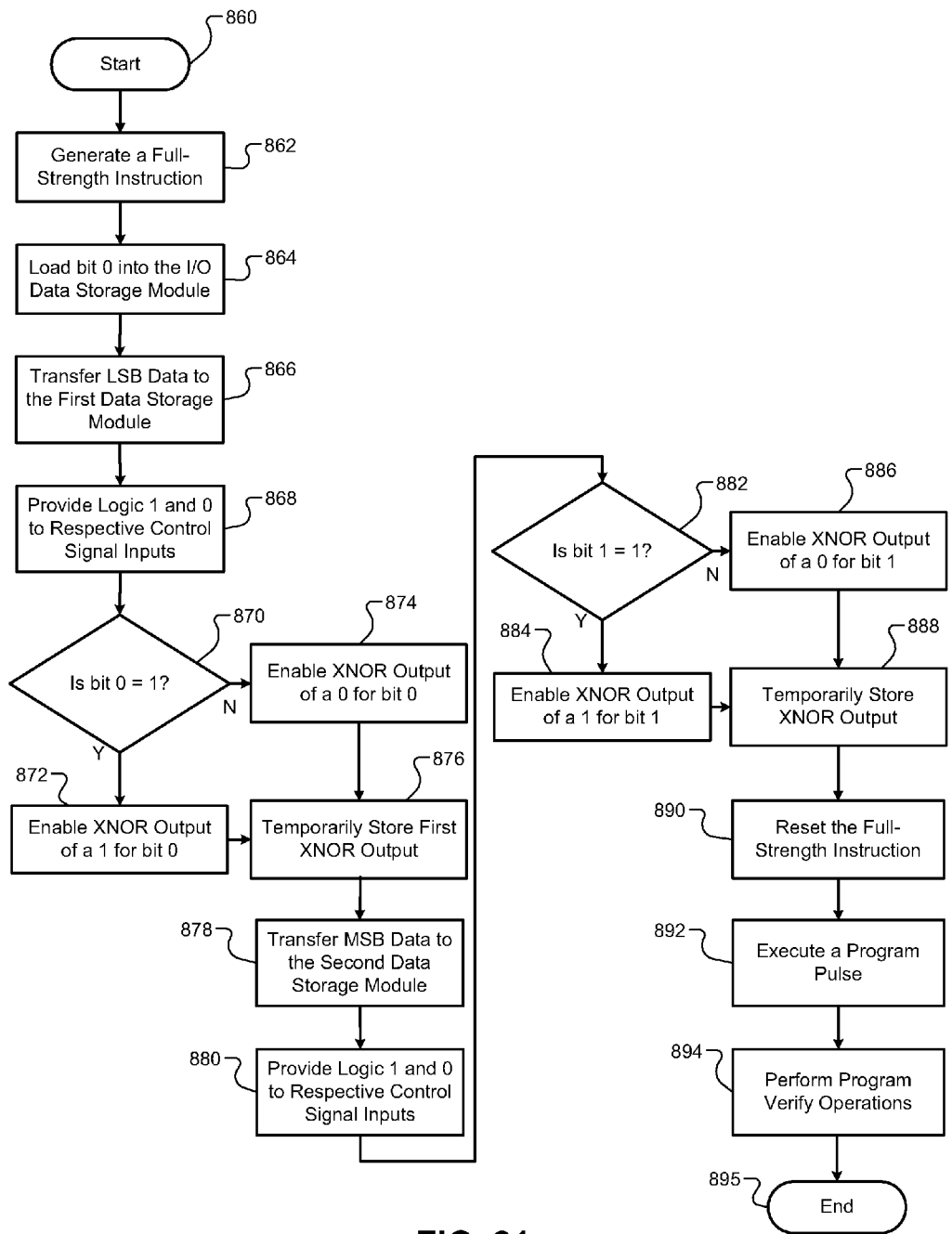
FIG. 21 illustrates a method for programming incorporating program verification according to an embodiment of the present disclosure.

Referring now to FIG. 21, a method for programming incorporating program verification is shown. The method is described with respect to the embodiment of FIG. 16. The method may be modified for other embodiment of the present disclosure. The method of FIG. 21 may be performed similar to the method of FIG. 19.

In step 861, the I/O data storage module 702 and the B0 node are set HIGH. In step 862, the transistor M44 is turned ON to transfer the HIGH state (logic 1) of the B0 node to the gates of the transistors M52 and M55 to generate a full-strength instruction. The full-strength instruction indicates that the memory cells and/or all of the memory cells are to, by default, experience a full-strength program for a next program pulse or processing pulse.

In step 864, the user data or the LSB (bit 0) is loaded into the I/O data storage module 702 through the output control module 704 and the global control module 706. In step 866, the I/O data storage module 702 latches in the LSB data, the LSB data is transferred to the first data storage module 710.

In step 868, with the LSB data in the I/O data storage module 702, a logic 1 is provided to the control signal input W0, and a logic 0 is provided to the control signal inputs W0', W1, and W1'.

In step 870, control determines if the LSB data is a logic 1 or a logic 0. In step 872, when the LSB data is a logic 1, then the transistor M40 is turned ON. This enables an XNOR output of a logic 1 for bit 0. In step 874, when the LSB data is not a logic 1, the transistor M40 is turned OFF. This enables an XNOR output of a logic 0 for bit 0.

In step 876, a logic 0 is provided to the control signal inputs W0 and W0' to hold the voltage on the gate of the transistor M40 to temporarily store the XNOR output from step 872 or step 874.

In a similar procedure and sequence as described above with respect to the LSB data, the MSB (bit 1) in the user data is loaded and transferred to the second data storage module 712. In step 878, the MSB data is loaded into the I/O data storage module 702. In step 880, a logic 1 is provided to the control signal input W1 and a logic 0 is provided to the control signal inputs W1', W0, and W0'.

In step 882, control determines if the MSB data is a logic 1 or a logic 0. In step 884, when the MSB data is a logic 1, then the transistor M41 is turned ON. This enables an XNOR output of a logic 1 for bit 1. In step 886, when the MSB data is not a logic 1, the transistor M41 is turned OFF. This enables an XNOR output of a logic 0 for bit 1.

In step 888, a logic 0 is provided to the control signal inputs W1 and W1' to hold the voltage on the gate of the transistor M41 to temporarily store the XNOR output from step 824 or step 826. At the end of step 888, the XNOR functions respectively between the control signal inputs W0, W1 and the LSB and MSB of the compare module 708 for target data 11 are completed.

In step 890, the transistor M43 is turned ON to transfer a LOW or logic 0 to the transistor M52 and the gate of the transistor M55 to reset the instruction to indicate that a program operation is not to be performed on the memory cells targeting data 11. This step resets the instructions for those sense amplifier circuit(s) that have data 11 in the data storage modules 710, 712. This step does not reset the instructions for those sense amplifier circuit(s) that have data other than 11.

In step 892, a first program pulse or processing pulse is executed based on the XNOR outputs of steps 876 and 888. In step 894, verify operations spv10, tpv10, spv00, tpv00, spv01, and tpv01 are performed. After each verify operation, the resulting CVSA data is selectively transferred to the handling modules 714, 716 using the XNOR function of the compare module 708. The method may end at 895.

The above-described steps corresponding to the methods of the above described Figures are meant to be illustrative examples; the steps may be performed sequentially, synchronously, simultaneously, continuously, during overlapping time periods or in a different order depending upon the application.

To achieve the XNOR function of the compare module after the spv10 operation, a XNOR between the control signal input W1 and the MSB is first performed since the MSB data is in the I/O data storage module 702. After the XNOR of the control signal input W1 and the MSB, the LSB data is transferred to the I/O data storage module 702 for a XNOR between the control signal input W0 and the LSB. For the tpv10 operation, the MSB data is transferred to the I/O data storage module 702.

A global program verification may be performed for each of the 10, 00, and 01 levels. An example global program verification is described with respect to the embodiment of FIG. 22. The global program verification on the 10 level may be performed after the tpv10 procedure with the transistors M40 and M41 maintained at a proper bias level. This is similar to that described with respect to the circuit of FIG. 5 and corresponding global program verification methods.

Similar program verification and global program verification procedures as described for data 10 may be applied for verifying other data types such as 00 and 01, along with their respective operations (e.g. spv00, tpv00, spv01, and tpv01).

The program pulse or processing pulse and the verify procedures may be performed until the global program verifications (10, 00, 01) pass.

Figure 22:
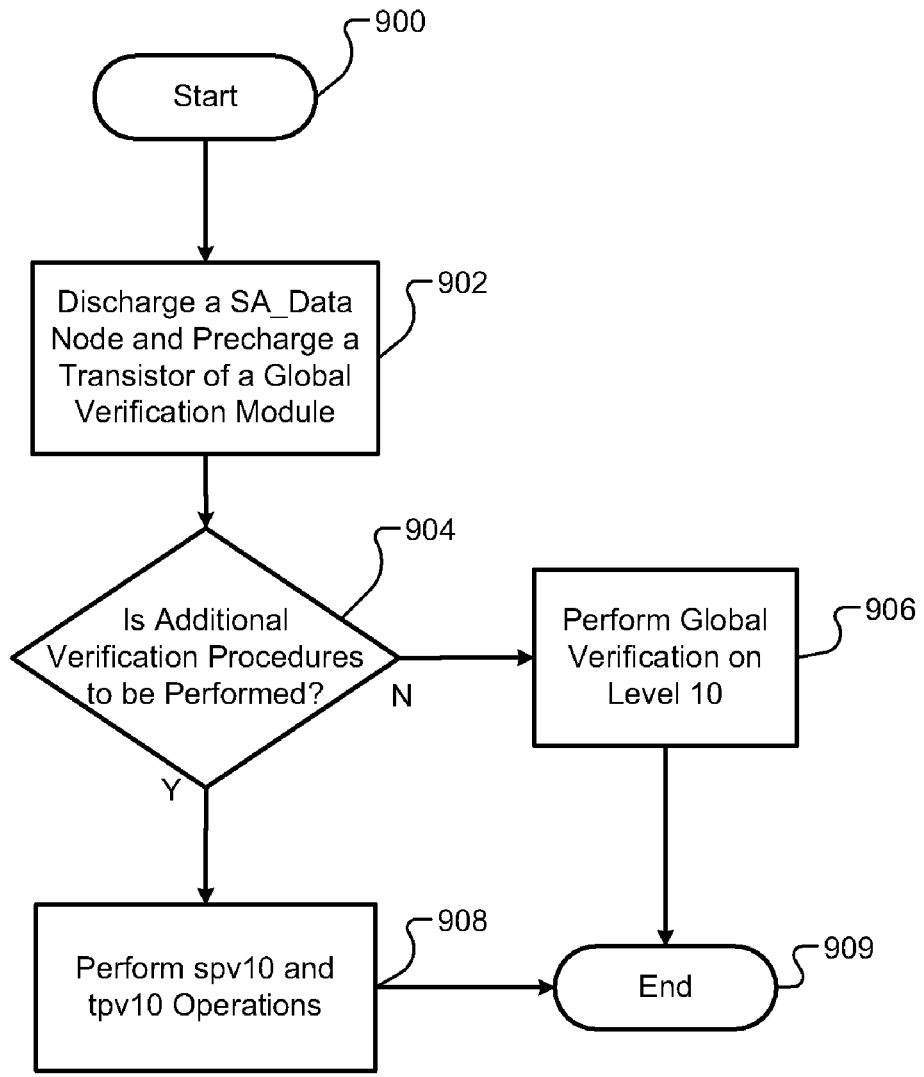
FIG. 22 illustrates a method of performing global program verification according to an embodiment of the present disclosure.

Referring now to FIG. 22, a method of performing global program verification is shown. The global program verification is described with respect to the 10 level, but may be modified for other levels, such as the 00 and 01 levels. The method may begin at step 900.

In step 901, the CVSA output 62 is set to a high-z state and the transistor M43 is turned ON to discharge the SA_data node or gate of the transistor M45. At the same time or during the same time period, the gate of the transistor M58 is precharged to a HIGH state.

In step 902, the VDATA node is set HIGH and the transistor M57 is turned ON to pull the SA_data node HIGH when the gate of the transistor M55 is HIGH.

In step 904, control determines whether additional verification operations are to be performed. In step 906, when the gate of the transistor M58 is HIGH, then global verification on level 10 is verified, or the program operation on level 10 is completed, and spv10 and tpv10 operations are not performed after the next program pulses or processing pulses. In step 908, when the gate of the transistor M58 is not HIGH, further spv10 and tpv10 operations may be performed. The method may end at 909.

The above described read, erase verification, and program verification methods of FIGS. 8, 10, 11, 13, 17, 19, and 21 may be used for page read, page erase, and page program, when the corresponding nonvolatile memory array is suitable for page based operations. The sense amplifier circuit(s) described above may be used for block level or bank level read, erase, and/or programming when the nonvolatile memory array is suitable for block or bank level based operations. The sequence of the erase and/or verify operations may be changed or performed in a different order than above described. When the sequence of the read and/or verify operations at different levels are changed, the control signals are adjusted accordingly. For cache read, cache program, and cache erase operations, another latch can be inserted between the I/O data storage module 702 and the global control module 706 to operate as a cache buffer.

Also, one or more of the modules of FIGS. 4, 5, 15 and 16 may be removed depending on the memory operation requirements. For example, when a soft-program or a soft-erase is not to be performed, the first handling module 136 of FIG. 5 or the first handling module 714 of FIG. 16 may be removed.

Further, additional bridging techniques may be incorporated between nodes of the circuits of FIGS. 5 and 16. For example in FIG. 16, instead of bridging the MATCH node and the B0 node, M44 can be alternately used to bridge the MATCH node and the B0' node. The control and storage module 700 performs the same functions with the alternative bridge. When the alternative bridge is used an inversion is performed on the data or the data provided to a data path and I/O module.

The above described circuits may also operate on different data assignments of the four Vt sub-distributions of FIG. 7, and in such Vt assignments the control signals may be applied differently. Moreover, although the embodiments disclosed herein are primarily described with respect to a MLC having 2 bits per cell, the embodiments may be applied to cells with more than two bits of data. In other words, the above described circuits are expandable or shrinkable (i.e. scalable), according to the number of bits stored in each memory cell.

For example with respect to the embodiment of FIG. 16, when a memory cell is a 3-bit cell, then another data storage module similar to the data storage modules 710, 712 may be connected to the MATCH node of FIG. 16. The additional data storage module may be used to store the additional bit of data. Also, related blocks or modules may be modified for 3-bit operations. The compare module 708, for example, may be modified to include another metal-oxide-semiconductor field-effect transistor (MOSFET) or other transistor in series with transistors M40 and M41. The gate of the added transistor may be in series with an additional pair of transistors, similar to the transistor pairs M36, M37 and M38, M39. The additional pair of transistors may have control signal inputs identified as W2 and W2'.

The above described sense amplifier circuit(s) can also work with a different CVSA having an output that is a logic 0 when a cell Vt is higher than a read level and 1 when a cell Vt is lower than a read level. This is the opposite of the above described CVSA 62 of FIG. 3. With the different CVSA outputs, the control signals may be applied differently and data inversions may be performed.

Figure 23A:
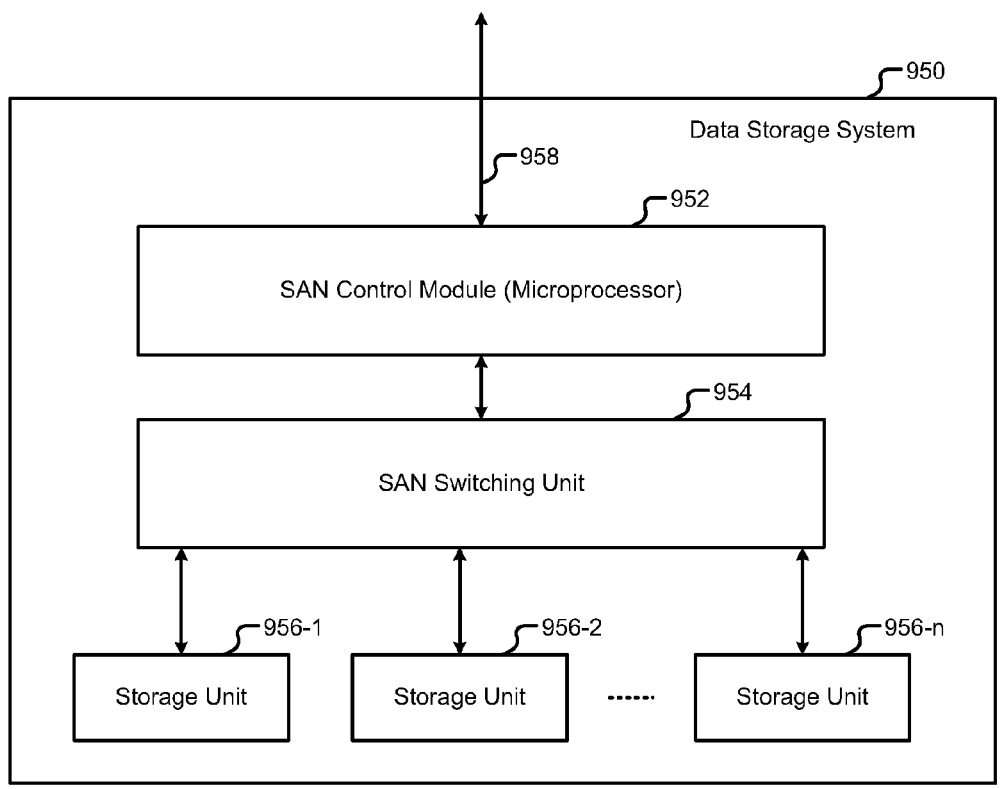
FIG. 23A is a functional block diagram of a data storage system including storage units according to the present disclosure.
Figure 23B:
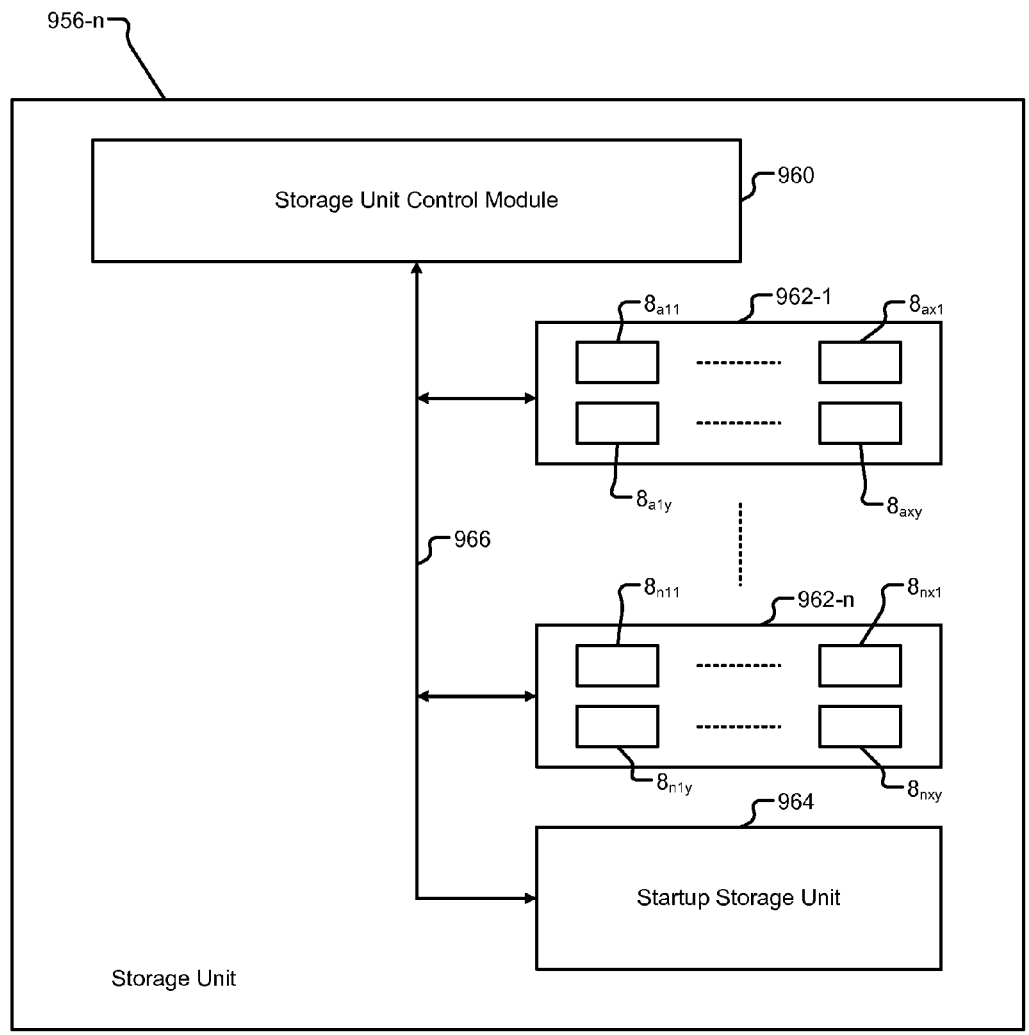
FIG. 23B is a functional block diagram of a storage unit of the data storage system of FIG. 23A according to the present disclosure.

Referring now to FIGS. 23A and 23B, the teachings of the present disclosure can be extended to storage products including data storage systems and solid-state disks. The architecture and configuration of the data storage system shown in FIGS. 23A and 23B are exemplary. Other architectures and device configurations are contemplated.

In FIG. 23A, for example only, a data storage system 950 may comprise a storage area network (SAN) control module 952, a SAN switching unit 954, and storage units 956-1, 956-2, . . . , and 956-n (collectively storage units 956). The SAN control module 952 may comprise a control unit that interfaces the data storage system 950 to one or more external devices (not shown) through an input/output (I/O) bus 958. For example, the control unit may include a processor, a microprocessor, an ASIC, a state machine, etc. For example, the external devices may include a host, a server, etc. The I/O bus 958 may comprise a bus that provides high speed and wide bandwidth for data transmission. For example, the I/O bus 958 may include fiber-channels, Ethernet, etc. For example only, the transmission speed of the I/O bus 258 may be faster than 10 gigabits per second (10 Gb/s).

Additionally, the SAN control module 952 may control the SAN switching unit 954. For example only, the SAN switching unit 954 may include a plurality of switches. Each of the switches may interface with one of the storage units 956 and may be controlled via control signals from the SAN control module 952. The storage units 956 may store information that includes audio data, video data, and/or any other types of data in a digital format.

In FIG. 23B, for example only, one of the storage units 956 (e.g., the storage unit 956-n) may comprise a storage unit control module 960, solid-state drives (SSDs) 962-1, . . . , and 962-n (collectively SSDs 962), a startup storage unit 964, and a bus 966. An SSD may refer to a data storage device that uses solid-state memory to store data, such as a flash memory drive. Each of the SSDs 962 may comprise one or more of the memory IC 8 of FIG. 1, shown as memory ICs $8_{a11}$-$8_{nxy}$. The variables a and n refer to the SSD. The variables x and y refer to a memory IC within a SSD. The variable a may be equal to 1 and the variables n, x, and y may be integers greater than 1. Additionally, each of the SSDs 962 may comprise a memory controller (not shown) that controls the one or more of the memory ICs $8_{a11}$-$8_{nxy}$. The startup storage unit 964 may include code for operating the storage unit control module 960. Using the code, the storage unit control module 960 may control the SSDs 962 via the bus 966.

Referring now to FIGS. 24A-24G, various exemplary implementations incorporating the teachings of the present disclosure are shown.

Figure 24A:
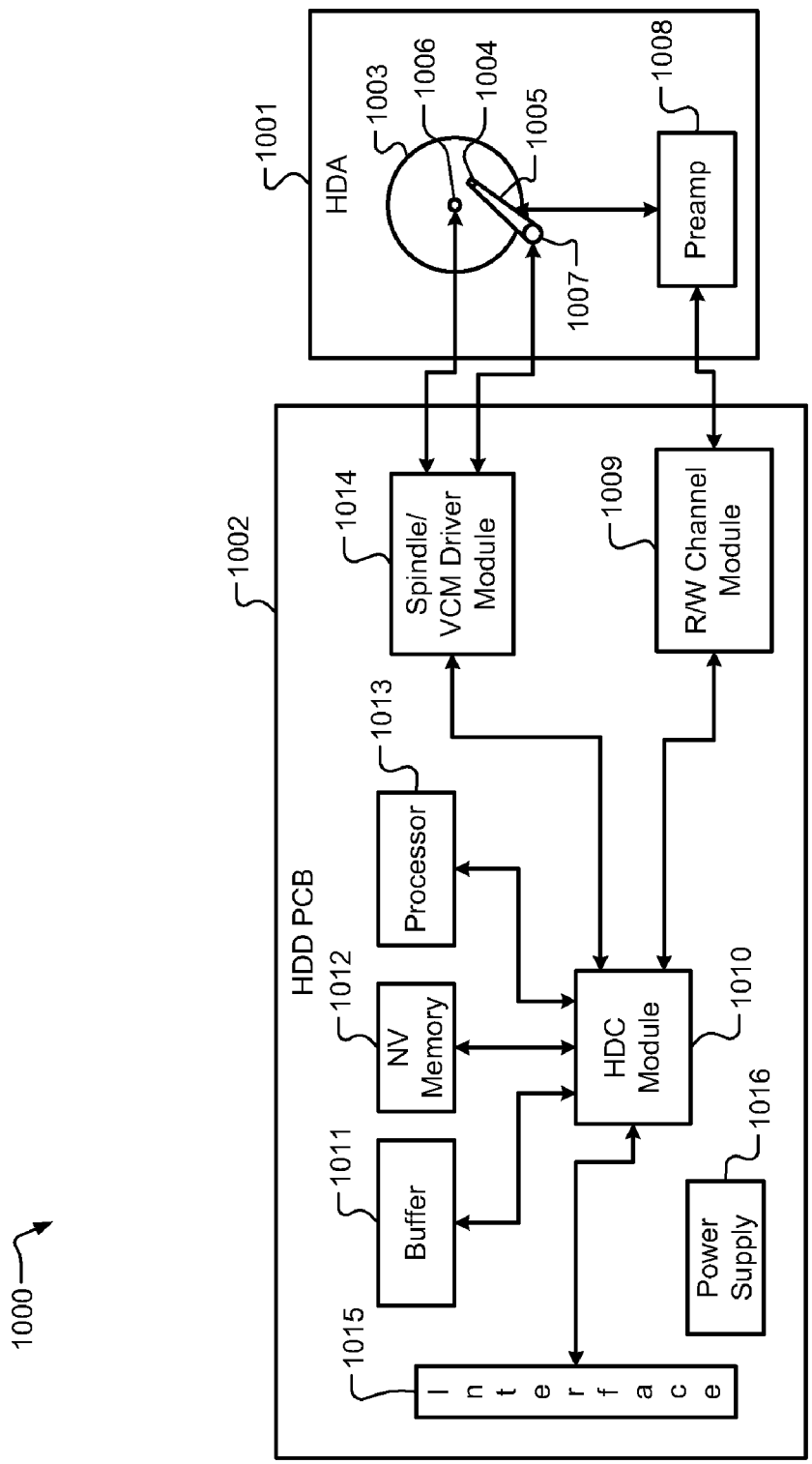
FIG. 24A is a functional block diagram of a hard disk drive.

Referring now to FIG. 24A, the teachings of the disclosure can be implemented in a hard disk drive (HDD) 1000 and used when accessing nonvolatile memory 1012. The HDD 1000 includes a hard disk assembly (HDA) 1001 and an HDD printed circuit board (PCB) 1002. The HDA 1001 may include a magnetic medium 1003, such as one or more platters that store data, and a read/write device 1004. The read/write device 1004 may be arranged on an actuator arm 1005 and may read and write data on the magnetic medium 1003. Additionally, the HDA 1001 includes a spindle motor 1006 that rotates the magnetic medium 1003 and a voice-coil motor (VCM) 1007 that actuates the actuator arm 1005. A preamplifier device 1008 amplifies signals generated by the read/write device 1004 during read operations and provides signals to the read/write device 1004 during write operations.

The HDD PCB 1002 includes a read/write channel module (hereinafter, "read channel") 1009, a hard disk controller (HDC) module 1010, a buffer 1011, the nonvolatile memory 1012, a processor 1013, and a spindle/VCM driver module 1014. The read channel 1009 processes data received from and transmitted to the preamplifier device 1008. The HDC module 1010 controls components of the HDA 1001 and communicates with an external device (not shown) via an I/O interface 1015. The external device may include a computer, a multimedia device, a mobile computing device, etc. The I/O interface 1015 may include wireline and/or wireless communication links.

The HDC module 1010 may receive data from the HDA 1001, the read channel 1009, the buffer 1011, nonvolatile memory 1012, the processor 1013, the spindle/VCM driver module 1014, and/or the I/O interface 1015. The processor 1013 may process the data, including encoding, decoding, filtering, and/or formatting. The processed data may be output to the HDA 1001, the read channel 1009, the buffer 1011, nonvolatile memory 1012, the processor 1013, the spindle/VCM driver module 1014, and/or the I/O interface 1015.

The HDC module 1010 may use the buffer 1011 and/or nonvolatile memory 1012 to store data related to the control and operation of the HDD 1000. The buffer 1011 may include DRAM, SDRAM, etc. Nonvolatile memory 1012 may include any suitable type of semiconductor or solid-state memory, such as flash memory (including NAND and NOR flash memory), phase change memory, magnetic RAM, and multi-state memory, in which each memory cell has more than two states. The spindle/VCM driver module 1014 controls the spindle motor 1006 and the VCM 1007. The HDD PCB 1002 includes a power supply 1016 that provides power to the components of the HDD 1000.

Figure 24B:
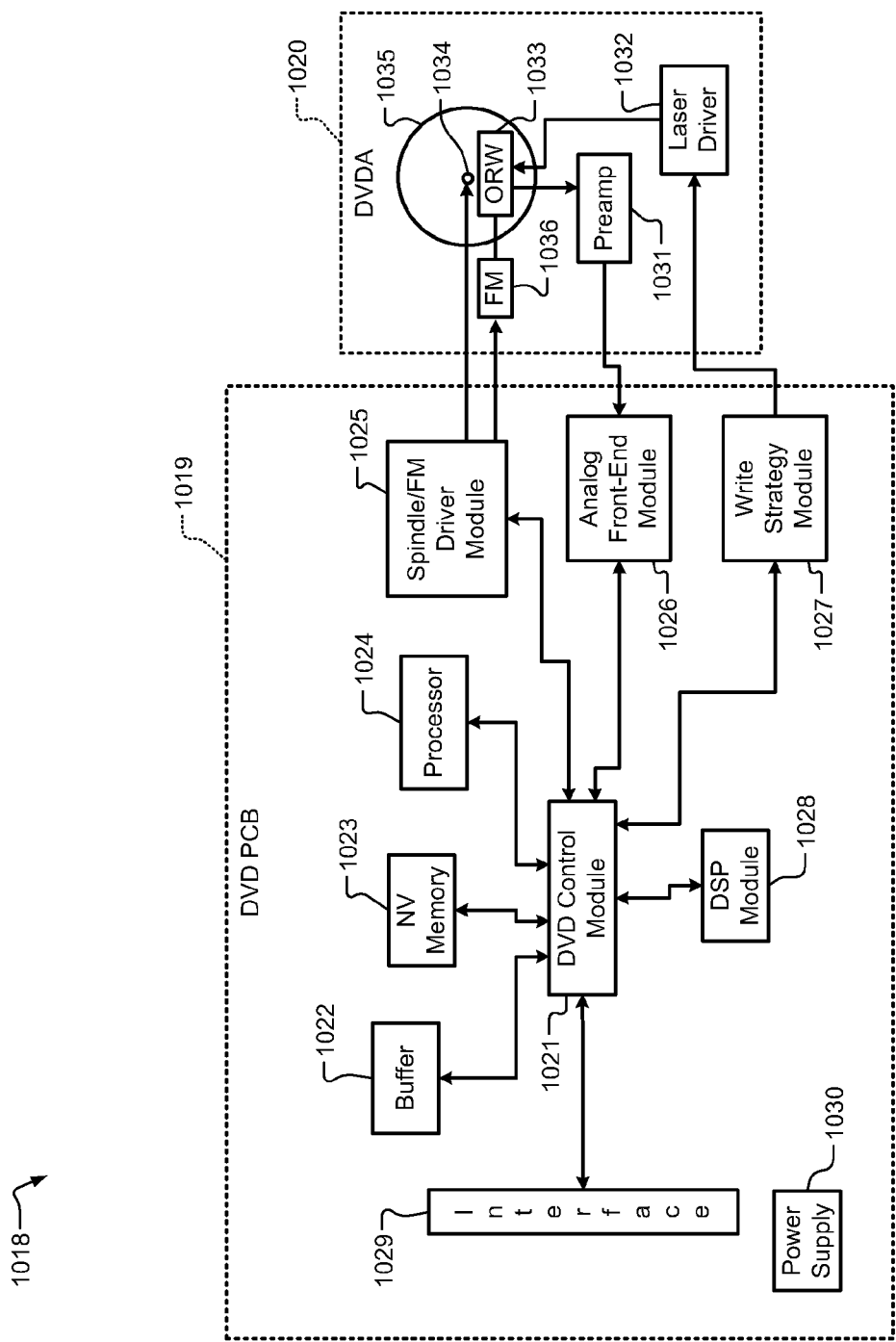
FIG. 24B is a functional block diagram of a DVD drive.

Referring now to FIG. 24B, the teachings of the disclosure can be implemented in a DVD drive 1018 or of a CD drive (not shown) and used when accessing nonvolatile memory 1023. The DVD drive 1018 includes a DVD PCB 1019 and a DVD assembly (DVDA) 1020. The DVD PCB 1019 includes a DVD control module 1021, a buffer 1022, the nonvolatile memory 1023, a processor 1024, a spindle/FM (feed motor) driver module 1025, an analog front-end module 1026, a write strategy module 1027, and a DSP module 1028.

The DVD control module 1021 controls components of the DVDA 1020 and communicates with an external device (not shown) via an I/O interface 1029. The external device may include a computer, a multimedia device, a mobile computing device, etc. The I/O interface 1029 may include wireline and/or wireless communication links.

The DVD control module 1021 may receive data from the buffer 1022, nonvolatile memory 1023, the processor 1024, the spindle/FM driver module 1025, the analog front-end module 1026, the write strategy module 1027, the DSP module 1028, and/or the I/O interface 1029. The processor 1024 may process the data, including encoding, decoding, filtering, and/or formatting. The DSP module 1028 performs signal processing, such as video and/or audio coding/decoding. The processed data may be output to the buffer 1022, nonvolatile memory 1023, the processor 1024, the spindle/FM driver module 1025, the analog front-end module 1026, the write strategy module 1027, the DSP module 1028, and/or the I/O interface 1029.

The DVD control module 1021 may use the buffer 1022 and/or nonvolatile memory 1023 to store data related to the control and operation of the DVD drive 1018. The buffer 1022 may include DRAM, SDRAM, etc. Nonvolatile memory 1023 may include any suitable type of semiconductor or solid-state memory, such as flash memory (including NAND and NOR flash memory), phase change memory, magnetic RAM, and multi-state memory, in which each memory cell has more than two states. The DVD PCB 1019 includes a power supply 1030 that provides power to the components of the DVD drive 1018.

The DVDA 1020 may include a preamplifier device 1031, a laser driver 1032, and an optical device 1033, which may be an optical read/write (ORW) device or an optical read-only (OR) device. A spindle motor 1034 rotates an optical storage medium 1035, and a feed motor 1036 actuates the optical device 1033 relative to the optical storage medium 1035.

When reading data from the optical storage medium 1035, the laser driver provides a read power to the optical device 1033. The optical device 1033 detects data from the optical storage medium 1035, and transmits the data to the preamplifier device 1031. The analog front-end module 1026 receives data from the preamplifier device 1031 and performs such functions as filtering and A/D conversion. To write to the optical storage medium 1035, the write strategy module 1027 transmits power level and timing data to the laser driver 1032. The laser driver 1032 controls the optical device 1033 to write data to the optical storage medium 1035.

Figure 24D:
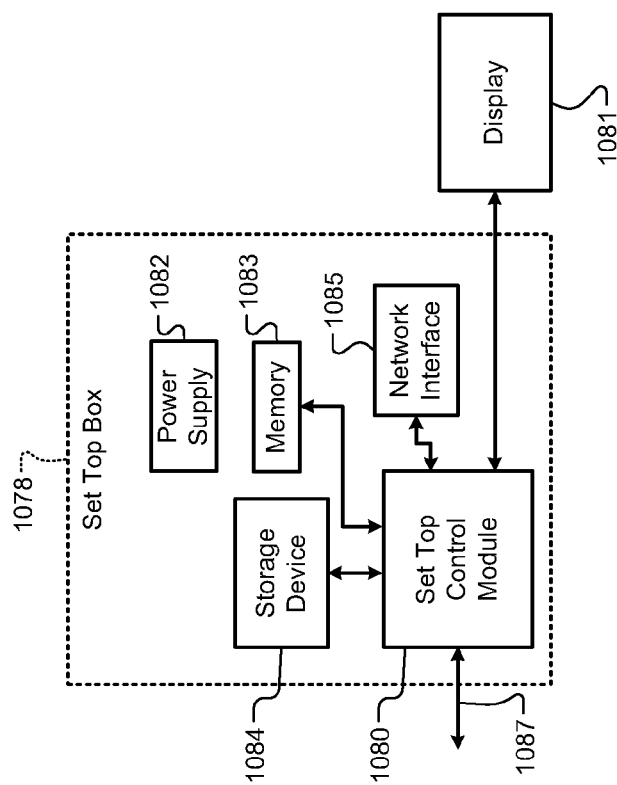
FIG. 24D is a functional block diagram of a set top box.
Figure 24C:
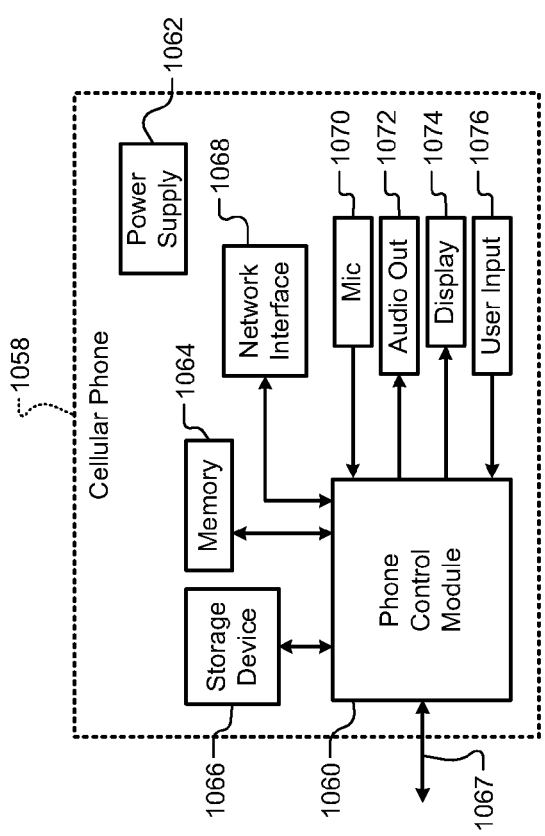
FIG. 24C is a functional block diagram of a cellular phone.

Referring now to FIG. 24C, the teachings of the disclosure can be implemented in a cellular phone 1058 and used when accessing non-volatile memory 1064. The cellular phone 1058 includes a phone control module 1060, a power supply 1062, the memory 1064, a storage device 1066, and a cellular network interface 1067. The cellular phone 1058 may include a network interface 1068, a microphone 1070, an audio output 1072 such as a speaker and/or output jack, a display 1074, and a user input device 1076 such as a keypad and/or pointing device. If the network interface 1068 includes a wireless local area network interface, an antenna (not shown) may be included.

The phone control module 1060 may receive input signals from the cellular network interface 1067, the network interface 1068, the microphone 1070, and/or the user input device 1076. The phone control module 1060 may process signals, including encoding, decoding, filtering, and/or formatting, and generate output signals. The output signals may be communicated to one or more of memory 1064, the storage device 1066, the cellular network interface 1067, the network interface 1068, and the audio output 1072.

Memory 1064 may include random access memory (RAM) and/or nonvolatile memory. Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 1066 may include an optical storage drive, such as a DVD drive, and/or a hard disk drive (HDD). The power supply 1062 provides power to the components of the cellular phone 1058.

Referring now to FIG. 24D, the teachings of the disclosure can be implemented in a set top box 1078 and used when accessing non-volatile memory 1083. The set top box 1078 includes a set top control module 1080, a display 1081, a power supply 1082, the memory 1083, a storage device 1084, and a network interface 1085. If the network interface 1085 includes a wireless local area network interface, an antenna (not shown) may be included.

The set top control module 1080 may receive input signals from the network interface 1085 and an external interface 1087, which can send and receive data via cable, broadband Internet, and/or satellite. The set top control module 1080 may process signals, including encoding, decoding, filtering, and/or formatting, and generate output signals. The output signals may include audio and/or video signals in standard and/or high definition formats. The output signals may be communicated to the network interface 1085 and/or to the display 1081. The display 1081 may include a television, a projector, and/or a monitor.

The power supply 1082 provides power to the components of the set top box 1078. Memory 1083 may include random access memory (RAM) and/or nonvolatile memory. Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 1084 may include an optical storage drive, such as a DVD drive, and/or a hard disk drive (HDD).

Figure 24E:
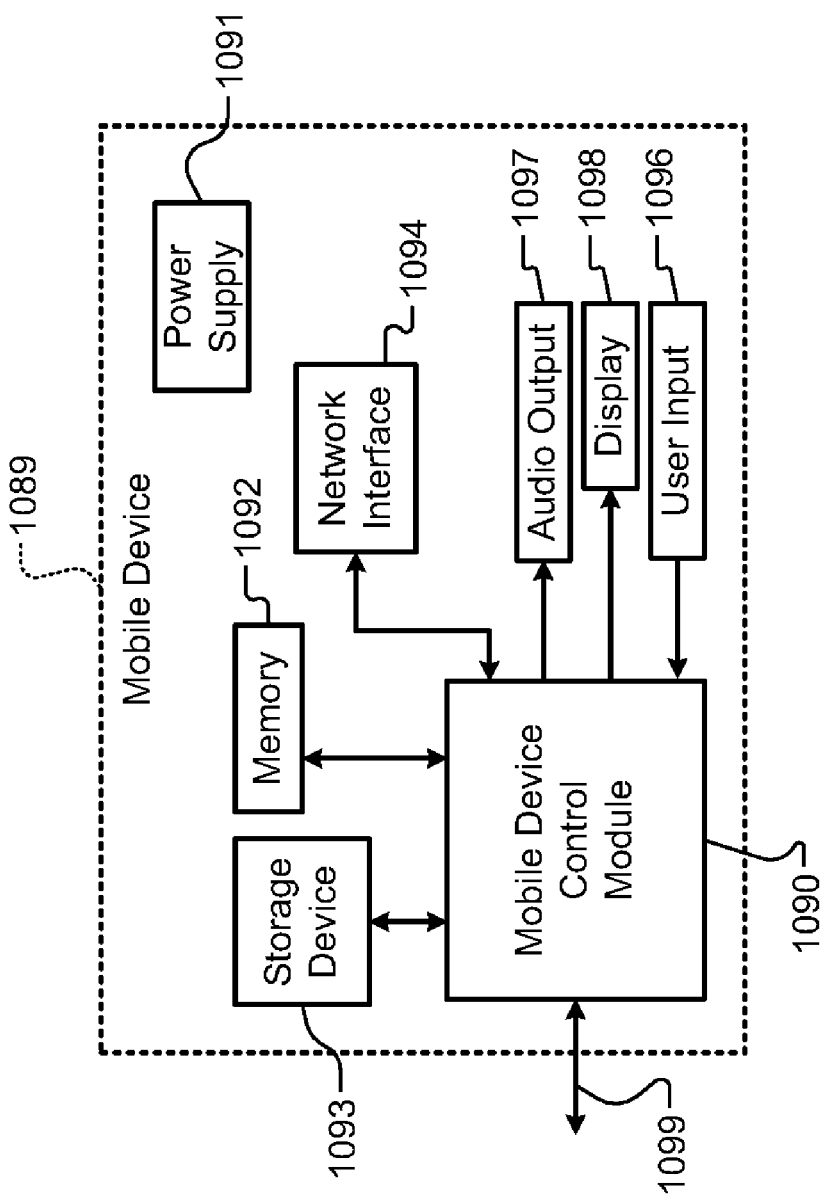
FIG. 24E is a functional block diagram of a mobile device.

Referring now to FIG. 24E, the teachings of the disclosure can be implemented in a mobile device 1089 and used when accessing non-volatile memory 1092. The mobile device 1089 may include a mobile device control module 1090, a power supply 1091, the memory 1092, a storage device 1093, a network interface 1094, and an external interface 1099. If the network interface 1094 includes a wireless local area network interface, an antenna (not shown) may be included.

The mobile device control module 1090 may receive input signals from the network interface 1094 and/or the external interface 1099. The external interface 1099 may include USB, infrared, and/or Ethernet. The input signals may include compressed audio and/or video, and may be compliant with the MP3 format. Additionally, the mobile device control module 1090 may receive input from a user input 1096 such as a keypad, touchpad, or individual buttons. The mobile device control module 1090 may process input signals, including encoding, decoding, filtering, and/or formatting, and generate output signals.

The mobile device control module 1090 may output audio signals to an audio output 1097 and video signals to a display 1098. The audio output 1097 may include a speaker and/or an output jack. The display 1098 may present a graphical user interface, which may include menus, icons, etc. The power supply 1091 provides power to the components of the mobile device 1089. Memory 1092 may include random access memory (RAM) and/or nonvolatile memory.

Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 1093 may include an optical storage drive, such as a DVD drive, and/or a hard disk drive (HDD). The mobile device may include a personal digital assistant, a media player, a laptop computer, a gaming console, or other mobile computing device.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent upon a study of the drawings, the specification, and the following claims.

What is claimed is:

1. A memory circuit comprising:
 a memory array comprising multi-level cells, wherein each of the multi-level cells is configured to store M bits of data, where M is an integer greater than one;
 a first control module configured to (i) read a state of one of the multi-level cells, and (ii) perform one of a first erase operation and a first program operation on the one of the multi-level cells for the M bits of data during a first time period; and
 a comparing module configured to, subsequent to performing the one of the first erase operation and the first program operation, perform (i) a first XNOR on a first one of the M bits of data and a first control signal input, and (ii) a second XNOR on a second one of the M bits of data and a second control signal input,
 wherein the comparing module is configured to determine whether to perform one of a second erase operation and a second program operation based on results of the first XNOR and the second XNOR.

2. The memory circuit of claim 1, wherein the first control module is configured to perform one of the first erase operation and the first program operation on the one of the multi-level cells for the M bits of data at the same time.

3. The memory circuit of claim 1, wherein the first control module comprises:
 at least one of an analog-to-digital converter or a sense amplifier module configured to generate amplifier data based on the state; and
 a second control module configured to perform the one of the first erase operation and the first program operation based on the amplifier data.

4. The memory circuit of claim 3, wherein the second control module is configured to store the M bits of data.

5. The memory circuit of claim 1, wherein:
 the first control module comprises a second control module; and
 the second control module comprises
  a first input and output (I/O) module configured to store the first one of the M bits of data, and
  second I/O module configured to store the second one of the M bits of data.

6. The memory circuit of claim 5, wherein:
 the first I/O module comprises
  a first tri-state inverter, and
  a second tri-state inverter in communication with an input and an output of the first tri-state inverter, and
 the second I/O module comprises
  a third tri-state inverter, and
  a fourth tri-state inverter in communication with an input and an output of the third tri-state inverter.

7. The memory circuit of claim 5, wherein:
 the second control module comprises a first output module; and
 the first output module is configured to receive the M bits of data from the first I/O module.

8. The memory circuit of claim 7, wherein:
the second control module comprises a second output module;
the second output module comprises at least one of a set device or a reset device; and
the at least one of the set device or the reset device is configured to receive the M bits of data from the first output module.

9. The memory circuit of claim 5, wherein:
the second control module comprises an access control module; and
the access control module is configured to selectively transfer sensing amplifier data from a sense amplifier module to the first I/O module.

10. The memory circuit of claim 5, wherein:
the second control module configured to iteratively generate processing pulses;
the second control module comprises a handling module;
the handling module is configured to store indication data during a time period associated with a first processing pulse;
the indication data indicates performance of one of a full-strength erase and a full-strength program during a second processing pulse; and
the second processing pulse is generated subsequent to the first processing pulse.

11. The memory circuit of claim 5, wherein:
the second control module is configured to iteratively generate processing pulses;
the second control module comprises a handling module;
the handling module is configured to store indication data during a time period associated with a first processing pulse;
the indication data indicates performance of one of a partial-strength erase and a partial-strength program during a second processing pulse; and
the second processing pulse is generated subsequent to the first processing pulse.

12. The memory circuit of claim 5, wherein the second control module comprises:
a first handling module configured to store one of full-strength erase and full-strength program data, wherein the first handling module comprises:
a first tri-state inverter; and
a second tri-state inverter in communication with an input and an output of the first tri-state inverter; and
a second handling module configured to store one of partial-strength erase and partial-strength program data, wherein the second handling module comprises:
a third tri-state inverter; and
a fourth tri-state inverter in communication with an input and an output of the fourth tri-state inverter.

13. The memory circuit of claim 5, wherein the second control module comprises:
a first handling module including a first transistor, wherein the first transistor is configured to store one of full-strength erase data and full-strength program data; and
a second handling module including a second transistor, wherein the second transistor is configured to store one of partial-strength erase data and partial-strength program data.

14. The memory circuit of claim 1, wherein the first control module is configured to read the M bits of data from the multi-level cells during a second time period.

15. The memory circuit of claim 1, wherein:
the first control module is configured to verify the first erase operation including selectively performing one of a full-strength erase and a partial-strength erase;
the first control module is configured to perform the one of the full-strength erase and the partial strength erase based on whether a voltage corresponding to the state is equal to a first soft-erase-verify level; and
the first control module comprises
a verification module configured to verify the first erase operation, and
a sense amplifier configured to perform one of the full-strength erase and the partial-strength erase based on the verification.

16. The memory circuit of claim 1, wherein:
the first control module is configured to verify the first program operation including selectively performing one of a full-strength program and a partial-strength program;
the first control module is configured to perform the one of the full-strength program and the partial-strength program based on whether a voltage corresponding to the state matches a first soft-program-verify level; and
the first control module comprises
a verification module configured to verify the first program operation, and
a sense amplifier configured to perform one of the full-strength program and the partial-strength program based on the verification.

17. A solid-state drive (SSD) comprising the memory circuit of claim 1.

18. A data storage system comprising a storage area network (SAN) control module, wherein:
the SAN control module is configured to control a plurality of storage units; and
each of the plurality of storage units comprises a plurality of the SSD of claim 17.

19. The data storage system of claim 18, further comprising a switching unit configured to select one of the SSD of claim 19 based on a control signal from the SAN control module.

20. A method of operating a memory circuit, the method comprising:
providing a memory array including multi-level cells, wherein the multi-level cells are each configured to store M bits of data, where M is an integer greater than one;
reading a state of one of the multi-level cells;
performing one of a first erase operation and a first program operation on the one of the multi-level cells for the M bits of data during a first time period;
subsequent to performing the one of the first erase operation and the first program operation, performing (i) a first XNOR on a first one of the M bits of data and a first control signal input, and (ii) a second XNOR on a second one of the M bits of data and a second control signal input; and
determining whether to perform one of a second erase operation and a second program operation based on results of the first XNOR and the second XNOR.

21. The method of claim 20, further comprising:
generating amplifier data based on the state; and
performing the one of the first erase operation and the first program operation based on the amplifier data.

22. The method of claim 21, further comprising performing one of a full erase and a partial erase on the one of the multi-level cells during the first erase operation.

23. The method of claim 21, further comprising performing one of a full program and a partial program on the one of the multi-level cells during the first program operation.

24. The method of claim 20, further comprising:
generating amplifier data based on the state; and
transferring the M bits of data from at least one of an analog-to-digital converter or a sense amplifier module to at least one input and output module during a second time period and during a read operation.

25. The method of claim 20, further comprising:
performing a first read level operation to read a first one of the M bits of data; and
performing one of a second read level operation and a third read level operation to read a second one of the M bits of data.

26. The method of claim 25, further comprising comparing an output of the first read level operation with output of the second read level operation to correct a least significant bit of the M bits of data.

27. The method of claim 26, further comprising inverting the least significant bit based on the comparison.

28. The method of claim 20, further comprising:
storing user data into an input and output module;
determining whether the user data has a predetermined voltage distribution level; and
performing the first erase operation based on the determination.

29. The method of claim 20, further comprising verifying the first erase operation including selectively performing one of a full-strength erase and a partial-strength erase, wherein the one of a full-strength erase and a partial-strength erase are performed based on whether a voltage corresponding to the state is equal to a first soft-erase-verify level.

30. The method of claim 20, further comprising verifying that states of the multi-level cells match target levels corresponding to respective erase operations performed on the multi-level cells.

31. The method of claim 20, further comprising verifying the first program operation including selectively performing one of a full-strength program and a partial-strength program, wherein the one of the full-strength program and the partial-strength program is performed based on whether a voltage corresponding to the state matches a first soft-program-verify level.

32. The method of claim 31, further comprising:
verifying the first program operation; and
performing one of the full-strength program and the partial-strength program based on the verification.

33. The method of claim 20, further comprising verifying that states of the multi-level cells match target levels corresponding to respective program operations performed on the multi-level cells.

34. The method of claim 20, further comprising:
performing a first read operation to read a first one of the M bits of data;
performing a second read operation to read a second one of the M bits of data; and
performing a third read operation subsequent to the second read operation to read the first one of the M bits of data.

35. The method of claim 34, wherein:
the first read operation comprises (i) reading the state and (ii) transferring sensed amplifier data corresponding to a first one of the M bits of data to a first data storage module;
the second read operation comprises (i) reading the state and (ii) transferring sensed amplifier data corresponding to a second one of the M bits of data to a second data storage module; and
the third read operation comprises (i) reading the state and (ii) transferring sensed amplifier data corresponding to the first one of the M bits of data to an input and output data storage module.

36. The method of claim 20, further comprising:
generating a full-strength instruction prior to enabling the first XNOR output; and
resetting the full-strength instruction subsequent to enabling the second XNOR output,
wherein the full-strength instruction is one of an erase instruction and a program instruction.

37. The method of claim 20, further comprising:
determining whether one of a second erase operation and a second program operation is to be performed; and
verifying states of the multi-level cells for one of the first erase operation and the first program operation based on the determination.

38. The memory circuit of claim 1, wherein the comparing module performs the first XNOR while performing the second XNOR.

39. The memory circuit of claim 1, wherein:
the first control signal input indicates a target for the first one of the M bits of data; and
the second control signal input indicates a target for a second one of the M bits of data.

40. The memory circuit of claim 1, wherein the first control module is configured to determine whether to perform a partial-strength erase or a full-strength erase on the one of the multi-level cells for the M bits of data during the second erase operation based on the first XNOR and the second XNOR.

41. The memory circuit of claim 1, wherein the first control module is configured to determine whether to perform a partial-strength program or a full-strength program on the one of the multi-level cells for the M bits of data during the second program operation based on the first XNOR and the second XNOR.

42. The memory circuit of claim 1, further comprising a verification module configured to:
verify a state of the one of the multi-level cells for the M bits of data for the one of the erase operation and the program operation; and
prior to performing the one of a second erase operation and a second program operation, perform one of a partial strength erase operation and a partial strength program operation on the one of the multi-level cells for the M bits of data based on the verification of the state of the one of the multi-level cells.

43. The memory circuit of claim 42, wherein the first control module is configured to:
perform the one of the first erase operation and the first program operation for first data and during a first processing cycle;
perform the one of the second erase operation and the second program operation for second data and during a second processing cycle; and
perform the one of the partial strength erase operation and the partial strength program operation for the first data and prior to the second processing cycle.

* * * * *